(12) United States Patent
Kimura

(10) Patent No.: US 8,354,674 B2
(45) Date of Patent: Jan. 15, 2013

(54) SEMICONDUCTOR DEVICE WHEREIN A PROPERTY OF A FIRST SEMICONDUCTOR LAYER IS DIFFERENT FROM A PROPERTY OF A SECOND SEMICONDUCTOR LAYER

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 332 days.

(21) Appl. No.: 12/213,036

(22) Filed: Jun. 13, 2008

(65) Prior Publication Data
US 2009/0002590 A1    Jan. 1, 2009

(30) Foreign Application Priority Data

Jun. 29, 2007  (JP) .................................. 2007-173311

(51) Int. Cl.
*H01L 29/00* (2006.01)
(52) U.S. Cl. ................ 257/69; 257/51; 257/57; 257/59; 257/66; 257/67; 257/E29.151; 257/E29.273
(58) Field of Classification Search ........... 257/E29.151, 257/E29.273, 51, 57, 59, 66, 67, 69
See application file for complete search history.

(56) References Cited

U.S. PATENT DOCUMENTS

| | | | |
|---|---|---|---|
| 5,374,564 A | 12/1994 | Bruel | |
| 5,569,936 A | 10/1996 | Zhang et al. | |
| 5,585,647 A | 12/1996 | Nakajima et al. | |
| 5,637,187 A * | 6/1997 | Takasu et al. ................... 438/30 |
| 5,648,277 A | 7/1997 | Zhang et al. | |
| 5,731,856 A | 3/1998 | Kim et al. | |
| 5,744,824 A | 4/1998 | Kousai et al. | |
| 5,744,864 A | 4/1998 | Cillessen et al. | |
| 6,127,702 A | 10/2000 | Yamazaki et al. | |
| 6,169,292 B1 | 1/2001 | Yamazaki et al. | |
| 6,218,678 B1 | 4/2001 | Zhang et al. | |
| 6,271,101 B1 | 8/2001 | Fukunaga | |

(Continued)

FOREIGN PATENT DOCUMENTS

EP        1737044 A      12/2006

(Continued)

OTHER PUBLICATIONS

Fortunato.E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

(Continued)

*Primary Examiner* — Jay C Kim
(74) *Attorney, Agent, or Firm* — Eric J. Robinson; Robinson Intellectual Property Law Office, P.C.

(57) ABSTRACT

It is an object to provide a semiconductor device which has a large size and operates at high speed. A top gate transistor which includes a semiconductor layer of single-crystal and a bottom gate transistor which includes a semiconductor layer of amorphous silicon (microcrystalline silicon) are formed over the same substrate. Then, gate electrodes of each transistor are formed with the same layer, and source and drain electrodes are also formed with the same layer. Thus, manufacturing steps are reduced. In other words, two types of transistors can be manufactured by adding only a few steps to the manufacturing process of a bottom gate transistor.

29 Claims, 39 Drawing Sheets

U.S. PATENT DOCUMENTS

| | | |
|---|---|---|
| 6,294,274 B1 | 9/2001 | Kawazoe et al. |
| 6,335,231 B1 | 1/2002 | Yamazaki et al. |
| 6,380,046 B1 | 4/2002 | Yamazaki |
| 6,380,559 B1 | 4/2002 | Park et al. |
| 6,388,652 B1 | 5/2002 | Yamazaki et al. |
| 6,475,839 B2 | 11/2002 | Zhang et al. |
| 6,506,635 B1 | 1/2003 | Yamazaki et al. |
| 6,563,174 B2 | 5/2003 | Kawasaki et al. |
| 6,586,286 B2 | 7/2003 | Park et al. |
| 6,602,761 B2 | 8/2003 | Fukunaga |
| 6,617,612 B2 | 9/2003 | Zhang et al. |
| 6,686,623 B2 | 2/2004 | Yamazaki |
| 6,727,522 B1 | 4/2004 | Kawasaki et al. |
| 6,778,164 B2 | 8/2004 | Yamazaki et al. |
| 6,803,264 B2 | 10/2004 | Yamazaki et al. |
| 6,875,633 B2 | 4/2005 | Fukunaga |
| 6,908,797 B2 | 6/2005 | Takano |
| 6,964,890 B1 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,176,525 B2 | 2/2007 | Fukunaga |
| 7,199,024 B2 | 4/2007 | Yamazaki |
| 7,211,825 B2 | 5/2007 | Shih et al |
| 7,256,776 B2 | 8/2007 | Yamazaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| RE40,162 E | 3/2008 | Park et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,473,971 B2 | 1/2009 | Yamazaki et al. |
| 7,476,576 B2 | 1/2009 | Yamazaki et al. |
| 7,501,293 B2 | 3/2009 | Ito et al. |
| 7,508,034 B2 | 3/2009 | Takafuji et al. |
| 7,535,053 B2 | 5/2009 | Yamazaki |
| 7,674,650 B2 | 3/2010 | Akimoto et al. |
| 7,732,819 B2 | 6/2010 | Akimoto et al. |
| RE42,670 E | 9/2011 | Park et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0061176 A1 | 4/2004 | Takafuji et al. |
| 2004/0104424 A1 | 6/2004 | Yamazaki |
| 2004/0127038 A1 | 7/2004 | Carcia et al. |
| 2005/0009252 A1 | 1/2005 | Yamazaki et al. |
| 2005/0017302 A1 | 1/2005 | Hoffman |
| 2005/0199959 A1 | 9/2005 | Chiang et al. |
| 2005/0260800 A1 | 11/2005 | Takano |
| 2005/0275038 A1 | 12/2005 | Venkatesan et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0194384 A1 | 8/2006 | Venkatesan et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0087488 A1 | 4/2007 | Moriwaka |
| 2007/0090365 A1 | 4/2007 | Hayashi et al. |
| 2007/0108446 A1 | 5/2007 | Akimoto |
| 2007/0108510 A1 | 5/2007 | Fukunaga |
| 2007/0152217 A1 | 7/2007 | Lai et al. |
| 2007/0172591 A1 | 7/2007 | Seo et al. |
| 2007/0173000 A1 | 7/2007 | Yamazaki |
| 2007/0184632 A1 | 8/2007 | Yamazaki et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0291022 A1 | 12/2007 | Yamazaki et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0109002 A1 | 5/2010 | Itagaki et al. |
| 2010/0193785 A1 | 8/2010 | Kimura |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 50-299653 A | 11/1993 |
| JP | 07-092500 A | 4/1995 |
| JP | 07-135324 A | 5/1995 |
| JP | 08-006053 | 1/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001066639 A | 3/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-356658 | 12/2004 |
| JP | 2007-005462 A | 1/2007 |

| | | |
|---|---|---|
| JP | 2007-123702 A | 5/2007 |
| JP | 2008-503104 | 1/2008 |
| WO | WO-2004/114391 | 12/2004 |
| WO | WO-2006/001915 | 1/2006 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors," Nature, Nov. 25, 2004, vol. 432, pp. 488-492.

Park.J et al., "Improvements in the Device Characteristics of Amorphous Indium Gallium Zinc oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-6352.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08: SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08: SID International Symposium Digest of Technical Papers, May 20, 2008, vol. 39, pp. 625-628.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02: Proceedings of the 9th International Displays Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits, 2008, vol. 43, No. 1, pp. 292-299.

Coates.D et al., "Optical Studies of the Amorphous Liquid-Cholesteric Liquid Crystal Transistion: The "Blue Phase", ", Physics Letters, Sep. 10, 1973, vol. 45A, No. 2, pp. 115-116.

Park.S et al., "Challenge to Future Displays: Transparent AM-OLED Driven by PEALD Grown ZNO TFT," IMD '07 Digest, 2007, pp. 1249-1252.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT," SID Digest '07: SID International Symposium Digest of Technical Papers, 2007, vol. 38, pp. 1830-1833.

Miyasaka.M, "Suftla Flexible Microelectronics on Their Way to Business,", SID Digest '07: SID International Symposium Digst of Technical Papers, 2007, vol. 38, pp. 1673-1676.

Chern.H et al., "An Analytical Model for the Above-Threshold Characteristics of Polysilicon Thin-Film Transistors" IEEE Transactions on Electron Devices, Jul. 1, 1995, vol. 42, No. 7, pp. 1240-1246.

Lee.H et al., "Current Status of, Challenges to, and Perspective View of AM-OLED,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application," SID Digest '07:SID International Sysmposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; FE, GA, OR AL; B: MG, MN, FE, NI, CU, OR ZN] At Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett., (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display," SID Digest '08: SID International Symposium Digst of Technical Paperes, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors," JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGa03(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

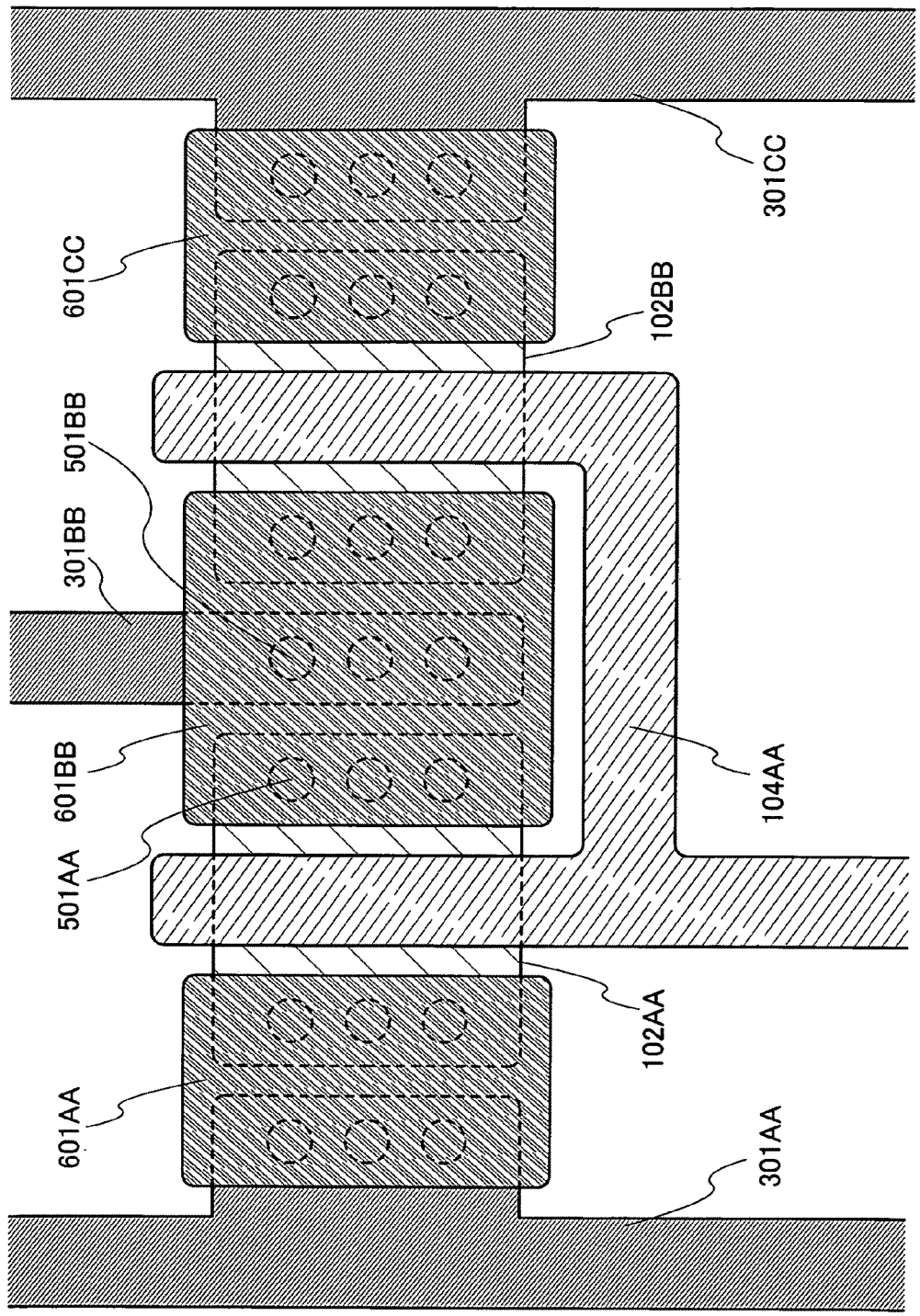

SEMICONDUCTOR DEVICE WHEREIN A PROPERTY OF A FIRST SEMICONDUCTOR LAYER IS DIFFERENT FROM A PROPERTY OF A SECOND SEMICONDUCTOR LAYER

BACKGROUND OF THE INVENTION

1. Field of the Invention

The present invention relates to an object, a method, or a method for producing an object. The present invention relates to a display device or a semiconductor device, in particular. The present invention relates to a display device or a semiconductor device which is formed by single-crystal being transferred to a glass substrate, in particular.

2. Description of the Related Art

In recent years, flat panel displays such as liquid crystal display devices and electroluminescence (EL) display devices have attracted attention.

Driving methods of the flat panel displays include a passive matrix method and an active matrix method. An active matrix method has advantages over a passive matrix method such as the facts that power consumption is lowered, definition is heightened, a larger substrate can be used, and the like.

In a structure where a driver circuit is provided outside the panel, it is possible to use an IC using single-crystal silicon as a driver circuit; therefore, a problem due to a speed of a driver circuit does not arise. However, when an IC is provided in this manner, the manufacturing cost cannot be reduced sufficiently because of necessity of preparing a panel and an IC separately, necessity of a step of connecting the panel and the IC, and the like.

Thus, in view of reducing the cost or the like, a method in which a pixel portion and a driver circuit are formed over the same substrate has been employed (for example, see Reference 1: Japanese Published Patent Application No. H8-6053).

SUMMARY OF THE INVENTION

In the case shown in Reference 1, non-single-crystal silicon such as amorphous silicon, microcrystalline silicon, or polycrystalline silicon is used as a semiconductor layer of a driver circuit, similarly to the pixel portion. However, even in a case where microcrystalline silicon or polycrystalline silicon as well as amorphous silicon is used, there is a problem in that characteristics thereof are incomparable to characteristics of single-crystal silicon. In particular, in a semiconductor layer which is used for a conventional panel where a driver circuit is integrated, mobility which is necessary and sufficient is not obtained. This has caused a big problem in manufacturing a semiconductor device of which high speed operation is required, that is, a driver circuit.

With the foregoing problems in consideration, an object of the present invention is to provide a semiconductor device manufactured with low cost. Alternatively, another object of the present invention is to provide a semiconductor device provided with a circuit which can operate at high speed. Alternatively, another object of the present invention is to provide a semiconductor device which consumes low power.

In the present invention, a silicon layer is separated from a single-crystal substrate, and bonded (transferred) to a glass substrate. Alternatively, a single-crystal substrate is bounded to a glass substrate, and the single-crystal substrate is separated to form a silicon layer over the glass substrate. Then, the silicon layer is processed into an island shape. After that, a silicon layer is separated from the single-crystal substrate again and bonded to the glass substrate. Alternatively, the single-crystal substrate is bonded to the glass substrate, and the single-crystal substrate is separated to form the silicon layer over the glass substrate. Then, the silicon layer is processed into an island-shape again.

Then, TFTs are formed over the glass substrate using these silicon layers.

At this time, a TFT using amorphous silicon or microcrystalline silicon is also formed at the same time.

Then, in these TFTs, a conductive layer serving as a gate electrode or a conductive layer serving as a source electrode or a drain electrode are shared, and these conductive layers are formed at the same time. Thus, the number of manufacturing steps can be reduced.

The present invention includes a first semiconductor layer over an insulating substrate, a first insulating layer over the first semiconductor layer, a first conductive layer and a second conductive layer over the first insulating layer, a second insulating layer over the first conductive layer and the second conductive layer, a second semiconductor layer over the second insulating layer, a third conductive layer over the second semiconductor layer, a fourth conductive layer over the second insulating layer, a third insulating layer over the third conductive layer and the fourth conductive layer, and a fifth conductive layer over the third insulating layer. The first semiconductor layer serves as an active layer of a first transistor. The second semiconductor layer serves as an active layer of a second transistor. A property of the first semiconductor layer is different from a property of the second semiconductor layer.

A feature of the present invention, in the structure, is that the first insulating layer serves as a gate insulating layer of the first transistor, and the first conductive layer serves as a gate electrode of the first transistor.

A feature of the present invention, in the structure, is that the second insulating layer serves as a gate insulating layer of the second transistor, and the second conductive layer serves as a gate electrode of the second transistor.

A feature of the present invention, in the structure, is that the fifth conductive layer is electrically connected to the fourth conductive layer through a contact hole provided in the third insulating layer.

A feature of the present invention, in the structure, is that the fifth conductive layer is electrically connected to the first semiconductor layer through a contact hole provided in the first insulating layer, the insulating layer and the third insulating layer.

A feature of the present invention, in the structure, is that the third conductive layer is electrically connected to the second semiconductor layer.

A feature of the present invention, in the structure, is that the first semiconductor layer has crystallinity.

A feature of the present invention, in the structure, is that the second semiconductor layer includes an amorphous semiconductor.

A feature of the present invention, in the structure, is that the second semiconductor layer includes a microcrystalline semiconductor.

Note that various types of switches can be used as a switch. An electrical switch, a mechanical switch, and the like are given as examples. That is, any element can be used as long as it can control a current flow, without limiting to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used as a switch. Alternatively, a logic circuit combining such elements can be used as a switch.

An example of a mechanical switch is a switch formed using MEMS (micro electro mechanical system) technology, such as a digital micromirror device (DMD). Such a switch includes an electrode which can be moved mechanically, and operates by controlling connection and non-connection based on movement of the electrode.

In the case of using a transistor as a switch, polarity (a conductivity type) of the transistor is not particularly limited because it operates just as a switch. However, a transistor of polarity with smaller off-current is preferably used when off-current is to be suppressed. Examples of a transistor with smaller off-current are a transistor provided with an LDD region, a transistor with a multi-gate structure, and the like. In addition, it is preferable that an N-channel transistor be used when a potential of a source terminal is closer to a potential of a low-potential-side power supply (e.g., Vss, GND, or 0 V), while a P-channel transistor be used when the potential of the source terminal is closer to a potential of a high-potential-side power supply (e.g., Vdd). This is because the absolute value of gate-source voltage can be increased when the potential of the source terminal is closer to a potential of a low-potential-side power supply in an N-channel transistor and when the potential of the source terminal is closer to a potential of a high-potential-side power supply in a P-channel transistor, so that the transistor can be operated more accurately as a switch. This is also because the transistor does not often perform a source follower operation, so that reduction in output voltage does not often occur.

Note that a CMOS switch may be used as a switch by using both N-channel and P-channel transistors. When a CMOS switch is used, the switch can more precisely operate as a switch because current can flow when either the P-channel transistor or the N-channel transistor is turned on. For example, voltage can be appropriately output regardless of whether voltage of an input signal to the switch is high or low. In addition, since a voltage amplitude value of a signal for turning on or off the switch can be made smaller, power consumption can be reduced.

Note that when a transistor is used as a switch, the switch includes an input terminal (one of a source terminal and a drain terminal), an output terminal (the other of the source terminal and the drain terminal), and a terminal for controlling conduction (a gate terminal). On the other hand, when a diode is used as a switch, the switch does not have a terminal for controlling conduction in some cases. Therefore, when a diode is used as a switch, the number of wirings for controlling terminals can be further reduced compared to the case of using a transistor as a switch.

Note that when it is explicitly described that "A and B are connected", the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer). Accordingly, another element may be interposed between elements having a connection relation shown in drawings and texts, without limiting to a predetermined connection relation, for example, the connection relation shown in the drawings and the texts.

For example, in the case where A and B are electrically connected, one or more elements which enable electric connection between A and B (e.g., a switch, a transistor, a capacitor, an inductor, a resistor, and/or a diode) may be provided between A and B. In addition, in the case where A and B are functionally connected, one or more circuits which enable functional connection between A and B (e.g., a logic circuit such as an inverter, a NAND circuit, or a NOR circuit, a signal converter circuit such as a DA converter circuit, an AD converter circuit, or a gamma correction circuit, a potential level converter circuit such as a power supply circuit (e.g., a dc-dc converter, a step-up dc-dc converter, or a step-down dc-dc converter) or a level shifter circuit for changing a potential level of a signal, a voltage source, a current source, a switching circuit, or an amplifier circuit such as a circuit which can increase signal amplitude, the amount of current, or the like (e.g., an operational amplifier, a differential amplifier circuit, a source follower circuit, or a buffer circuit), a signal generating circuit, a memory circuit, and/or a control circuit) may be provided between A and B. Alternatively, in the case where A and B are directly connected, A and B may be directly connected without interposing another element or another circuit therebetween.

Note that when it is explicitly described that "A and B are directly connected", the case where A and B are directly connected (i.e., the case where A and B are connected without interposing another element or another circuit therebetween) and the case where A and B are electrically connected (i.e., the case where A and B are connected by interposing another element or another circuit therebetween) are included therein.

Note that when it is explicitly described that "A and B are electrically connected", the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included therein. That is, when it is explicitly described that "A and B are electrically connected", the description is the same as the case where it is explicitly only described that "A and B are connected".

Note that a display element, a display device which is a device having a display element, a light-emitting element, and a light-emitting device which is a device having a light-emitting element of the present invention can use various types and can include various elements. For example, a display medium, whose contrast, luminance, reflectivity, transmittivity, or the like changes by an electromagnetic action, such as an EL (electro-luminescence) element (e.g., an EL element including organic and inorganic materials, an organic EL element, or an inorganic EL element), an electron emitter, a liquid crystal element, electronic ink, an electrophoresis element, a grating light valve (GLV), a plasma display panel (PDP), a digital micromirror device (DMD), a piezoelectric ceramic display, or a carbon nanotube can be used as a display element, a display device, a light-emitting element, or a light-emitting device. Note that display devices using an EL element include an EL display; display devices using an electron emitter include a field emission display (FED), an SED-type flat panel display (SED: surface-conduction electron-emitter display), and the like; display devices using a liquid crystal element include a liquid crystal display (e.g., a transmissive liquid crystal display, a transflective liquid crystal display, a reflective liquid crystal display, a direct-view liquid crystal display, or a projection liquid crystal display); and display devices using electronic ink or an electrophoresis element include electronic paper.

Note that an EL element is an element having an anode, a cathode, and an EL layer interposed between the anode and the cathode. Note that as an EL layer, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed of an organic material, a layer formed of an inorganic material, a layer formed of an organic material and an inorganic material, a layer including a high-molecular material, a layer including a low molecular material, a layer including a low-molecular material and a high-molecular material, or the like can be used. Note that the present invention is not limited to this, and various EL elements can be used as an EL element.

Note that an electron emitter is an element in which electrons are extracted by high electric field concentration on a pointed cathode. For example, as an electron emitter, a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a surface conduction emitter SCD type, a thin film type in which a metal, an insulator, a semiconductor, and a metal are stacked, a HEED type, an EL type, a porous silicon type, a surface-conduction (SED) type, or the like can be used. However, the present invention is not limited to this, and various elements can be used as an electron emitter.

Note that a liquid crystal element is an element which controls transmission or non-transmission of light by optical modulation action of a liquid crystal and includes a pair of electrodes and a liquid crystal. Note that optical modulation action of a liquid crystal is controlled by an electric filed applied to the liquid crystal (including a horizontal electric field, a vertical electric field, and an oblique electric field). Note that the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and the like. Note that the present invention is not limited to this, and various liquid crystal elements and driving methods can be used as a liquid crystal element and a driving method thereof.

Note that electronic paper corresponds to a device which displays an image by molecules which utilize optical anisotropy, dye molecular orientation, or the like; a device which displays an image by particles which utilize electrophoresis, particle movement, particle rotation, phase change, or the like; a device which displays an image by moving one end of a film; a device which displays an image by using coloring properties or phase change of molecules; a device which displays an image by using optical absorption by molecules; and a device which displays an image by using self-light emission by bonding electrons and holes. For example, the following can be used for electronic paper: microcapsule electrophoresis, horizontal electrophoresis, vertical electrophoresis, a spherical twisting ball, a magnetic twisting ball, a columnar twisting ball, a charged toner, electro liquid powder, magnetic electrophoresis, a magnetic thermosensitive type, an electrowetting type, a light-scattering (transparent-opaque change) type, a cholesteric liquid crystal and a photoconductive layer, a cholesteric liquid crystal device, a bistable nematic liquid crystal, a ferroelectric liquid crystal, a liquid crystal dispersed type with a dichroic dye, a movable film, coloring and decoloring properties of a leuco dye, a photochromic material, an electrochromic material, an electrodeposition material, flexible organic EL, and the like. Note that the present invention is not limited to this, and a variety of electronic paper can be used as electronic paper. Here, when microcapsule electrophoresis is used, defects of electrophoresis, which are aggregation and precipitation of phoresis particles, can be solved. Electro liquid powder has advantages such as high-speed response, high reflectivity, wide viewing angle, low power consumption, and memory properties.

Note that a plasma display has a structure in which a substrate having a surface provided with an electrode and a substrate having a surface provided with an electrode and a minute groove in which a phosphor layer is formed face each other at a narrow interval and a rare gas is sealed therein. Note that display can be performed by applying voltage between the electrodes to generate an ultraviolet ray so that a phosphor emits light. Note that the plasma display may be a DC-type PDP or an AC-type PDP. For the plasma display, AWS (address while sustain) driving, ADS (address display separated) driving in which a subframe is divided into a reset period, an address period, and a sustain period, CLEAR (high-contrast low energy address and reduction of false contour sequence) driving, ALIS (alternate lighting of surfaces) method, TERES (technology of reciprocal sustainer) driving, or the like can be used. Note that the present invention is not limited to this, and various plasma displays can be used as a plasma display panel.

Note that electroluminescence, a cold cathode fluorescent lamp, a hot cathode fluorescent lamp, an LED, a laser light source, a mercury lamp, or the like can be used as a light source of a display device in which a light source is necessary, such as a liquid crystal display (a transmissive liquid crystal display, a transflective liquid crystal display, a reflective liquid crystal display, a direct-view liquid crystal display, or a projection liquid crystal display), a display device using a grating light valve (GLV), or a display device using a digital micromirror device (DMD). Note that the present invention is not limited to this, and various light sources can be used as a light source.

Note that various types of transistors can be used as a transistor, without limiting to a certain type. For example, a thin film transistor (TFT) including a non-single-crystal semiconductor film typified by amorphous silicon, polycrystalline silicon, microcrystalline (also referred to as semi-amorphous) silicon, or the like can be used. In the case of using the TFT, there are various advantages. For example, since the TFT can be formed at temperature lower than that of the case of using single-crystal silicon, manufacturing cost can be reduced or a manufacturing apparatus can be made larger. Since the manufacturing apparatus is made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Accordingly, transmission of light in a display element can be controlled by using the transistor formed using the light-transmitting substrate. Alternatively, part of a film which forms the transistor can transmit light because the film thickness of the transistor is thin. Therefore, the aperture ratio can be improved.

Note that when a catalyst (e.g., nickel) is used in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction circuit, or a DA converter circuit) can be formed over the same substrate as a pixel portion.

Note that when a catalyst (e.g., nickel) is used in the case of forming microcrystalline silicon, crystallinity can be further improved and a transistor having excellent electric characteristics can be formed. At this time, crystallinity can be improved by just performing heat treatment without performing laser light irradiation. Accordingly, a gate driver circuit (e.g., a scan line driver circuit) and part of a source driver circuit (e.g., an analog switch) can be formed over the same substrate. In addition, in the case of not performing laser light irradiation for crystallization, crystallinity unevenness of silicon can be suppressed. Therefore, a clear image can be displayed.

Note that polycrystalline silicon and microcrystalline silicon can be formed without using a catalyst (e.g., nickel).

Note that it is preferable that crystallinity of silicon be improved to polycrystalline, microcrystalline, or the like in the whole panel; however, the present invention is not limited to this. Crystallinity of silicon may be improved only in part of the panel. Selective increase in crystallinity can be achieved by selective laser irradiation or the like. For example, only a peripheral driver circuit region excluding pixels may be irradiated with laser light. Alternatively, only a region of a gate driver circuit, a source driver circuit, or the like may be irradiated with laser light. Further alternatively, only part of a source driver circuit (e.g., an analog switch) may be irradiated with laser light. Accordingly, crystallinity of silicon can be improved only in a region in which a circuit needs to be operated at high speed. Since a pixel region is not particularly needed to be operated at high speed, even if crystallinity is not improved, the pixel circuit can be operated without problems. Since a region, crystallinity of which is improved, is small, manufacturing steps can be decreased, throughput can be increased, and manufacturing cost can be reduced. Since the number of necessary manufacturing apparatus is small, manufacturing cost can be reduced.

A transistor can be formed by using a semiconductor substrate, an SOI substrate, or the like. Thus, a transistor with few variations in characteristics, sizes, shapes, or the like, with high current supply capacity, and with a small size can be formed. When such a transistor is used, power consumption of a circuit can be reduced or a circuit can be highly integrated.

A transistor including a compound semiconductor or an oxide semiconductor such as ZnO, a-InGaZnO, SiGe, GaAs, IZO, ITO, or SnO, a thin film transistor obtained by thinning such a compound semiconductor or an oxide semiconductor, or the like can be used. Thus, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a light-transmitting electrode. Further, since such an element can be formed at the same time as the transistor, cost can be reduced.

A transistor formed by using an inkjet method or a printing method, or the like can be used. Accordingly, a transistor can be formed at room temperature, can be formed at a low vacuum, or can be formed using a large substrate. In addition, since the transistor can be formed without using a mask (a reticle), a layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

A transistor including an organic semiconductor or a carbon nanotube, or the like can be used. Accordingly, such a transistor can be formed using a substrate which can be bent. Therefore, a device using a transistor including an organic semiconductor or a carbon nanotube, or the like can resist a shock.

Further, transistors with various structures can be used. For example, a MOS transistor, a junction transistor, a bipolar transistor, or the like can be used as a transistor. When a MOS transistor is used, the size of the transistor can be reduced. Thus, a large number of transistors can be mounted. When a bipolar transistor is used, large current can flow. Thus, a circuit can be operated at high speed.

Note that a MOS transistor, a bipolar transistor, and the like may be formed over one substrate. Thus, reduction in power consumption, reduction in size, high speed operation, and the like can be realized.

Furthermore, various transistors can be used.

Note that a transistor can be formed using various types of substrates without limiting to a certain type. For example, a single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate over which a transistor is formed. Alternatively, a skin (e.g., epidermis or corium) or hypodermal tissue of an animal such as a human being can be used as a substrate. Further alternatively, the transistor may be formed using one substrate, and then, the transistor may be transferred to another substrate, and the transistor may be provided over another substrate. A single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transferred. Alternatively, a skin (e.g., epidermis or corium) or hypodermal tissue of an animal such as a human being can be used as a substrate. Further alternatively, the transistor may be formed using one substrate and the substrate may be thinned by polishing. A single-crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human being can be used as a substrate to be polished. When such a substrate is used, a transistor with excellent properties or a transistor with low power consumption can be formed, a device with high durability, high heat resistance can be provided, or reduction in weight or thickness can be achieved.

Note that a structure of a transistor can be various modes without limiting to a certain structure. For example, a multi-gate structure having two or more gate electrodes may be used. When the multi-gate structure is used, a structure where a plurality of transistors are connected in series is provided because channel regions are connected in series. With the multi-gate structure, off-current can be reduced or the withstand voltage of the transistor can be increased to improve reliability. Alternatively, with the multi-gate structure, drain-source current does not fluctuate very much even if drain-source voltage fluctuates when the transistor operates in a saturation region, so that a flat slope of voltage-current characteristics can be obtained. When the flat slope of the voltage-current characteristics is utilized, an ideal current source circuit or an active load having an extremely high resistance value can be realized. Accordingly, a differential circuit or a current mirror circuit having excellent properties can be realized.

In addition, a structure where gate electrodes are formed above and below a channel may be used. When the structure where gate electrodes are formed above and below the channel is used, a channel region is increased, so that the amount of current flowing therethrough can be increased or a depletion layer can be easily formed to decrease subthreshold swing. When the gate electrodes are formed above and below the channel, a structure where a plurality of transistors are connected in parallel is provided.

Alternatively, a structure where a gate electrode is formed above a channel region, a structure where a gate electrode is formed below a channel region, a staggered structure, an inversely staggered structure, a structure where a channel region is divided into a plurality of regions, or a structure where channel regions are connected in parallel or in series can be used. Further alternatively, a source electrode or a drain electrode may overlap with a channel region (or part of it). When the structure where the source electrode or the drain electrode may overlap with the channel region (or part of it) is used, the case can be prevented in which electric charges are accumulated in part of the channel region, which would result in an unstable operation. Further alternatively, an LDD region may be provided. When the LDD region is provided, off-current can be reduced or the withstand voltage of the transistor can be increased to improve reliability. Further, when the LDD region is provided, drain-source current does not fluctuate very much even if drain-source voltage fluctuates when the transistor operates in the saturation region, so that a flat slope of voltage-current characteristics can be obtained.

Note that various types of transistors can be used as a transistor and the transistor can be formed using various types of substrates. Accordingly, all the circuits that are necessary to realize a predetermined function can be formed using the same substrate. For example, all the circuits that are necessary to realize the predetermined function can be formed using a glass substrate, a plastic substrate, a single-crystal substrate, an SOI substrate, or any other substrate. When all the circuits that are necessary to realize the predetermined function are formed using the same substrate, cost can be reduced by reduction in the number of component parts or reliability can be improved by reduction in the number of connections to circuit components. Alternatively, part of the circuits which are necessary to realize the predetermined function can be formed using one substrate and another part of the circuits which are necessary to realize the predetermined function can be formed using another substrate. That is, not all the circuits that are necessary to realize the predetermined function are required to be formed using the same substrate. For example, part of the circuits which are necessary to realize the predetermined function may be formed by transistors using a glass substrate and another part of the circuits which are necessary to realize the predetermined function may be formed using a single-crystal substrate, so that an IC chip formed by a transistor over the single-crystal substrate can be connected to the glass substrate by COG (chip on glass) and the IC chip may be provided over the glass substrate. Alternatively, the IC chip can be connected to the glass substrate by TAB (tape automated bonding) or a printed wiring board. When part of the circuits are formed using the same substrate in this manner, cost can be reduced by reduction in the number of component parts or reliability can be improved by reduction in the number of connections to circuit components. Further alternatively, when circuits with high driving voltage and high driving frequency, which consume large power, are formed over a single-crystal semiconductor substrate instead of forming such circuits using the same substrate and an IC chip formed by the circuit is used, increase in power consumption can be prevented.

Note that one pixel corresponds to one element whose brightness can be controlled. Therefore, for example, one pixel corresponds to one color element and brightness is expressed with the one color element. Accordingly, in the case of a color display device having color elements of R (red), G (green), and B (blue), a minimum unit of an image is formed of three pixels of an R pixel, a G pixel, and a B pixel. Note that the color elements are not limited to three colors, and color elements of more than three colors may be used or a color other than RGB may be used. For example, RGBW (W corresponds to white) can be used by adding white. Alternatively, one or more colors of yellow, cyan, magenta emerald green, vermilion, and the like can be added to RGB. Further alternatively, a color similar to at least one of R, G, and B can be added to RGB. For example, R, G, B1, and B2 may be used. Although both B1 and B2 are blue, they have slightly different frequency. Similarly, R1, R2, G, and B can be used. When such color elements are used, display which is closer to the real object can be performed and power consumption can be reduced. As another example, in the case of controlling brightness of one color element by using a plurality of regions, one region can correspond to one pixel. Therefore, for example, in the case of performing area ratio gray scale display or the case of including a subpixel, a plurality of regions which control brightness are provided in each color element and gray scales are expressed with the whole regions. In this case, one region which controls brightness may correspond to one pixel. Thus, in that case, one color element includes a plurality of pixels. Alternatively, even when the plurality of regions which control brightness are provided in one color element, these regions may be collected as one pixel. Thus, in that case, one color element includes one pixel. In that case, one color element includes one pixel. Further alternatively, in the case where brightness is controlled in a plurality of regions in each color element, regions which contribute to display have different area dimensions depending on pixels in some cases. Further alternatively, in the plurality of regions which control brightness in each color element, signals supplied to each of the plurality of regions may be slightly varied to widen a viewing angle. That is, potentials of pixel electrodes included in the plurality of regions provided in each color element can be different from each other. Accordingly, voltage applied to liquid crystal molecules are varied depending on the pixel electrodes. Therefore, the viewing angle can be widened.

Note that explicit description "one pixel (for three colors)" corresponds to the case where three pixels of R, G, and B are considered as one pixel. Meanwhile, explicit description "one pixel (for one color)" corresponds to the case where the plurality of regions are provided in each color element and collectively considered as one pixel.

Note that pixels are provided (arranged) in matrix in some cases. Here, description that pixels are provided (arranged) in matrix includes the case where the pixels are arranged in a straight line or the case where the pixels are arranged in a jagged line, in a longitudinal direction or a lateral direction. Thus, for example, in the case of performing full color display with three color elements (e.g., RGB), the following cases are included therein: the case where the pixels are arranged in stripes or the case where dots of the three color elements are arranged in a delta pattern. Alternatively, the case is also included therein in which dots of the three color elements are provided in Bayer arrangement. Note that the color elements are not limited to three colors, and color elements of more than three colors may be used. For example, RGBW (W corresponds to white), RGB plus one or more of yellow, cyan, magenta, or the like may be used. Note that the sizes of display regions may be different between respective dots of color elements. Thus, power consumption can be reduced or the life of a display element can be prolonged.

Note that an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since such an element has few numbers of manufacturing steps, manufacturing cost can be reduced or yield can be improved. Further, since the size of the element is small, the aperture ratio can be improved, so that power consumption can be reduced or high luminance can be achieved.

Note that as a method other than an active matrix method, a passive matrix method in which an active element (a non-linear element) is not used can also be used. Since an active element (a non-linear element) is not used, manufacturing steps is few, so that manufacturing cost can be reduced or the yield can be improved. Since an active element (a non-linear element) is not used, the aperture ratio can be improved, so that power consumption can be reduced or high luminance can be achieved.

Note that a transistor is an element having at least three terminals of a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Therefore, in this document (the specification, the claim, the drawing, and the like), a region functioning as a source and a drain may not be called the source or the drain. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Further alternatively, one of the source and the drain may be referred to as a source region and the other thereof may be called a drain region.

Note that a transistor may be an element having at least three terminals of a base, an emitter, and a collector. In this case, one of the emitter and the collector may be similarly referred to as a first terminal and the other terminal may be referred to as a second terminal.

Note that a gate corresponds to all or part of a gate electrode and a gate wiring (also referred to as a gate line, a gate signal line, a scan line, a scan signal line, or the like). A gate electrode corresponds to a conductive film which overlaps with a semiconductor which forms a channel region with a gate insulating film interposed therebetween. Note that part of the gate electrode overlaps with an LDD (lightly doped drain) region or the source region (or the drain region) with the gate insulating film interposed therebetween in some cases. A gate wiring corresponds to a wiring for connecting a gate electrode of each transistor to each other, a wiring for connecting a gate electrode of each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be referred to as either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be referred to as either a gate electrode or a gate wiring.

Note that a portion (a region, a conductive film, a wiring, or the like) which is formed using the same material as a gate electrode, forms the same island as the gate electrode, and is connected to the gate electrode may also be referred to as a gate electrode. Similarly, a portion (a region, a conductive film, a wiring, or the like) which is formed using the same material as a gate wiring, forms the same island as the gate wiring, and is connected to the gate wiring may also be referred to as a gate wiring. In a strict detect, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed using the same material as a gate electrode or a gate wiring, forms the same island as the gate electrode or the gate wiring, and is connected to the gate electrode or the gate wiring because of specifications or the like in manufacturing. Thus, such a portion (a region, a conductive film, a wiring, or the like) may also be referred to as either a gate electrode or a gate wiring.

Note that in a multi-gate transistor, for example, a gate electrode is often connected to another gate electrode by using a conductive film which is formed using the same material as the gate electrode. Since such a portion (a region, a conductive film, a wiring, or the like) is a portion (a region, a conductive film, a wiring, or the like) for connecting the gate electrode to another gate electrode, it may be referred to as a gate wiring, and it may also be referred to as a gate electrode because a multi-gate transistor can be considered as one transistor. That is, a portion (a region, a conductive film, a wiring, or the like) which is formed using the same material as a gate electrode or a gate wiring, forms the same island as the gate electrode or the gate wiring, and is connected to the gate electrode or the gate wiring may be referred to as either a gate electrode or a gate wiring. In addition, for example, part of a conductive film which connects the gate electrode and the gate wiring and is formed using a material which is different from that of the gate electrode or the gate wiring may also be referred to as either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

Note that when a wiring is referred to as a gate wiring, a gate line, a gate signal line, a scan line, a scan signal line, there is the case in which a gate of a transistor is not connected to a wiring. In this case, the gate wiring, the gate line, the gate signal line, the scan line, or the scan signal line corresponds to a wiring formed in the same layer as the gate of the transistor, a wiring formed using the same material of the gate of the transistor, or a wiring formed at the same time as the gate of the transistor in some cases. As examples, there are a wiring for a storage capacitor, a power supply line, a reference potential supply line, and the like.

Note that a source corresponds to all or part of a source region, a source electrode, and a source wiring (also referred to as a source line, a source signal line, a data line, a data signal line, or the like). A source region corresponds to a semiconductor region including a large amount of p-type impurities (e.g., boron or gallium) or n-type impurities (e.g., phosphorus or arsenic). Therefore, a region including a small amount of p-type impurities or n-type impurities, namely, an LDD (lightly doped drain) region is not included in the source region. A source electrode is part of a conductive layer which is formed using a material different from that of a source region and is electrically connected to the source region. However, there is the case where a source electrode and a source region are collectively referred to as a source electrode. A source wiring is a wiring for connecting a source electrode of each transistor to each other, a wiring for connecting a source electrode of each pixel to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be referred to as either a source electrode or a source wiring. That is, there is a region where a source electrode and a source wiring cannot be clearly distinguished from each other. For example, in the case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be referred to as either a source electrode or a source wiring.

Note that a portion (a region, a conductive film, a wiring, or the like) which is formed using the same material as a source electrode, forms the same island as the source electrode, and is connected to the source electrode, or a portion (a region, a conductive film, a wiring, or the like) which connects a source electrode and another source electrode may also be referred to as a source electrode. Further, a portion which overlaps with a source region may be referred to as a source electrode. Similarly, a portion (a region, a conductive film, a wiring, or the like) which is formed using the same material as a source wiring, forms the same island as the source wiring, and is connected to the source wiring may also be referred to as a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed using the same material as a source electrode or a source wiring, forms the same island as the source electrode or the source wiring, and is connected to the source electrode or the source wiring because of specifications or the like in manufacturing. Thus, such a portion (a region, a conductive film, a wiring, or the like) may also be referred to as either a source electrode or a source wiring.

For example, part of a conductive film which connects a source electrode and a source wiring and is formed using a material which is different from that of the source electrode or the source wiring may be referred to as either a source electrode or a source wiring.

Note that a source terminal corresponds to part of a source region, a source electrode, or a portion (a region, a conductive film, a wiring, or the like) which is electrically connected to the source electrode.

Note that when a wiring is referred to as a source wiring, a source line, a source signal line, a data line, a data signal line, there is the case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed using the same material of the source (the drain) of the transistor, or a wiring formed at the same time as the source (the drain) of the transistor in some cases. As examples, there are a wiring for a storage capacitor, a power supply line, a reference potential supply line, and the like.

Note that the same can be said for a drain.

Note that a semiconductor device corresponds to a device having a circuit including a semiconductor element (e.g., a transistor, a diode, or a thyristor). The semiconductor device may also include all devices that can function by utilizing semiconductor characteristics. In addition, the semiconductor device corresponds to a device having a semiconductor material.

Note that a display element corresponds to an optical modulation element, a liquid crystal element, a light-emitting element, an EL element (an organic EL element, an inorganic EL element, or an EL element including organic and inorganic materials), an electron emitter, an electrophoresis element, a discharging element, a light-reflective element, a light diffraction element, a digital micromirror device (DMD), or the like. Note that the present invention is not limited to this.

Note that a display device corresponds to a device having a display element. The display device may include a plurality of pixels each having a display element. Note that that the display device may also include a peripheral driver circuit for driving the plurality of pixels. The peripheral driver circuit for driving the plurality of pixels may be formed over the same substrate as the plurality of pixels. The display device may also include a peripheral driver circuit provided over a substrate by wire bonding or bump bonding, namely, an IC chip connected by chip on glass (COG) or an IC chip connected by TAB or the like. Further, the display device may also include a flexible printed circuit (FPC) to which an IC chip, a resistor, a capacitor, an inductor, a transistor, or the like is attached. Note also that the display device includes a printed wiring board (PWB) which is connected through a flexible printed circuit (FPC) and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling device or an air cooling device), or the like.

Note that a lighting device corresponds to a device having a backlight unit, a light guide plate, a prism sheet, a diffusion sheet, a reflective sheet, or a light source (e.g., an LED, a cold cathode fluorescent lamp, or a hot cathode fluorescent lamp), a cooling device, or the like.

Note that a light-emitting device corresponds to a device having a light-emitting element and the like. In the case of including a light-emitting element as a display element, the light-emitting device is one of specific examples of a display device.

Note that a reflective device corresponds to a device having a light-reflective element, a light diffraction element, light-reflective electrode, or the like.

Note that a liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

Note that a driving device corresponds to a device having a semiconductor element, an electric circuit, or an electronic circuit. For example, a transistor which controls input of a signal from a source signal line to a pixel (also referred to as a selection transistor, a switching transistor, or the like), a transistor which supplies voltage or current to a pixel electrode, a transistor which supplies voltage or current to a light-emitting element, and the like are examples of the driving device. A circuit which supplies a signal to a gate signal line (also referred to as a gate driver, a gate line driver circuit, or the like), a circuit which supplies a signal to a source signal line (also referred to as a source driver, a source line driver circuit, or the like) are also examples of the driving device.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

Note that when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B corresponds to an object (e.g., a device, an element, a circuit, a wiring, an electrode, a terminal, a conductive film, or a layer).

Accordingly, for example, when it is explicitly described that "a layer B is formed on (or over) a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Similarly, when it is explicitly described that "B is formed above A", it does not necessarily mean that B is formed in direct contact with A, and another object may be interposed therebetween. Thus, for example, when it is described that "a layer B is formed above a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Note that when it is explicitly described that "B is formed in direct contact with A", it includes not the case where another object is interposed between A and B but the case where B is formed in direct contact with A.

Note that the same can be said when it is described that B is formed below or under A.

Note that when an object is explicitly described in a singular form, the object is preferably singular. Note that the present invention is not limited to this, and the object can be plural. Similarly, when an object is explicitly described in a plural form, the object is preferably plural. Note that the present invention is not limited to this, and the object can be singular.

A semiconductor device can be manufactured with low cost. Alternatively, a multifunctional semiconductor device can be provided. Alternatively, a semiconductor device provided with a circuit which can operate at high speed can be provided. Alternatively, a semiconductor device which consumes low power can be provided. Alternatively, a semiconductor device of which manufacturing steps are reduced can be provided.

BRIEF DESCRIPTION OF THE DRAWINGS

In the accompanying drawings:

FIG. 11 illustrates a top view of a semiconductor device of the present invention;

DETAILED DESCRIPTION OF THE INVENTION

Embodiment Modes

Figure 1A:
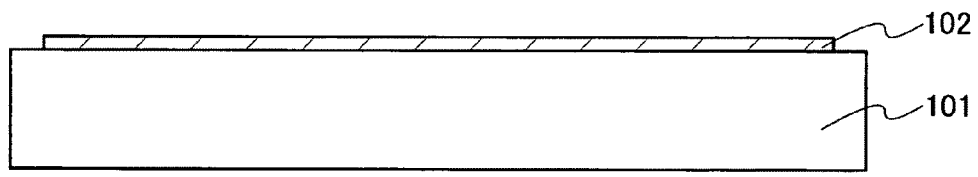
FIGS. 1A to 1D illustrate manufacturing steps of a semiconductor device of the present invention.

Embodiment Modes of the present invention will be hereinafter described in detail with reference to the accompanying drawings. However, it is easily understood by those skilled in the art that the present invention can be implemented in various different modes, and modes and details of the present invention can be modified in various ways without departing from the purpose and the scope of the present invention. Accordingly, the present invention should not be interpreted as being limited to the description of the embodiment modes. Note that in structures of the present invention described below, reference numerals denoting the same components are used in common in different drawings, and detailed description of the same portions or portions having similar functions is omitted.

Embodiment Mode 1

All or a part of a semiconductor device or a display device includes a TFT which is formed over a glass substrate in such manner that a silicon layer is separated from a single-crystal substrate and bonded (transferred) to the glass substrate, or a TFT formed over a glass substrate in such a manner that a single-crystal substrate is bonded to the glass substrate and separated from the glass substrate to form a silicon layer over the glass substrate. Not that the TFTs which is formed over a glass substrate in such manner that a silicon layer is separated from a single-crystal substrate and transferred to the glass substrate, or a TFT formed over a glass substrate in such a manner that a single-crystal substrate is bonded to a glass substrate and separated from the glass substrate to transfer a silicon layer which is part of the silicon substrate over the glass substrate are hereinafter referred to as single-crystal TFT.

Then, a non-single-crystal TFT is also formed at the same time as a single-crystal TFT. Examples of a non-single-crystal includes an amorphous semiconductor, a micro-crystal semiconductor (also referred to as a microcrystalline semiconductor, a semi-amorphous semiconductor, and a nanocrystal semiconductor).

Next, a manufacturing method is described with reference to drawings.

As shown in FIG. 1A, various substrates can be used for an insulating substrate 101 without limiting to a glass substrate. For example, a glass substrate such as a barium borosilicate glass, an aluminoborosilicate glass, a quartz substrate, a ceramic substrate, or a metal substrate including stainless steel can be used. Further, a substrate formed of plastics typified by polyethylene terephthalate (PET), polyethylene naphthalate (PEN), or polyethersulfone (PES), or a substrate formed of a flexible synthetic resin such as acrylic can also be used. By using a flexible substrate, a bendable semiconductor device can be manufactured. Since a flexible substrate has no restrictions on the area and the shape, a rectangular substrate with a side of one meter or more can be used as the insulating substrate 101, for example, so that productivity can be significantly improved. Such merit is greatly advantageous as compared to a case of using a round silicon substrate.

Note that it is preferable that an insulating film be provided over the surface of the insulating substrate 101. The insulating film serves as a base film. That is, the insulating film is provided in order to prevent alkali metal such as Na or alkaline earth metals from the inside of the insulating substrate 101 from affecting characteristics of the semiconductor device adversely. The insulating film can have a single-layer structure or a stacked-layer structure of insulating films containing oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y). In the case where the insulating film has a two-layer structure, it is preferable that a silicon nitride oxide film be formed for a first layer, and a silicon oxynitride film be formed for a second layer, for example. As another example, in the case where the insulating film has a three-layer structure, it is preferable that a silicon oxynitride film be used as a first insulating film, a silicon nitride oxide film be used as a second insulating film, and a silicon oxynitride film be used as a third insulating film.

However, it is also possible that the insulating film is not provided over the surface of the insulating substrate 101 without limiting to this.

Then, a semiconductor layer 102 is provided over the insulating substrate 101 which is provided with an insulating film, or the like. The semiconductor layer 102 may be provided over the entire surface or part of the surface of the insulating substrate 101. The semiconductor layer 102 is preferably single-crystal. However, the present invention is not limited to this. Single-crystal is preferable for an excellent current characteristic and high mobility.

Note that an arranging method of the semiconductor layer 102, or the like will be described in a different embodiment mode.

Figure 1B:
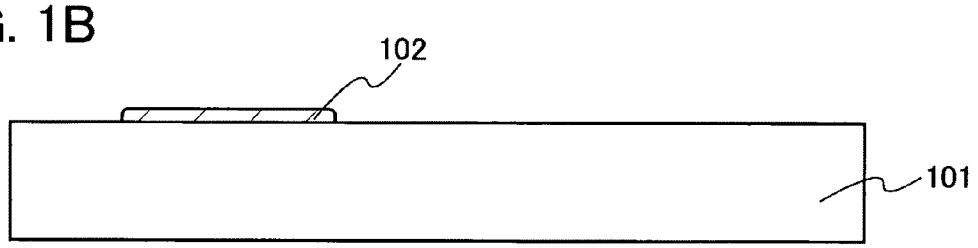

Next as shown in FIG. 1B, an unnecessary portion of the semiconductor layer 102 is removed by etching so that the semiconductor layer 102 has a predetermined shape. That is, the semiconductor layer 102 is processed into the island shape. In other words, the semiconductor layer 102 is patterned.

The semiconductor layer 102 serves as an active layer of a transistor. However, the semiconductor layer 102 can serves as an electrode of a capacitor element, a resistor element, an active layer of a diode, or the like in some cases without being limited to this.

Figure 1C:
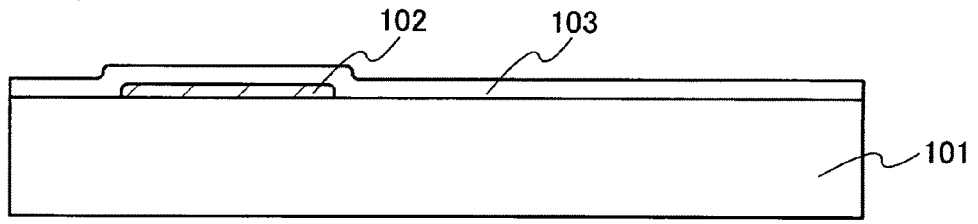

Next as shown in FIG. 1C, an insulating layer 103 is provided so as to cover the semiconductor layer 102. The insulating layer 103 is provided using a CVD method, a sputtering method, a thermal oxidation method, a vapor deposition method, an ink jet method, a printing method, or the like. The insulating layer 103 also serves as a gate insulating film. Alternatively, the insulating layer 103 serves as an insulator of a capacitor element or an interlayer film in some cases.

The insulating layer 103 can be formed by a single-layer structure or a stacked-layer structure of a siloxane resin; a film, of silicon oxide ($SiO_x$), silicon nitride ($SiN_x$), silicon oxynitride ($SiO_xN_y$) (x>y), silicon nitride oxide ($SiN_xO_y$) (x>y), or the like; a film containing carbon, such as a DLC (diamond-like carbon); an organic material such as epoxy, polyimide, polyamide, polyvinyl phenol, benzocyclobutene, or acrylic; or an insulating film containing oxygen or nitrogen. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent.

A portion of the insulating layer 103 in contact with the semiconductor layer 102 is preferably silicon oxide ($SiO_x$). A phenomenon of an electron being trapped or hysteresis effect can be prevented by using silicon oxide ($SiO_x$).

Figure 1D:
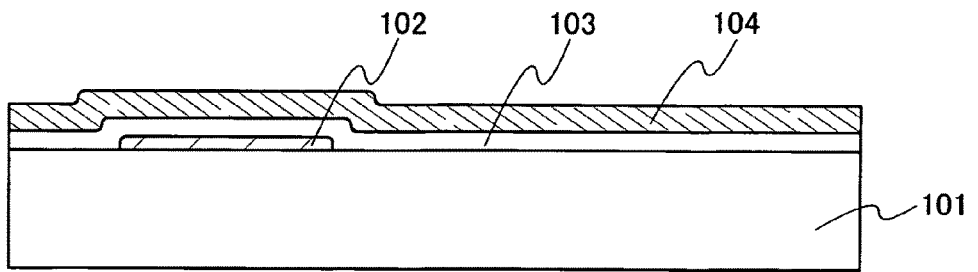

Next as shown in FIG. 1D, a conductive layer 104 is provided so as to cover the insulating layer 103. The conductive layer 104 is provided using a CVD method, a sputtering method, a thermal oxidation method, a vapor deposition method, an ink jet method, a printing method, or the like.

Figure 2A:
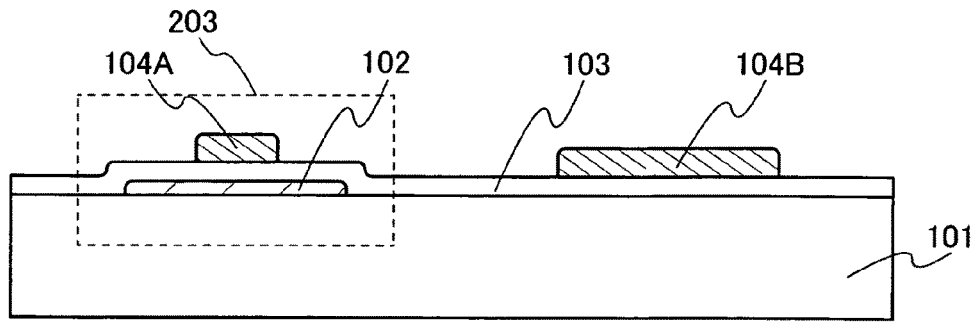
FIGS. 2A to 2D illustrate manufacturing steps of a semiconductor device of the present invention.

Next as shown in FIG. 2A, an unnecessary portion of the conductive layer 104 is removed by etching so that the conductive layer 104 has a predetermined shape. That is, the conductive layer 104 is processed into the island shape. In other words, the conductive layer 104 is patterned. As a result, a gate electrode 104A and a gate electrode 104B are formed.

The gate electrode 104A forms a transistor 203 together with the semiconductor layer 102 and the insulating layer 103. Since the gate electrode 104A is provided over the semiconductor layer 102, the transistor 203 is a top gate transistor.

Note that, the transistor 203 can have various structures. For example, the transistor 203 can be a single drain transistor. In this case, since the transistor 203 can be formed in a simple method, there are advantages of low manufacturing cost and high yield. Here, the semiconductor layer 102 has regions of different concentrations of an impurity, a channel formation region, a source region, and a drain region. By controlling the concentration of impurities in this manner, resistivity of the semiconductor layer can be controlled. In the source region and a drain region, an electrical connection state of the semiconductor layer 102 and the conductive film can be closer to ohmic contact. Note that as a method of forming the semiconductor layers each having different amount of impurities as selected, a method can be used in which the semiconductor layer is doped with an impurity using the gate electrode 104A as a mask.

Alternatively, in the transistor 203, the gate electrode 104A can be tapered at least certain degrees. In this case, since the transistor 203 can be formed in a simple method, there are advantages of low manufacturing cost and high yield. Here, the semiconductor layer 102 has regions of different concentrations of an impurity, a channel formation region, lightly doped drain (LDD) region, a source region and a drain region. By controlling the amount of impurities in this manner, resistivity of the semiconductor layer can be controlled. An electrical connection state of the semiconductor layer 102 and the conductive film connected thereto can be closer to ohmic contact. Moreover, since the transistor includes the LDD region, a high electric field is not easily applied to inside of the transistor, so that deterioration of the element due to hot carriers can be suppressed. Note that as a method of forming the semiconductor layers each including a different amount of an impurity as selected, a method where impurities are added to the semiconductor layer using the gate electrode 104A as a mask can be used. If the gate electrode 104A is tapered at more than certain degrees, the impurity can be added to the semiconductor layer through the gate electrode 104A with a gradient so that the LDD region can be easily formed.

Alternatively, the transistor 203 can have the gate electrode 104A formed of at least two layers, and a lower gate electrode can be longer than an upper gate electrode. In this case, a shape of the lower and upper gate electrodes can be called a hat shape. When the gate electrode 104A has a hat shape, an LDD region can be formed without addition of a photomask. Note that a structure where the LDD region overlaps with the gate electrode 104A is particularly called a GOLD (gate overlapped LDD) structure. As a method of forming the gate electrode 104A with a hat shape, the following method may be used.

First, when the gate electrode 104A is patterned, the lower and upper gate electrodes are etched by dry etching so that side surfaces thereof are inclined (tapered). Then, an inclination of the upper gate electrode is processed to be almost perpendicular by anisotropic etching. Thus, the gate electrode is formed such that the cross section is hat-shaped. After that, a channel region, an LDD region, a source region, and a drain region are formed by the semiconductor layer with an impurity element twice.

Note that a portion of the LDD region which overlaps with the gate electrode 104A is referred to as an Lov region, and a portion of the LDD region which does not overlap with the gate electrode 104A is referred to as an Loff region. The Loff region is highly effective in suppressing an off-current value, whereas it is not very effective in preventing deterioration in an on-current value due to hot carriers by relieving an electric field in the vicinity of the drain. On the other hand, the Lov region works effectively in preventing deterioration in the on-current value by relieving the electric field in the vicinity of the drain; however, it does not work effectively in suppressing the off-current value. Thus, it is preferable to form a transistor having a structure corresponding to characteristics required for each of the various circuits. For example, when the semiconductor device is used for a display device, a transistor having a Loff region is preferably used as a pixel transistor in order to suppress the off-current value. On the other hand, as a transistor in a peripheral circuit, a transistor having an Lov region is preferably used in order to prevent deterioration in the on-current value by relieving the electric field in the vicinity of the drain.

Alternatively, the transistor 203 can include sidewalls in contact with the side portion of the gate electrode 104A. When the transistor includes the sidewall, a region overlapping with the sidewall can be made to be an LDD region.

Alternatively, in the transistor 203, the semiconductor layer 102 can be doped using a mask so that an LDD (Loff) region can be formed. Thus, the LDD region can surely be formed, and an off-current value of the transistor can be reduced.

Alternatively, in the transistor 203, the semiconductor layer can be doped using a mask so that an LDD (Lov) region can be formed. Thus, the LDD region can surely be formed, and deterioration in an on-current value can be prevented by relieving the electric field in the vicinity of the drain of the transistor.

Note that the conductive layer 104 can be processed into a conductive film having various functions without being limited to the gate electrode. For example, various functions of the conductive film include a wiring or an electrode such as a wiring for forming a storage capacitor, a wiring for forming a scan line, a wiring for connecting circuits, or the like.

Figure 2B:
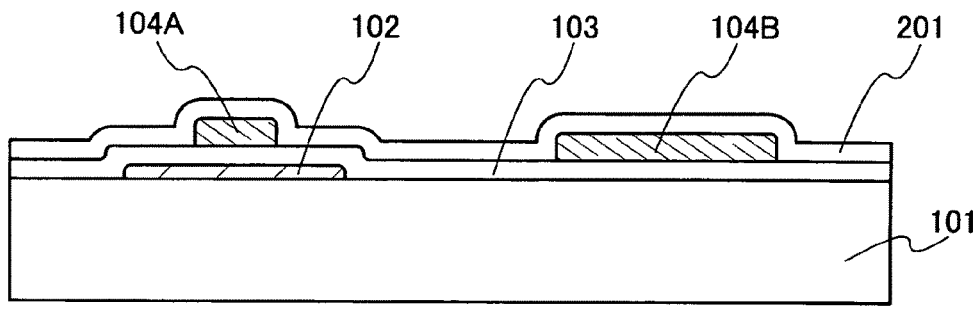

Next, as shown in FIG. 2B, an insulating layer 201 is provided so as to cover the gate electrode 104A and the gate electrode 104B. The insulating layer 201 is provided using a CVD method, a sputtering method, a thermal oxidation method, a vapor deposition method, an ink jet method, a printing method, or the like. The insulating layer 201 serves as a gate insulating film. Alternatively, the insulating layer 201 serves as an insulator of a capacitor element or an interlayer film in some cases.

The insulating layer 201 can be formed by a single-layer structure or a stacked-layer structure of a siloxane resin; a film, of silicon oxide ($SiO_x$), silicon nitride ($SiN_x$), silicon oxynitride ($SiO_xN_y$) (x>y), silicon nitride oxide ($SiN_xO_y$) (x>y), or the like; a film containing carbon, such as a DLC (diamond-like carbon); an organic material such as epoxy, polyimide, polyamide, polyvinyl phenol, benzocyclobutene, or acrylic; or an insulating film containing oxygen or nitrogen. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent.

It is preferable that a portion of the insulating layer 201 in contact with a semiconductor layer 202, which is provided later, be silicon nitride ($SiN_x$). The semiconductor layer 202 includes hydrogen in some case. In that case, reacting the hydrogen included in the semiconductor layer 202 and the insulating layer 201 can be prevented by using silicon nitride ($SiN_x$) as the insulating layer 201.

Figure 2C:
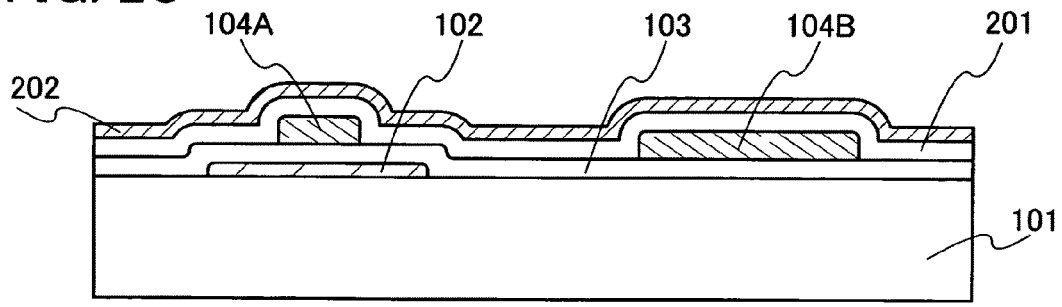

Next, as shown in FIG. 2C, the semiconductor layer 202 is provided so as to cover the insulating layer 201. The semiconductor layer 202 is provided using a CVD method, a sputtering method, a thermal oxidation method, a vapor deposition method, an ink jet method, a printing method, or the like. The semiconductor layer 202 includes at least two layers, and an impurity semiconductor is provided over an intrinsic semiconductor.

The crystallinity of the semiconductor layer 202 is preferably amorphous, micro-crystal (also referred to as microcrystal, semi-amorphous, nanocrystal, or the like).

Figure 2D:
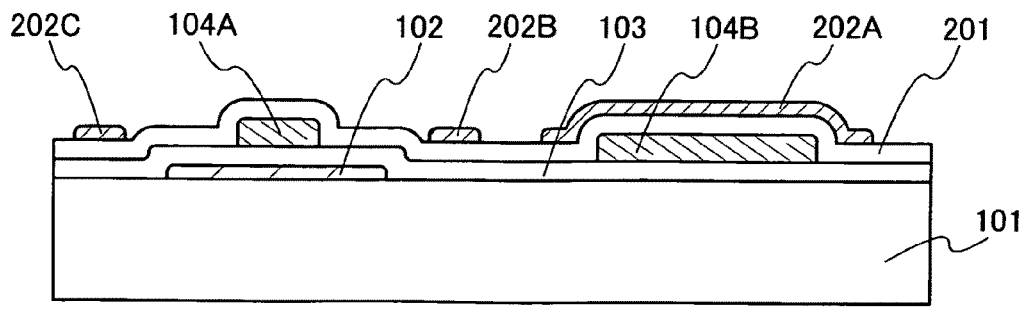

Next as shown in FIG. 2D, an unnecessary portion of the semiconductor layer 202 is removed by etching so that the semiconductor layer 202 has a predetermined shape. That is, the semiconductor layer 202 is processed into the island shape. In other words, the semiconductor layer 202 is patterned.

In this case, the patterned semiconductor layer 202A serves as an active layer of a transistor. However, the present invention is not limited to this. The semiconductor layer can also serve as an interlayer film. In other words, intersection capacitance of the wiring can be reduced by providing a semiconductor layer, and disconnection of the wiring can be reduced by reducing a bumps. For example, a semiconductor layer 202B and a semiconductor layer 202C serve as interlayer films.

Figure 3A:
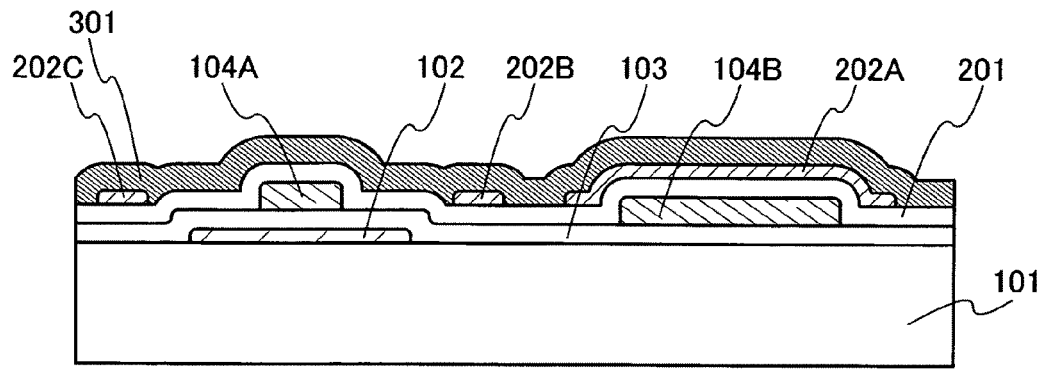
FIGS. 3A to 3C illustrate manufacturing steps of a semiconductor device of the present invention.

Next as shown in FIG. 3A, a conductive layer 301 is provided so as to cover the semiconductor layer 202A, the semiconductor layer 202B, and the semiconductor layer 202C. The conductive layer 301 is provided using a CVD method, a sputtering method, a thermal oxidation method, a vapor deposition method, an ink jet method, a printing method, or the like.

The conductive layer 104 and the conductive layer 301 can have a single-layer structure of a conductive film or a stacked-layer structure of two or three conductive films. A conductive film can be used as a material of the conductive layer 104. For example, a single film of an element such as tantalum (Ta), titanium (Ti), molybdenum (Mo), tungsten (W), chromium (Cr), silicon (Si), aluminum (Al), nickel (Ni), carbon (C), tungsten (W), platinum (Pt), copper (Cu), tantalum (Ta), gold (Au), or manganese (Mn); a nitride film of the aforementioned element (typically, a tantalum nitride film, a tungsten nitride film, or a titanium nitride film); an alloy film in which the aforementioned elements are combined (typically, a Mo—W alloy or a Mo—Ta alloy); a silicide film of the aforementioned element (typically, a tungsten silicide film or a titanium silicide film); or the like can be used. Alternatively, as an alloy containing a plurality of such elements, an Al alloy containing C and Ti, an Al alloy containing Ni, an Al alloy containing C and Ni, an Al alloy containing C and Mn, or the like can be used. Note that the aforementioned single-element film, a nitride film, an alloy film, a silicide film or the like can have a single-layer structure or be combined to have a stacked-layer structure. For example, in the case of providing a stacked layer structure, a structure in which Al is provided between Mo and Ti can be employed. Thus, resistance of Al to heat or chemical reaction can be improved. In the case of silicon, it is preferable to include much impurity (P-type impurities or N-type impurities) to improve conductivity.

Figure 3B:
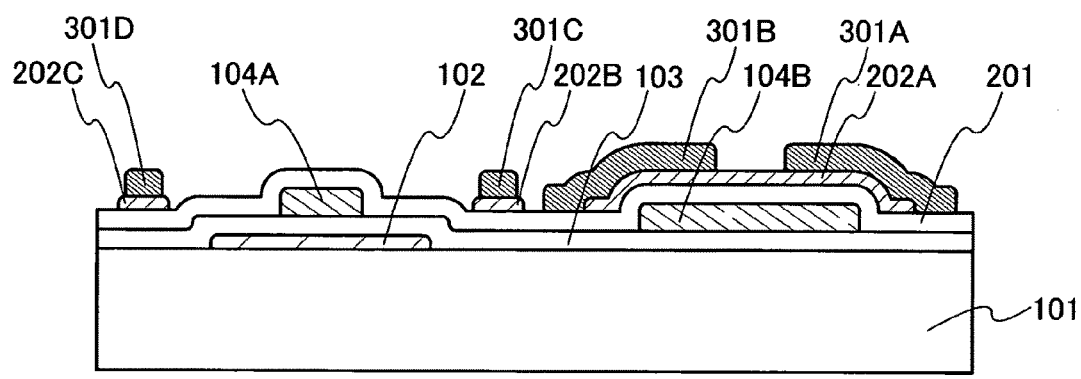

Next as shown in FIG. 3B, an unnecessary portion of the conductive layer 301 is removed by etching so that the conductive layer 301 has a predetermined shape. That is, the conductive layer 301 is processed into the island shape. In other words, the conductive layer 301 is patterned. As a result, a conductive layer 301A, a conductive layer 301B, a conductive layer 301C, and a conductive layer 301D are formed. The conductive layer 301A, the conductive layer 301B, the conductive layer 301C, and the conductive layer 301D serve as a source electrode, a drain electrode, a source signal line, or the like.

Figure 3C:
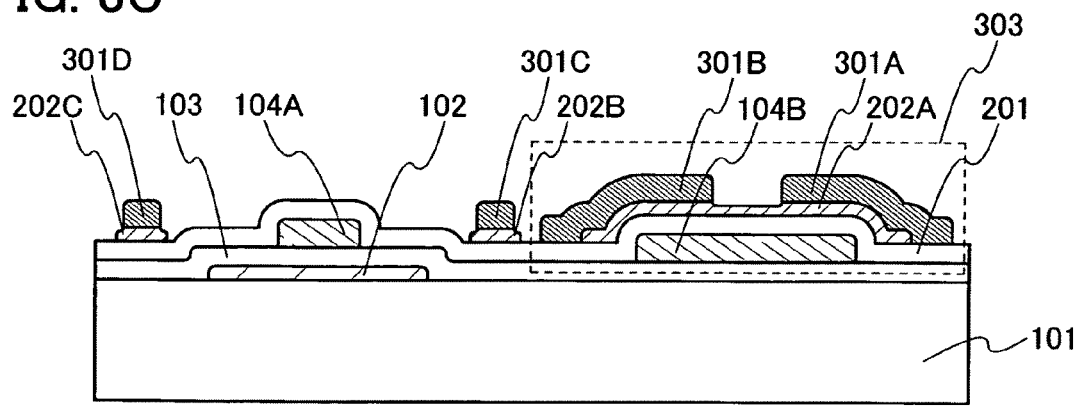

Next as shown in FIG. 3C, a portion of the semiconductor layer 202A is etched. Thus, an impurity layer in the channel region is removed. As a result, a transistor 303 is completed. Since the gate electrode 104B is provided under the semiconductor layer 202A, the transistor 303 is a bottom gate transistor, and is also an inversely staggered transistor. In addition, since a channel portion of a semiconductor layer is etched, the transistor 303 is a channel etch transistor.

The semiconductor layer 202A can be formed using an amorphous semiconductor, a microcrystalline semiconductor, or a semi-amorphous semiconductor (SAS). Alternatively, a polycrystalline semiconductor layer may be used. SAS has an intermediate structure between an amorphous and a crystalline structure (including a single-crystal and a polycrystalline), and a third condition that is stable in term of free energy. Moreover, SAS includes a crystalline region with a short-range order and lattice distortion. A crystalline region of 0.5 to 20 nm can be observed at least in part of a film. When silicon is contained as a main component, Raman spectrum shifts to a wave number side lower than 520 cm$^{-1}$. The diffraction peaks of (111) and (220) which are thought to be derived from the silicon crystalline lattice are observed by X-ray diffraction. SAS contains hydrogen or halogen of at least 1 atomic percent or more to compensate dangling bonds. SAS is formed by glow discharge decomposition (plasma CVD) of a material gas. As the material gas, $Si_2H_6$, $SiH_2Cl_2$, $SiHCl_3$, $SiCl_4$, $SiF_4$, or the like as well as $SiH_4$ can be used. Alternatively, $GeF_4$ may be mixed. The material gas may be diluted with $H_2$, or $H_2$ and one or more kinds of rare gas elements selected from He, Ar, Kr, and Ne. A dilution ratio is in the range of 2 to 1000 times. Pressure is in the range of approximately 0.1 to 133 Pa, and a power supply frequency is 1 to 120 MHz, preferably 13 to 60 MHz. A substrate heating temperature may be 300° C. or lower. A concentration of impurities in atmospheric components such as oxygen, nitrogen, and carbon is preferably $1\times10^{20}$ cm$^{-1}$ or less as impurity elements in the film. In particular, an oxygen concentration is $5\times10^{19}$/cm$^3$ or less, preferably $1\times10^{19}$/cm$^3$ or less. Here, an amorphous semiconductor layer is formed using a material containing silicon (Si) as its main component (e.g., $Si_xGe_{1-x}$) by a sputtering method, an LPCVD method, or a plasma CVD method. Then, the amorphous semiconductor layer is crystallized by a crystallization method such as a laser crystallization method, a thermal crystallization method using RTA or an annealing furnace, or a thermal crystallization method using a metal element which promotes crystallization.

Figure 4A:
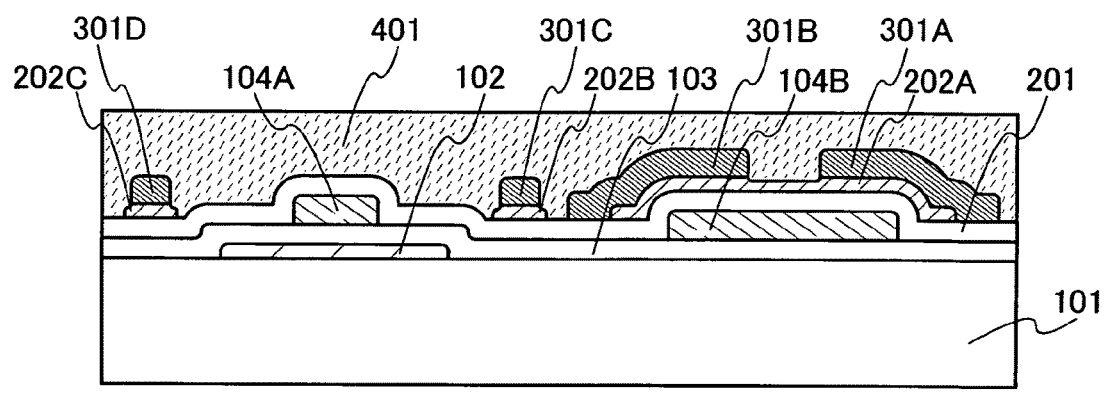
FIGS. 4A and 4B illustrate manufacturing steps of a semiconductor device of the present invention.

Next as shown in FIG. 4A, an insulating layer 401 is provided so as to cover the conductive layer 301A, the conductive layer 301B, the conductive layer 301C, and the conductive layer 301D. The insulating layer 401 is provided using a CVD method, a sputtering method, a thermal oxidation method, a vapor deposition method, an ink jet method, a printing method, or the like. The insulating layer 401 also serves as a protective film. Alternatively, the insulating layer 401 serves as an insulator of a capacitor element or an interlayer film in some cases.

The insulating layer 401 can be formed by a single-layer structure or a stacked-layer structure of a siloxane resin; a film, of silicon oxide ($SiO_x$), silicon nitride ($SiN_x$), silicon oxynitride ($SiO_xN_y$) (x>y), silicon nitride oxide ($SiN_xO_y$) (x>y), or the like; a film containing carbon, such as a DLC (diamond-like carbon); an organic material such as epoxy, polyimide, polyamide, polyvinyl phenol, benzocyclobutene, or acrylic; or an insulating film containing oxygen or nitrogen. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent.

It is preferable that a portion of the insulating layer 401 in contact with the semiconductor layer 202, which is provided, be silicon nitride ($SiN_x$). The semiconductor layer 202 includes hydrogen in some cases. In that case, reacting the hydrogen included in the semiconductor layer 202 and the insulating layer 401 can be prevented by using silicon nitride ($SiN_x$) as the insulating layer 401.

Note that the insulating layer 401 preferably includes silicon nitride ($SiN_x$). Silicon nitride ($SiN_x$) has a function of blocking impurities. Therefore, a transistor can be protected from impurities.

Note that the insulating layer 401 preferably includes an organic film. Thus, the surface of the insulating layer 401 can be flattened. When the surface of the insulating layer 401 is flat, a pixel electrode formed thereover can also be flattened. When a pixel electrode becomes flat, a display device can be made appropriately.

Figure 4B:
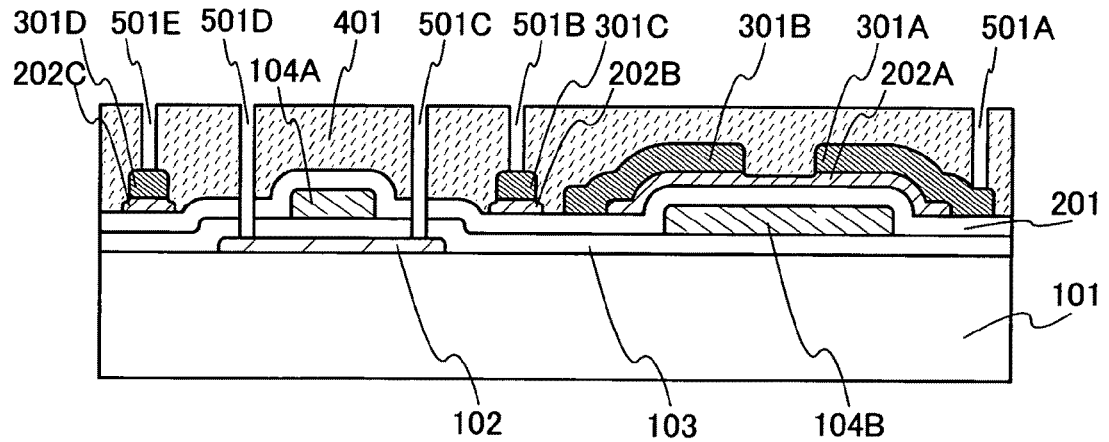

Next as shown in FIG. 4B, a contact hole is formed. The contact hole is formed by etching materials using a dry etching method, a wet etching, or the like. Note that when the insulating layer 401 includes the organic film which is formed of a photosensitive material, the contact hole can be formed at the same time as forming the insulating layer 401. Therefore, the material of the contact hole portion does not need to be etched. Therefore, steps can be reduced. The insulating layer 401A is etched so as to form a contact hole 501A, a contact hole 501B, and a contact hole 501E. The insulating layer 401, the insulating layer 201, and the insulating layer 103 are etched so as to form a contact hole 501C and a contact hole 501D.

Figure 5:
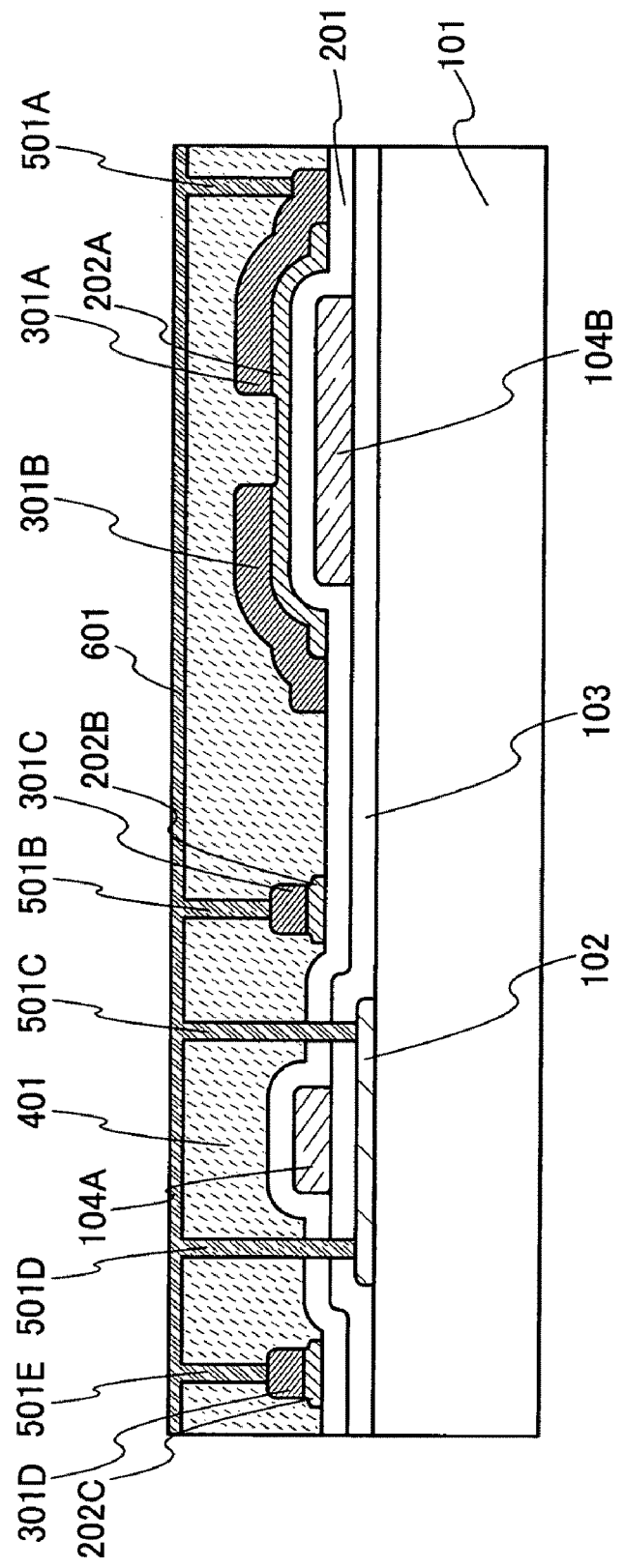
FIG. 5 illustrates a manufacturing step of a semiconductor device of the present invention.

Next as shown in FIG. 5, a conductive layer 601 is provided so as to cover the insulating layer 401, the contact hole 501A, the contact hole 501B, the contact hole 501C, the contact hole 501D, and the contact hole 501E. The conductive layer 601 is provided using a CVD method, a sputtering method, a thermal oxidation method, a vapor deposition method, an ink jet method, a printing method, or the like. The conductive layer 601 serves as a wiring, a pixel electrode, a light transmitting electrode, a reflective electrode, or the like.

The conductive layer 601 can have a single-layer structure of a conductive film or a stacked-layer structure of two or three conductive films. Further, the conductive layer 601 preferably includes a region which has high transmittivity of light and is light-transmitting or close to light-transmitting. Thus, the conductive layer 601 can serve as a pixel electrode of a light transmitting region. In addition, the conductive layer 601 preferably includes a region of high reflectivity. Thus, the conductive layer 601 can serve as a pixel electrode of a reflective region.

Note that it is preferable that the conductive layer 601 is a film including ITO, IZO, ZnO, or the like.

Figure 6:
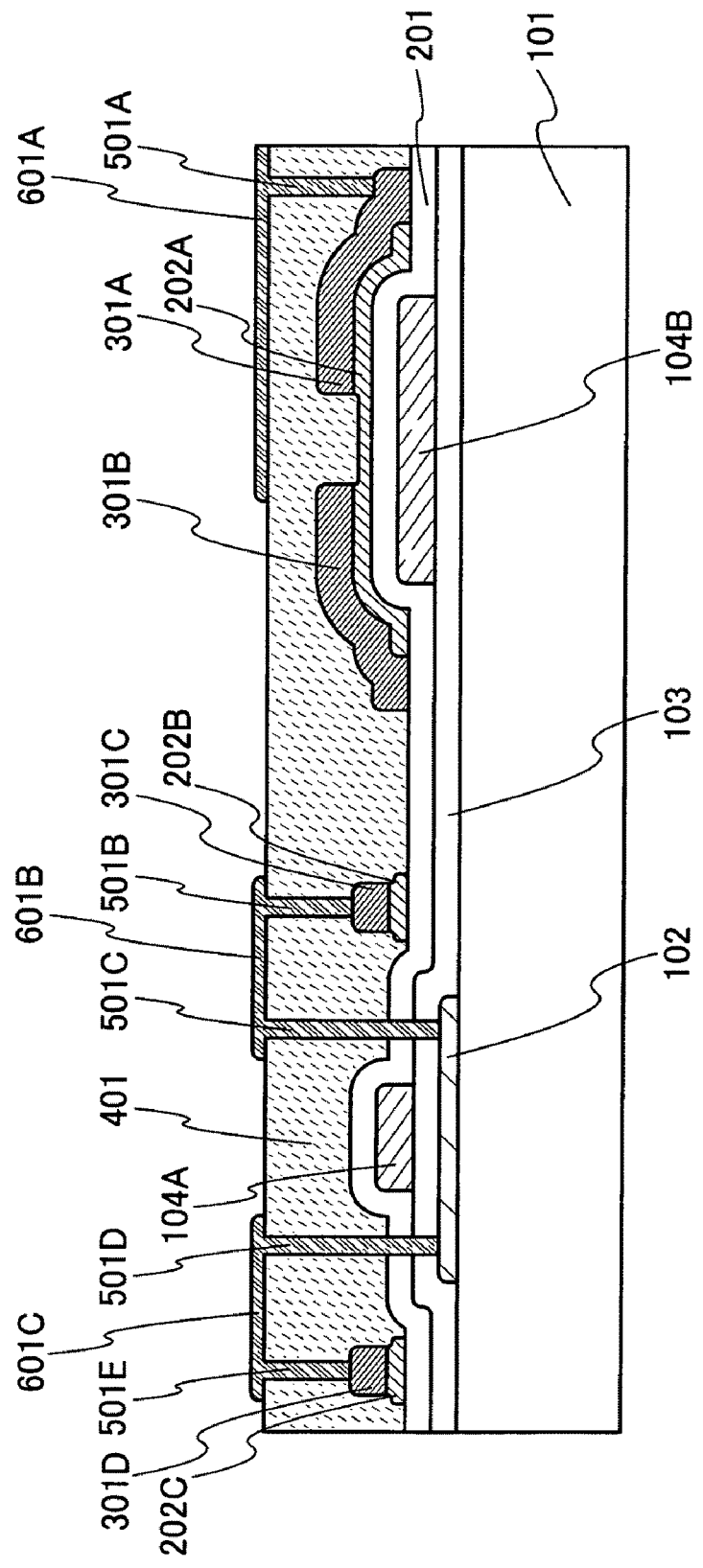
FIG. 6 illustrates a manufacturing step of a semiconductor device of the present invention.

Next as shown in FIG. 6, an unnecessary portion of the conductive layer 601 is removed by etching so that the conductive layer 601 has a predetermined shape. That is, the conductive layer 601 is processed into the island shape. In other words, the conductive layer 601 is patterned.

In this case, a patterned conductive layer 601A serves as a pixel electrode as a patterned conductive layer. However, the present invention is not limited this. A conductive layer 601B and a conductive layer 601C serve as a wiring. The conductive layer 601B has a function of connecting the conductive layer 301C and the semiconductor layer 102. The conductive layer 601C has a function of connecting the conductive layer 301D and the semiconductor layer 102.

After that, a display device is completed through various steps in accordance with the kind of display devices. For example, an orientation film is formed, and liquid crystal is provided between a counter substrate having a color filter and the orientation film. Alternatively, an organic electroluminescence material is provided over the conductive layer 601A, and a cathode is provided thereover.

Figure 7:
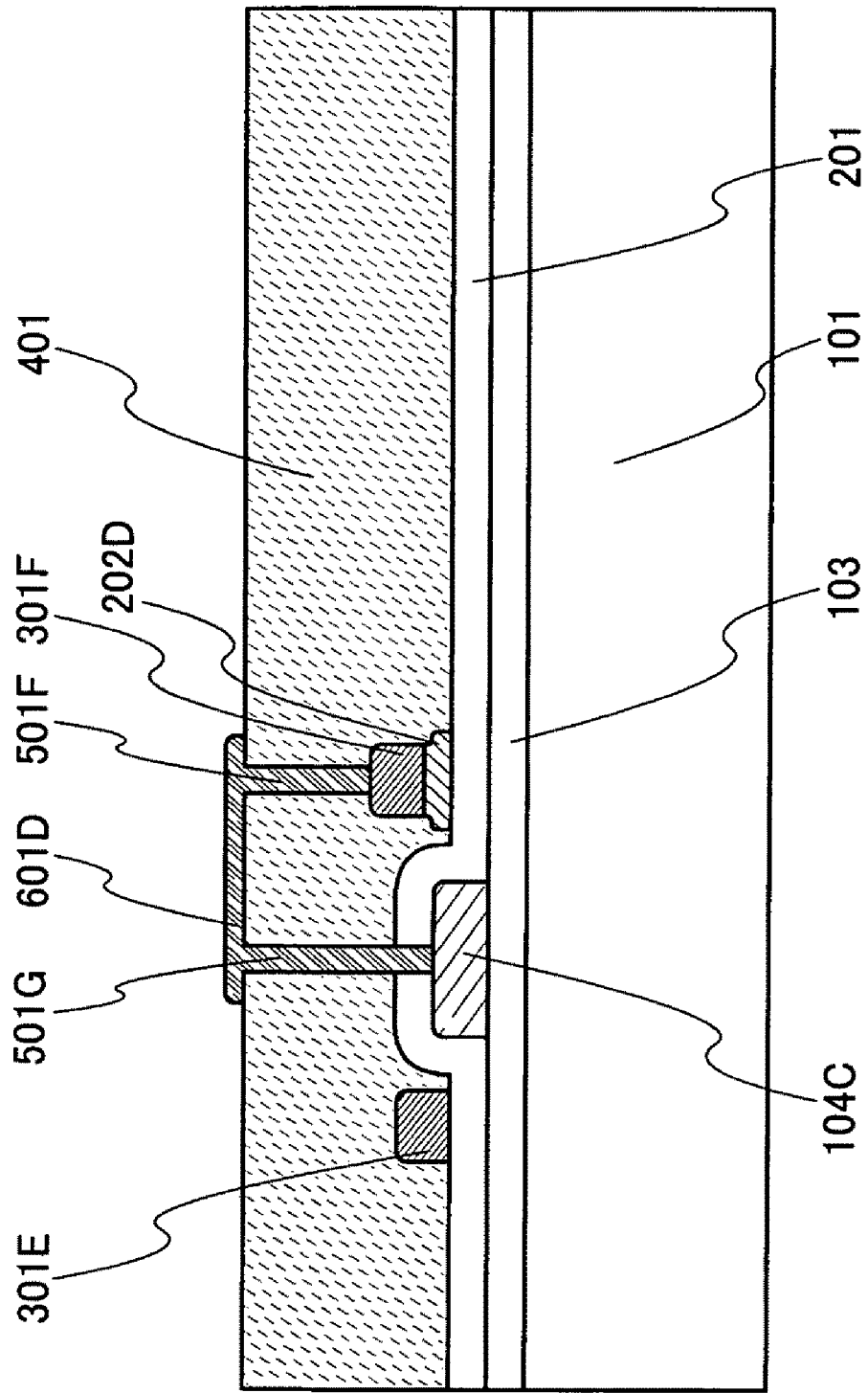
FIG. 7 illustrates a cross-sectional view of a semiconductor device of the present invention.

Note that, in FIG. 4B, a contact hole is formed, and a conductive layer is provided thereover, so that the conductive layer 301C and the semiconductor layer 102 are connected. As shown in FIG. 7, conductive layer 301F and a conductive layer 104C can be connected through a contact hole 501F and a contact hole 501G using a conductive layer 601D. Note that the conductive layer 301F is formed using the conductive layer 301, the conductive layer 104C is formed using the conductive layer 104, and the conductive layer 601D is formed using the conductive layer 601. The contact hole 501F and the contact hole 501G are formed at the same time as forming contact hole 501A, the contact hole 501B, the contact hole 501C, the contact hole 501D, and the like.

Note that in a similar manner to the conductive layer 301C, the conductive layer 301D, and the conductive layer 301F, a semiconductor layer may be provided under the conductive layers, or a semiconductor layer is not necessarily provided under the conductive layer 301E as shown in FIG. 7.

Figure 8:
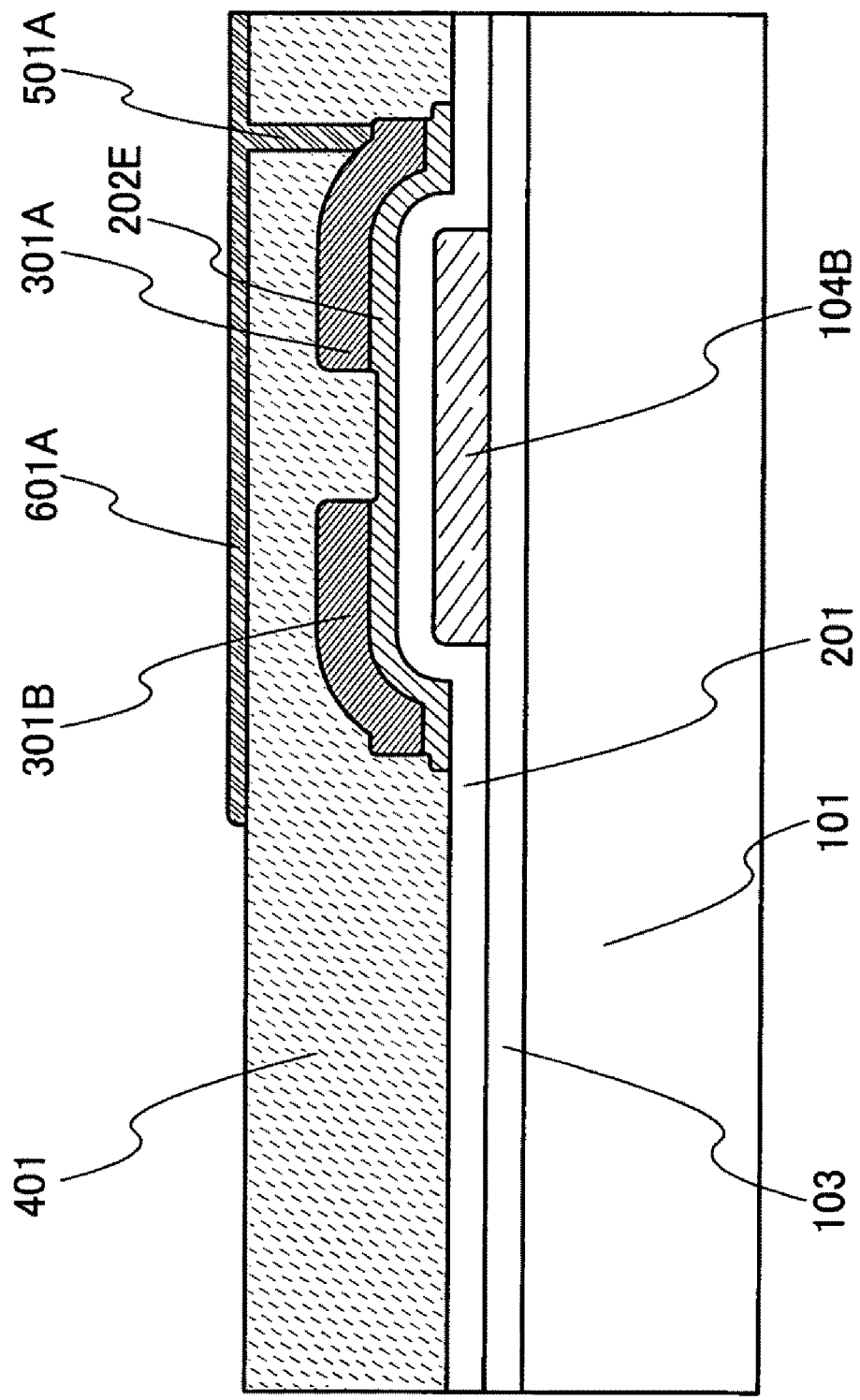
FIG. 8 illustrates a cross-sectional view of a semiconductor device of the present invention.

Note that, in FIG. 2D, FIG. 3A, FIG. 3B, and FIG. 3C, the semiconductor layer 202 is patterned using a mask (reticle) which is different from that of the conductive layer 301; however, the present invention is not limited to this. The semiconductor layer 202 and the conductive layer 301 can be patterned with one mask (reticle) using a half tone mask, a gray tone mask, or the like. FIG. 8 shows a cross sectional view of that case. The size of a semiconductor layer 202E is larger than that of the conductive layer 301A and the conductive layer 301B because of using a half tone mask, a gray tone mask, or the like. In other words, the semiconductor layer 202E is necessarily provided under the conductive layer 301A and the conductive layer 301B.

Figure 9:
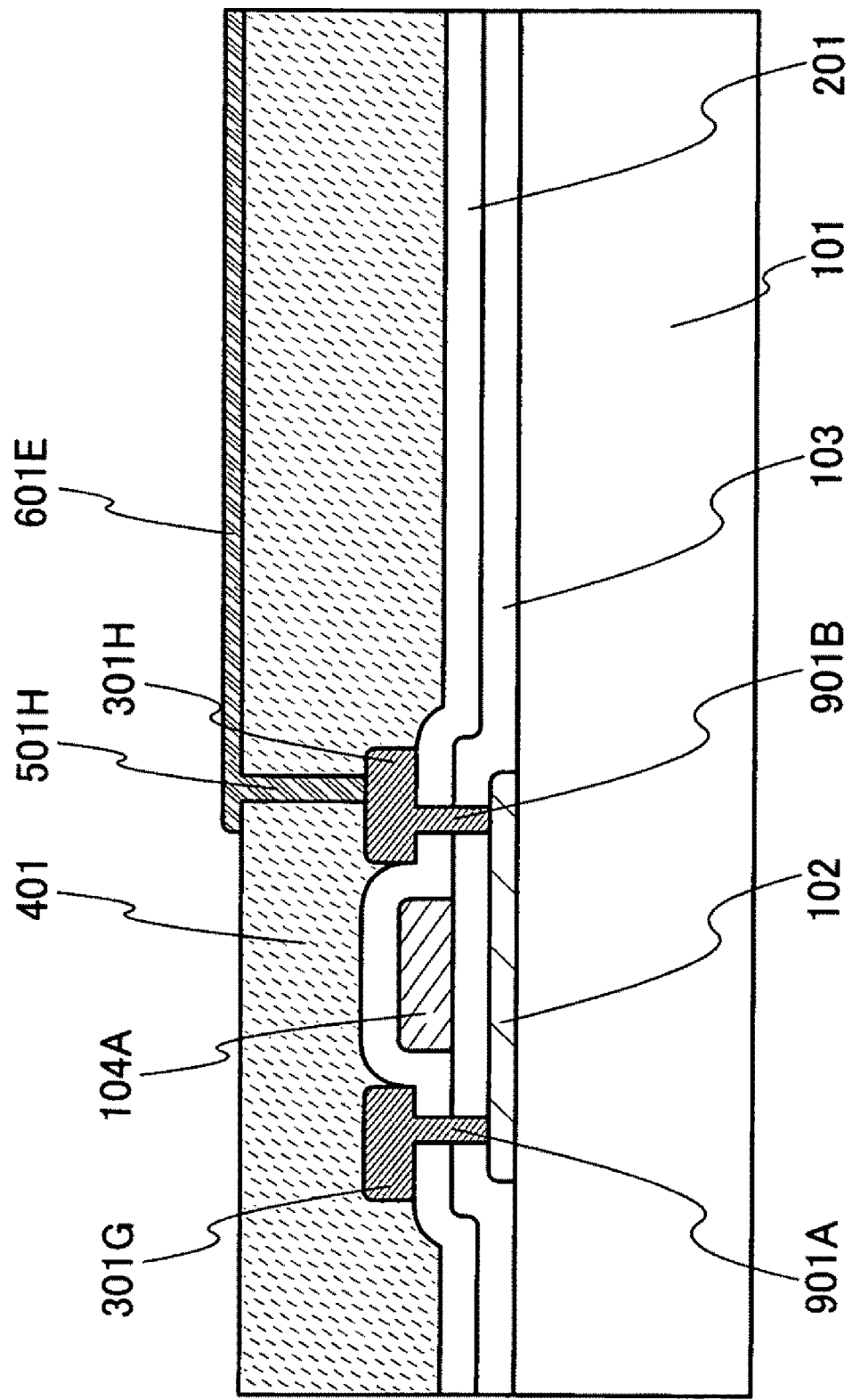
FIG. 9 illustrates a cross-sectional view of a semiconductor device of the present invention.

Note that, in FIG. 6, the conductive layer 301C and the semiconductor layer 102 are connected through the conductive layer 601B, and the conductive layer 301D and the semiconductor layer 102 are connected through the conductive layer 601C, and in FIG. 7, the conductive layer 301F and the conductive layer 104C are connected through the conductive layer 601D; however, the present invention is not limited to this. By forming a contact hole, the conductive film and the semiconductor layer can be directly connected without interposing another conductive layer. In other words, as the following step of FIG. 2D or FIG. 2B, the insulating layer 201 and the insulating layer 103 are etched to form a contact hole, so that the conductive film formed by using the conductive layer 301 can be directly connect to the conductive film formed by using the conductive layer 104 or the semiconductor layer formed by using the semiconductor layer 102. An example of this case is shown in FIG. 9. In FIG. 9, a conductive layer 301G formed by using the conductive layer 301 is directly connected to the semiconductor layer 102 through a contact hole 901A. Similarly, a conductive layer 301H formed by using the conductive layer 301 is directly connected to the semiconductor layer 102 through a contact hole 901B. The conductive layer 601E is directly connected to the conductive layer 301H through a contact hole 501H. Note that it is preferable that a semiconductor layer be not provided under the conductive layer 301H and the conductive layer 301G in the case. This is because when the semiconductor layer 102 is contacted with the conductive layer 301H and the conductive layer 301G, it is preferable that another layer is not provided therebetween.

Figure 10:
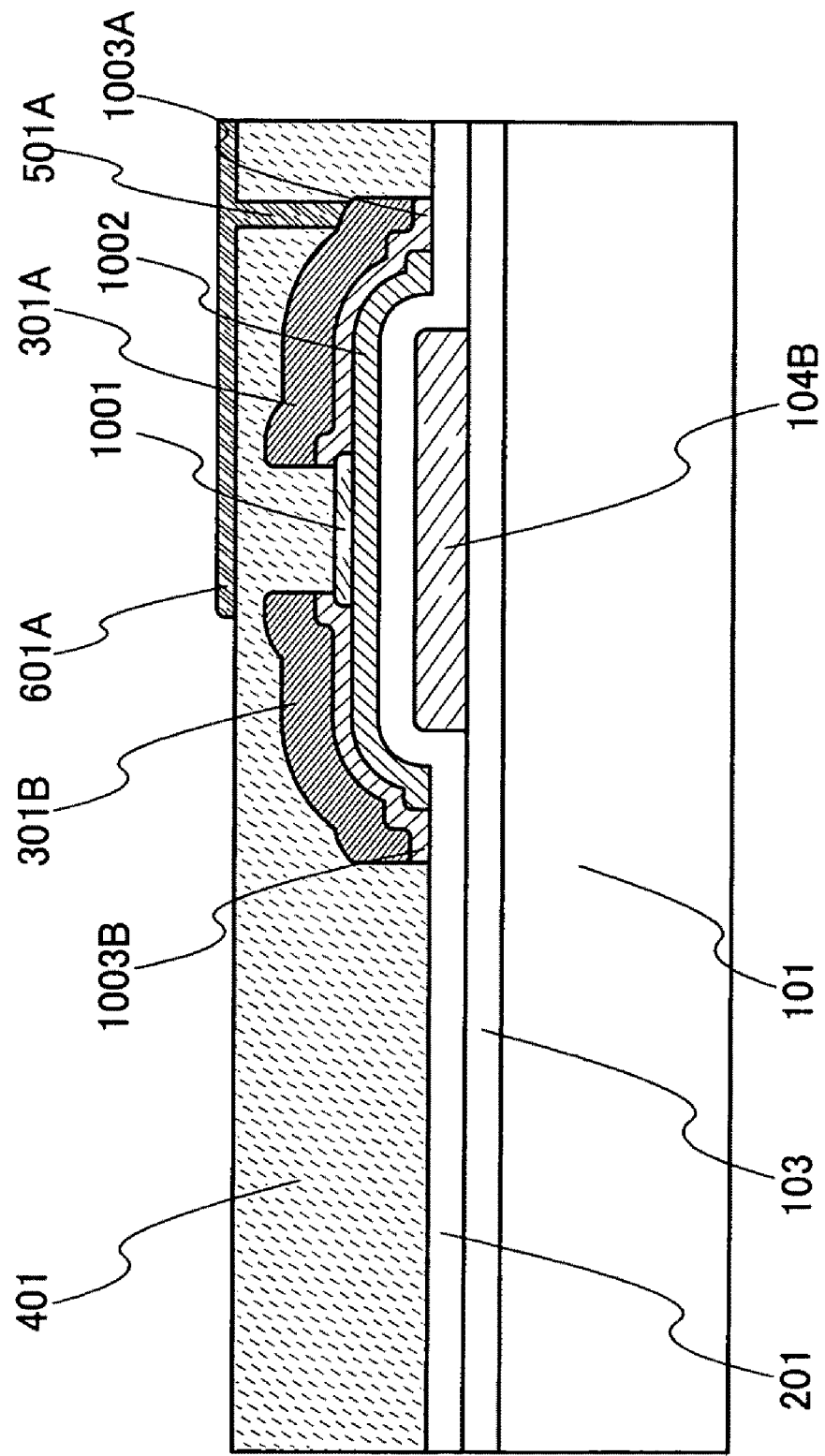
FIG. 10 illustrates a cross-sectional view of a semiconductor device of the present invention.

Note that, in FIG. 6, the transistor 303 is the channel etch transistor; however, the present invention is not limited to this. A channel protective transistor can also be used. An example of this case is shown in FIG. 10. In the channel protective transistor, semiconductor layers are not provided successively, but an insulating layer 1001 for protecting a channel from etching is provided therebetween. In other words, the insulating layer 1001 is provided over a semiconductor layer 1002 which is intrinsic, and a semiconductor layer 1003A and a semiconductor layer 1003B are provided thereover. The semiconductor layer 1003A and the semiconductor layer 1003B include an impurity (N-type or P-type).

Note that, in FIG. 10, the semiconductor layer 1002 is patterned, and then, the semiconductor layer 1003A, the semiconductor layer 1003B, the conductive layer 301A, and the conductive layer 301B are patterned concurrently; however, the present invention is not limited to this. The semiconductor layer 1002, the semiconductor layer 1003A, the semiconductor layer 1003B, the conductive layer 301A, and the conductive layer 301B can be patterned concurrently. In that case, the semiconductor layer 1002 is necessarily provided under the conductive layer 301A and the conductive layer 301B.

The structures and manufacturing methods of transistors have been described above. Note that a wiring, an electrode, a conductive layer, a conductive film, a terminal, a via, a plug, or the like is preferably formed of one element or a plurality of elements of a group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O), or a compound or an alloy material including one element or a plurality of such elements (e.g., indium tin oxide (ITO), indium zinc oxide (IZO), indium tin oxide to which silicon oxide is added (ITSO), zinc oxide (ZnO), tin oxide (SnO), cadmium tin oxide (CTO), aluminum neodymium (Al—Nd), magnesium silver (Mg—Ag), or molybdenum neodymium (Mo—Nb)). Alternatively, a wiring, an electrode, a conductive layer, a conductive film, a terminal, or the like is preferably formed of a substance or the like obtained by combining such compounds. Alternatively, such a wiring, an electrode, a conductive layer, a conductive film, a terminal are preferably formed to have a substance including a compound of silicon and one or more of the elements selected from the above group (silicide) (e.g., aluminum silicon, molybdenum silicon, nickel silicide); or a compound of nitrogen and one or more of the elements selected from the group (e.g., titanium nitride, tantalum nitride, or molybdenum nitride).

Note that silicon (Si) may include an n-type impurity (such as phosphorus) or a p-type impurity (such as boron). When silicon includes such impurity, conductivity is improved, so that the silicon can behave in a similar manner to a normal conductor. Thus, such silicon can be utilized easily as wirings or electrodes.

Silicon can be various types of silicon such as single-crystalline silicon, polycrystalline silicon, or microcrystalline silicon. Alternatively, silicon having no crystallinity such as amorphous silicon can be used. By using single-crystalline silicon or polycrystalline silicon, resistance of a wiring, an electrode, a conductive layer, a conductive film, a terminal, or the like can be reduced. By using amorphous silicon or microcrystalline silicon, a wiring or the like can be formed by a simple process.

Note that aluminum or silver has high conductivity, and thus can reduce a signal delay. Since aluminum or silver can be easily etched, aluminum or silver can be easily patterned and processed minutely.

Note that copper has high conductivity; therefore, signal delay can be decreased by using copper. In using copper, a stacked structure is preferably employed to enhance adhesiveness.

Molybdenum or titanium is preferable since molybdenum or titanium does not cause defects even if molybdenum or titanium is in contact with an oxide semiconductor (e.g., ITO or IZO) or silicon. Further, molybdenum or titanium is easily etched and has high heat resistance.

Tungsten is preferable since it has an advantage such as high heat resistance.

Neodymium is preferable because it has an advantage such as high heat resistance. In particular, when an alloy of neodymium and aluminum is used, heat resistance is improved, and thus, hillocks of aluminum are not easily generated.

Silicon is preferable since it can be formed at the same time as a semiconductor layer included in a transistor and has high heat resistance.

Note that ITO, IZO, ITSO, zinc oxide (ZnO), silicon (Si), tin oxide (SnO), or cadmium tin oxide (CTO) can be used for a portion which transmits light because it has a light-transmitting property. For example, it can be used for a pixel electrode or a common electrode.

IZO is preferable since it is easily etched and processed. In etching IZO, residues of IZO are hardly left. Thus, when a pixel electrode is formed using IZO, defects (such as short-circuiting or orientation disorder) of a liquid crystal element or a light-emitting element can be reduced.

A wiring, an electrode, a conductive layer, a conductive film, a terminal, a via, a plug, or the like may have a single-layer structure or a multi-layer structure. By employing a single-layer structure, a manufacturing process of such a wiring, an electrode, a conductive layer, a conductive film, or a terminal can be simplified; the number of days for a process can be reduced; and cost can be reduced. Alternatively, by employing a multilayer structure, an advantage of each material is utilized and a disadvantage thereof is reduced so that a wiring, an electrode, or the like with high performance can be formed. For example, a low-resistant material (e.g., aluminum) is included in a multilayer structure, thereby reducing the resistance of such wirings. As another example, when a low heat-resistant material is interposed between high heat-resistant materials to form a stacked-layer structure, heat resistance of wirings or electrodes can be increased, utilizing advantages of a low heat-resistance material. For example, a layer including aluminum is preferably interposed between layers including molybdenum, titanium, neodymium, or the like as a stacked-layer structure.

If wirings or electrodes are in direct contact with each other, an adverse effect is caused to each other in some cases. For example, a material of a wiring, an electrode, or the like is mixed into a material of the other wiring, electrode, or the like, and properties of the materials are changed, so that the original object cannot be achieved. As another example, when a high-resistant portion is formed, a problem may occur, so that the high-resistant portion cannot be normally formed. In such cases, a reactive material is preferably interposed by or covered with a material which does not react easily to form a stacked-layer structure. For example, when ITO is connected to aluminum, titanium, molybdenum, or an alloy of neodymium is preferably disposed between the ITO and the aluminum. As another example, when silicon is connected to aluminum, titanium, molybdenum, or an alloy of neodymium is preferably disposed between the silicon and the aluminum.

Note that the term "wiring" indicates a portion including a conductor. The wiring may be extended in a long linear shape or may be short. Therefore, electrodes are included in such wirings.

Note that a carbon nanotube may be used for a wiring, an electrode, a conductive layer, a terminal, a via, a plug, or the like. Since a carbon nanotube has a light-transmitting property, it can be used for a portion which transmits light. For example, it can be used for a pixel electrode or a common electrode.

A cross-sectional view has been shown. Next, an example of a layout pattern is shown. FIG. 11 is a layout pattern in which two transistors 203 are provided. A gate electrode 104AA is provided over a semiconductor layer 102AA and a semiconductor layer 102BB so as to form the transistor. A first power supply line 301AA is connected to the semiconductor layer 102AA through a contact hole using a conductive layer 601AA. Similarly, a second power supply line 301CC is connected to the semiconductor layer 102BB through a contact hole using a conductive layer 601CC. An output wiring 301BB is connected to the semiconductor layer 102AA and the semiconductor layer 102BB through a contact hole 501AA and a contact hole 501BB using a conductive layer 601BB.

Note that a circuit shown in FIG. 11 can operate as an inverter circuit or a source follower circuit.

In this manner, a circuit configured by the transistor 203 has high mobility and high current supply capacity; thus, it is preferable to be used as a driver circuit. On the other hand, since mobility of the transistor 303 is not high and the transistor 303 can be manufactured in a large size, it is preferable to be used as a pixel circuit.

Although this embodiment mode is described with reference to various drawings, the contents (or may be part of the contents) described in each drawing can be freely applied to, combined with, or replaced with the contents (or may be part of the contents) described in another drawing. Further, much more drawings can be formed by combining each part in the above-described drawings with another part.

Similarly, the contents (or a part thereof) described in each drawing of this embodiment mode can be freely applied to, combined with, or replaced with the contents (or a part thereof) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 2

Next, an arranging method of the semiconductor layer used for the single-crystal TFT is described.

Figure 12A:
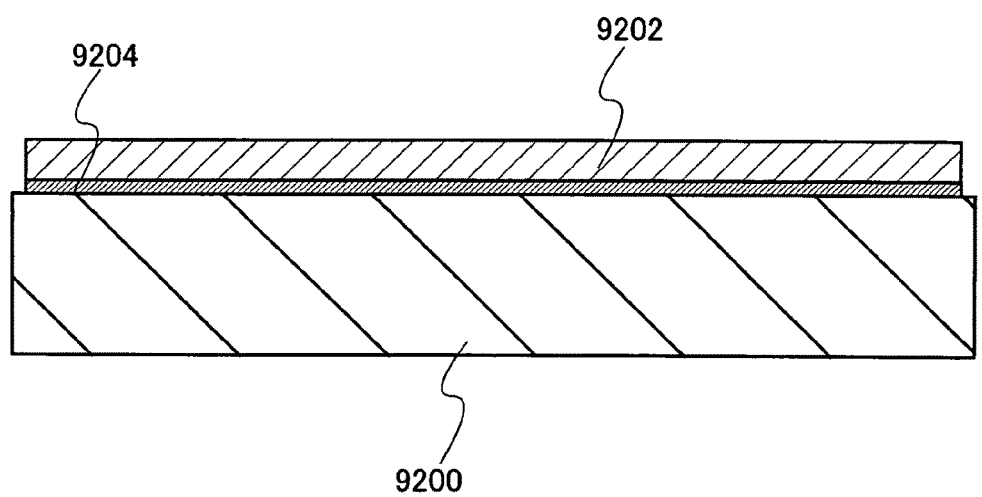
FIGS. 12A and 12B illustrate cross-sectional views of an SOI substrate of the present invention.
Figure 12B:
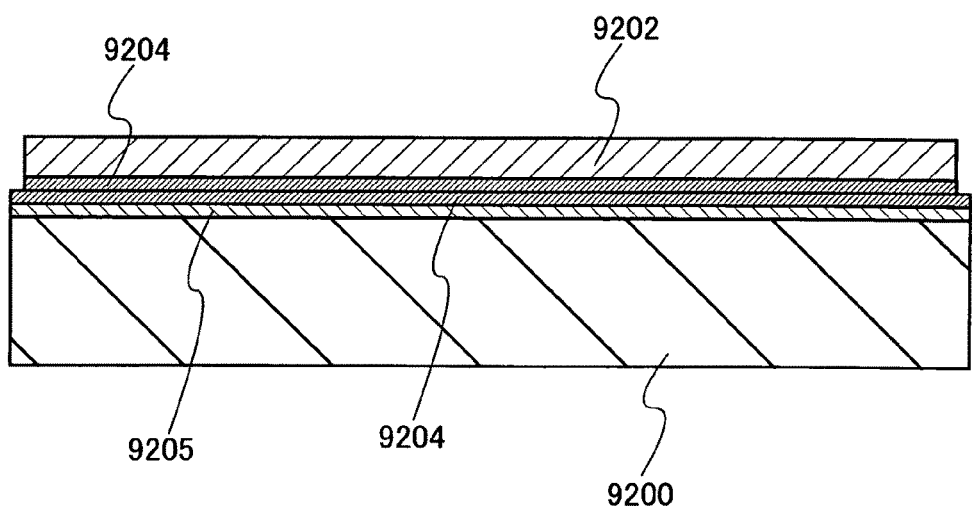

FIGS. 12A and 12B show an SOI substrate of the present invention. In FIG. 12A, a base substrate 9200 is a substrate having an insulating surface or an insulating substrate, and a variety of glass substrates that are used in the electronics industry, such as aluminosilicate glass, aluminoborosilicate glass, or barium borosilicate glass, can be used. Alternatively, a quartz glass substrate or a semiconductor substrate such as a silicon wafer can be used. An SOI layer 9202 is a single-crystal semiconductor, and single-crystal silicon is typically applied thereto. Alternatively, a semiconductor layer which is separated from a single-crystal semiconductor layer or a polycrystal semiconductor layer of silicon or germanium using a hydrogen ion implantation separation method can be applied. Alternatively, crystalline semiconductor layer formed by using a compound semiconductor such as gallium arsenide or indium phosphide can be applied.

Between the base substrate 9200 and the SOI layer 9202 described above, a bonding layer 9204 which has a smooth surface and forms a hydrophilic surface is provided. A silicon oxide film is suitable for the bonding layer 9204. In particular, a silicon oxide film formed by a chemical vapor deposition method using an organic silane gas is preferable. As an organic silane gas, a silicon-containing compound such as tetraethoxysilane (TEOS) (chemical formula: $Si(OC_2H_5)_4$), tetramethylsilane (TMS), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The bonding layer 9204 which has a smooth surface and forms a hydrophilic surface is provided with a thickness of 5 to 500 nm. With such a thickness, roughness of a surface on which the bonding layer 9204 is formed can be smoothed and smoothness of a growth surface of the film can be ensured. In addition, distortion between the base substrate 9200 and the SOI layer 9202 which are bonded to each other can be reduced. The base substrate 9200 may be provided with a similar silicon oxide film. That is, when the SOI layer 9202 is bonded to the base substrate 9200 which is a substrate having an insulating surface or an insulating substrate, the base substrate 9200 and the SOI layer 9202 can be firmly bonded to each other when the bonding layer 9204 formed of a silicon oxide film which is preferably formed using organic silane as a material is provided on either one or both surfaces of the base substrate 9200 and the SOI layer 9202 which are to be bonded.

FIG. 12B shows a structure in which the base substrate 9200 is provided with a barrier layer 9205 and the bonding layer 9204. In the case of bonding the SOI layer 9202 to the base substrate 9200, the SOI layer 9202 can be prevented from being contaminated by diffusion of impurities such as mobile ions like alkali metal or alkaline earth metal from a glass substrate which is used as the base substrate 9200. A bonding layer 9204 on the base substrate 9200 side may be provided as appropriate.

Figure 13A:
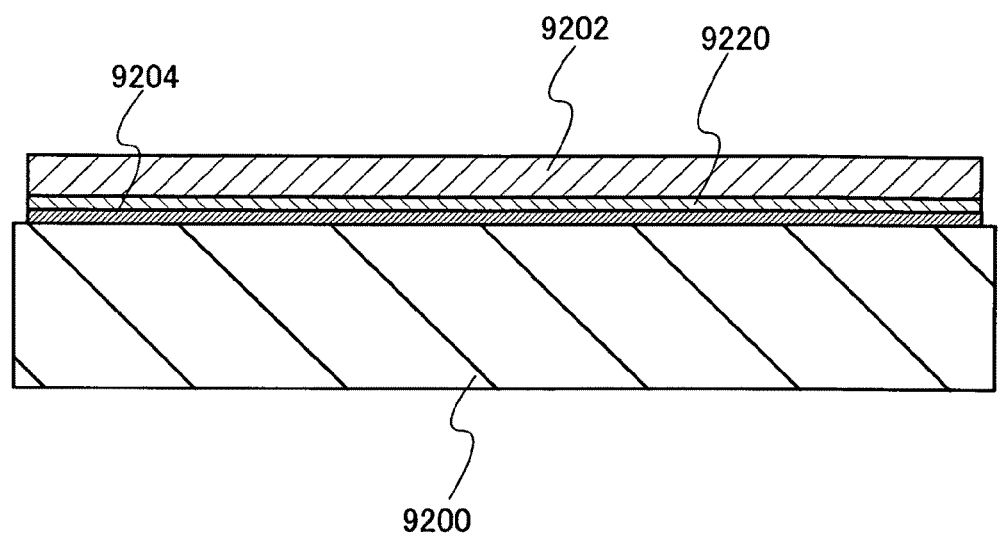
FIGS. 13A and 13B illustrate cross-sectional views of an SOI substrate of the present invention.

FIG. 13A shows a structure in which a nitrogen-containing insulating layer 9220 is provided between the SOI layer 9202 and the bonding layer 9204. The nitrogen-containing insulating layer 9220 is formed by stacking one or a plurality of films selected from a silicon nitride film, a silicon nitride oxide film, and a silicon oxynitride film. For example, the nitrogen-containing insulating layer 9220 can be formed by stacking a silicon oxynitride film and a silicon nitride oxide film from the SOI layer 9202 side. The bonding layer 9204 is provided in order to form a bond with the base substrate 9200, whereas the nitrogen-containing insulating layer 9220 is preferably provided in order to prevent the SOI layer 9202 from being contaminated by diffusion of impurities such as mobile ions or moisture.

Note that here, a silicon oxynitride film corresponds to a film which contains more oxygen than nitrogen, and for example, includes oxygen, nitrogen, silicon, and hydrogen at concentrations ranging from 50 to 70 at. %, 0.5 to 15 at. %, 25 to 35 at. %, and 0.1 to 10 at. %, respectively. In addition, a silicon nitride oxide film corresponds to a film which contains more nitrogen than oxygen and includes oxygen, nitrogen, silicon, and hydrogen at concentrations ranging from 5 to 30 at. %, 20 to 55 at. %, 25 to 35 at. %, and 10 to 25 at. %, respectively. Note that the above range is a measurement result using Rutherford backscattering spectrometry (RBS) and hydrogen forward scattering (HFS). Note that the content percentages of the component atoms is not beyond 100 at. %

Figure 13B:
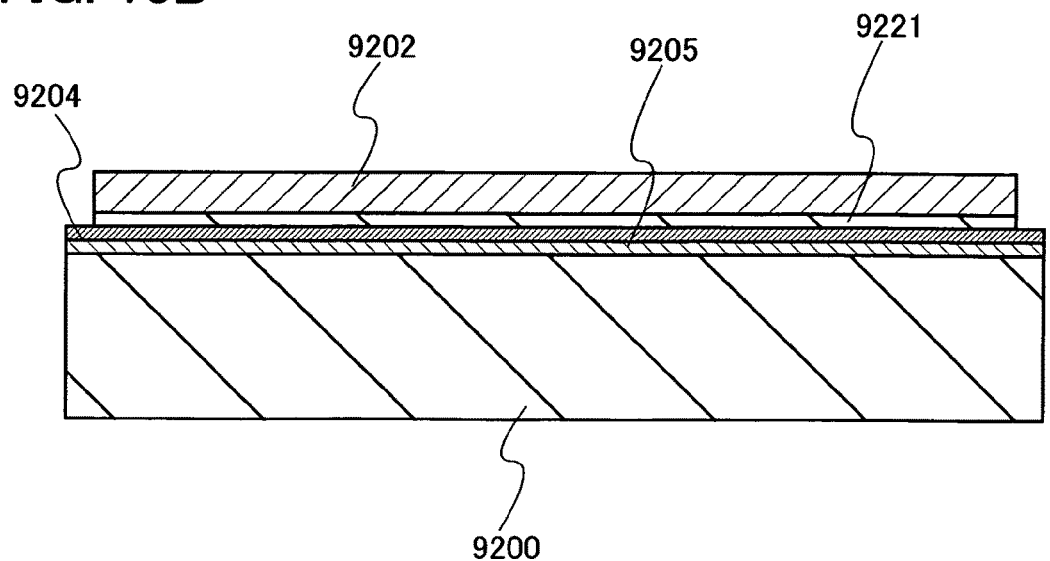

FIG. 13B shows a structure in which the base substrate 9200 is provided with the bonding layer 9204. Between the base substrate 9200 and the bonding layer 9204, the barrier layer 9205 is preferably provided. The barrier layer 9205 is provided in order to prevent the SOI layer 9202 from being contaminated by diffusion of impurities such as mobile ions like alkali metal or alkaline earth metal from a glass substrate which is used as the base substrate 9200. In addition, the SOI layer 9202 is provided with a silicon oxide film 9221. The silicon oxide film 9221 forms a bond with the bonding layer 9204 to fix the SOI layer 9202 over the base substrate 9200. The silicon oxide film 9221 is preferably formed by thermal oxidation. Alternatively, similarly to the bonding layer 9204, the silicon oxide film 9221 may be formed by a chemical vapor deposition method using TEOS. Further alternatively, as the silicon oxide film 9221, chemical oxide can be used. Chemical oxide can be formed by, for example, performing treatment on a surface of a semiconductor substrate by using ozone-containing water. Chemical oxide is preferable because it reflects flatness of the surface of the semiconductor substrate.

A method for manufacturing such an SOI substrate is described with reference to FIGS. 14A to 15.

Figure 14A:
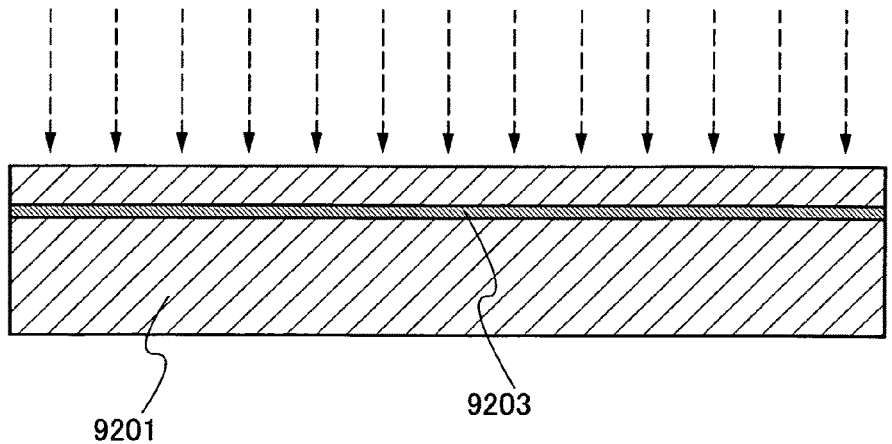
FIGS. 14A to 14C illustrate cross-sectional views of an SOI substrate of the present invention.

A semiconductor substrate 9201 shown in FIG. 14A is cleaned, and ions which are accelerated by an electric field are injected into reach a predetermined depth from the surface of the semiconductor substrate 9201 to form a fragile layer 9203. Irradiation or injection of ions is conducted in consideration of the thickness of an SOI layer which is to be formed over a base substrate. The thickness of the SOI layer is 5 to 500 nm, preferably 10 to 200 nm. Accelerating voltage for injecting ions into the semiconductor substrate 9201 is set in consideration of such a thickness. The fragile layer 9203 is formed by injecting ions of hydrogen, helium, or halogen typified by fluorine. In this case, it is preferable to use one ion or plural ions formed of the same atoms which have different mass. In the case of irradiating hydrogen ions, the hydrogen ions preferably include $H^+$, $H_2^+$, and $H_3^+$ ions with a high percentage of $H_3^+$ ions. With a high percentage of $H_3^+$ ions, irradiation efficiency can be increased and irradiating time can be shortened. With such a structure, separation can be easily performed.

In the case of irradiation with ions at a high dose, the surface of the semiconductor substrate 9201 is roughened in some cases. Therefore, a protective film against irradiation with ions, such as a silicon nitride film, a silicon nitride oxide film, or the like with a thickness of 50 to 200 nm may be provided on a surface with which ions are irradiated.

Figure 14B:
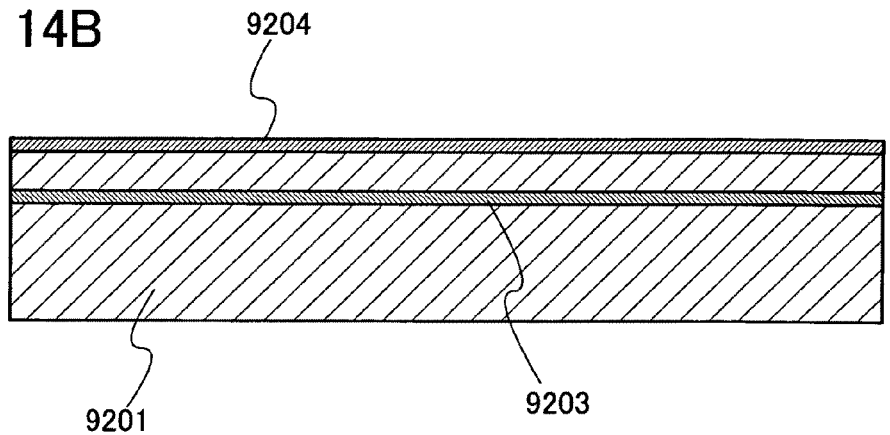

Next, as shown in FIG. 14B, a silicon oxide film is formed over a surface to which the base substrate is bonded as a bonding layer 9204. As the silicon oxide film, a silicon oxide film formed by a chemical vapor deposition method using an organic silane gas as described above is preferably used. Alternatively, a silicon oxide film formed by a chemical vapor deposition method using a silane gas can be used. In film formation by a chemical vapor deposition method, film formation temperature at, for example, 350° C. or lower, at which degassing of the fragile layer 9203 formed in a single-crystal semiconductor substrate does not occur, is used. Heat treatment for separating an SOI layer from a single-crystal or polycrystalline semiconductor substrate is performed at a higher temperature than the film formation temperature.

Figure 14C:
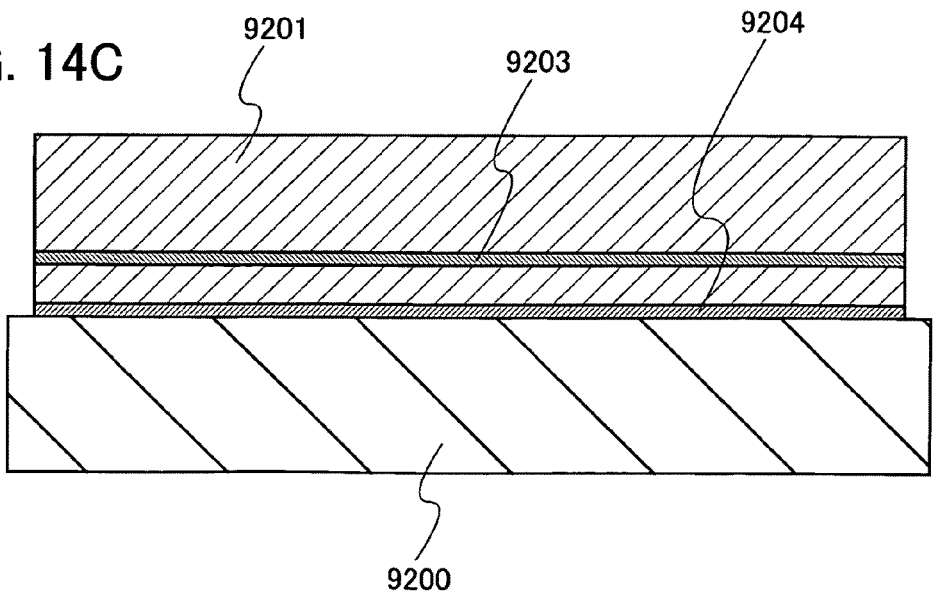

FIG. 14C shows a mode in which a surface of the base substrate 9200 and a surface of the semiconductor substrate 9201, on which the bonding layer 9204 is formed are disposed in contact to be bonded to each other. The surfaces which are to be bonded are cleaned sufficiently. Then, when the base substrate 9200 and the bonding layer 9204 are disposed in contact, a bond is formed. This bond is formed by Van der Waals forces. When the base substrate 9200 and the semiconductor substrate 9201 are pressed against each other, a stronger bond can be formed by hydrogen bonding.

In order to form a favorable bond, the surfaces may be activated. For example, the surfaces which are to form a bond are irradiated with an atomic beam or an ion beam. When an atomic beam or an ion beam is used, an inert gas neutral atom beam or inert gas ion beam of argon or the like can be used. Alternatively, plasma irradiation or radical treatment is performed. With such a surface treatment, a bond between different kinds of materials can be easily formed even at a temperature of 200 to 400° C.

After the base substrate 9200 and the semiconductor substrate 9201 are bonded to each other with the bonding layer 9204 interposed therebetween, heat treatment or pressure treatment is preferably performed. When heat treatment or pressure treatment is performed, bonding strength can be increased. Temperature of heat treatment is preferably lower than or equal to the upper temperature limit of the base substrate 9200. Pressure treatment is performed so that pressure is applied in a perpendicular direction to the bonded surface, in consideration of pressure resistance of the base substrate 9200 and the semiconductor substrate 9201.

Figure 15:
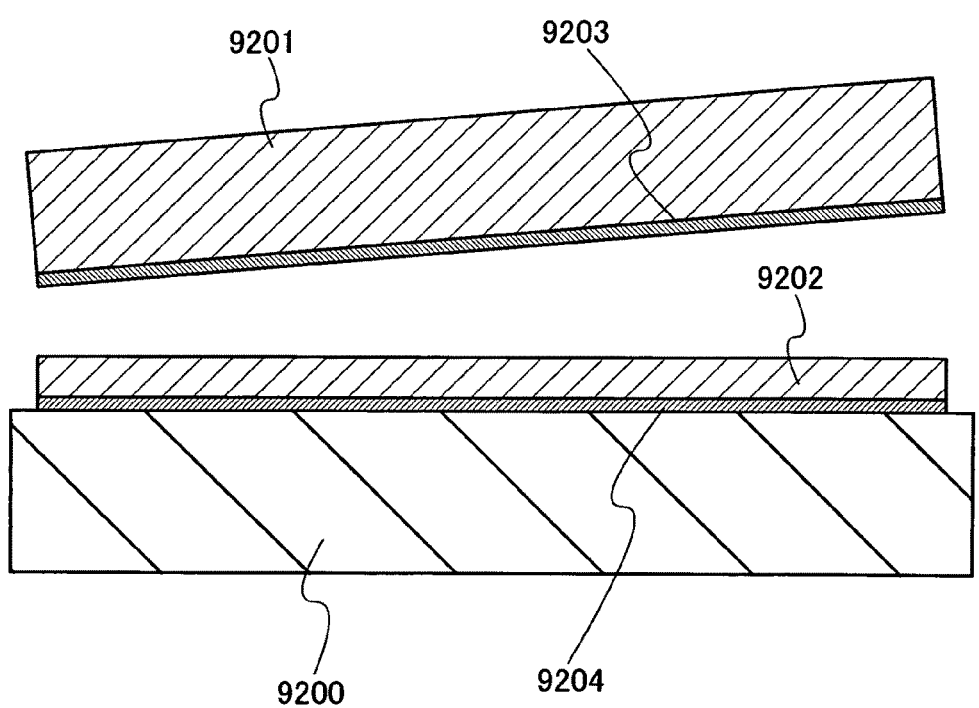
FIG. 15 illustrates a cross-sectional view of an SOI substrate of the present invention.

In FIG. 15, after the base substrate 9200 and the semiconductor substrate 9201 are bonded to each other, heat treatment is performed to separate the semiconductor substrate 9201 at the fragile layer 9203. The heat treatment is preferably performed at a temperature higher than or equal to the film formation temperature of the bonding layer 9204 and lower than or equal to the upper temperature limit of the base substrate 9200. When the heat treatment is performed at, for example, 400 to 600° C., the volume of fine voids formed in the fragile layer 9203 is changed, so that separation (cleavage) can be performed along the fragile layer 9203. Since the bonding layer 9204 is bonded to the base substrate 9200, the SOI layer 9202 having the same crystallinity as the semiconductor substrate 9201 remains over the base substrate 9200.

Figure 16A:
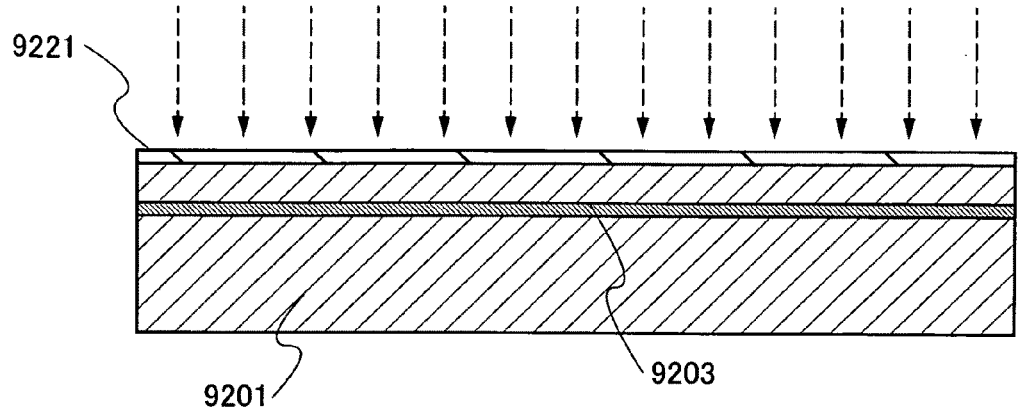
FIGS. 16A to 16C illustrate cross-sectional views of an SOI substrate of the present invention.
Figure 16B:
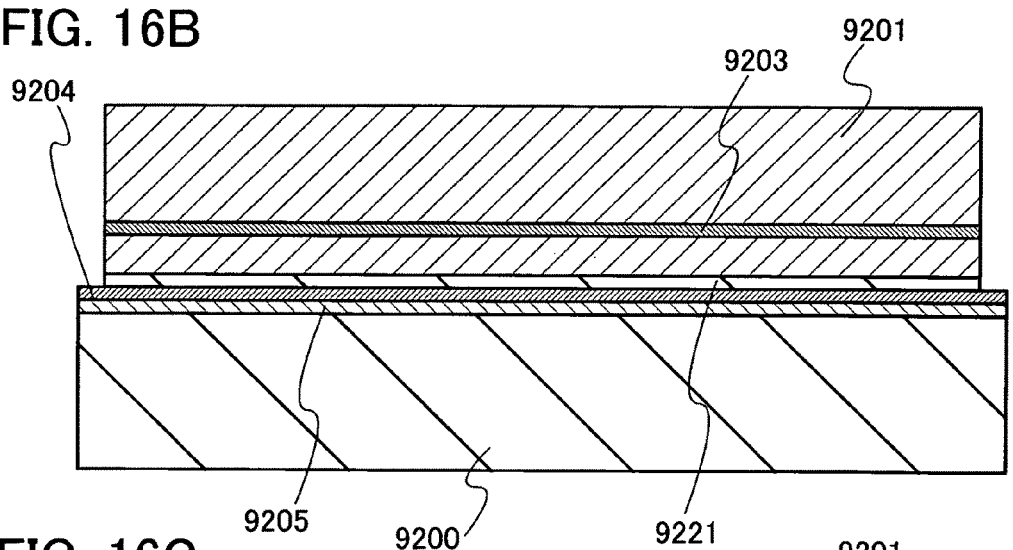
Figure 16C:
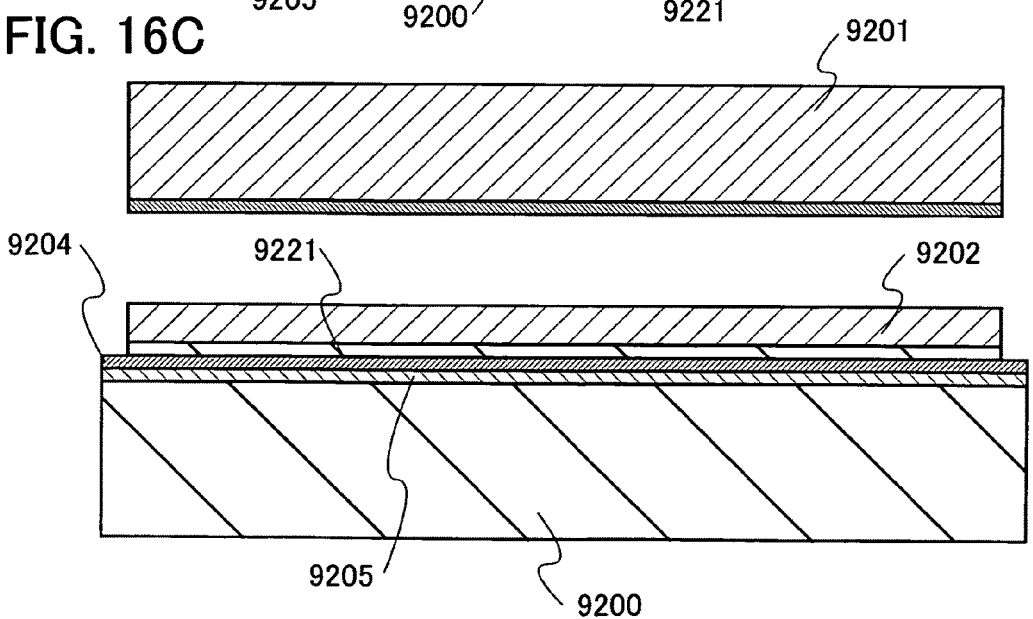

FIG. 16A to 16C show steps of forming an SOI layer with a bonding layer provided on the base substrate 9200 side. FIG. 16A shows a step in which ions which are accelerated by an electric field are injected into the semiconductor substrate 9201 which is provided with the silicon oxide film 9221 at a predetermined depth to form the fragile layer 9203. Injecting of ions of hydrogen, helium, or a halogen typified by fluorine is performed similarly to the case shown in FIG. 14A. When the silicon oxide film 9221 is formed on the surface of the semiconductor substrate 9201, the surface of the semiconductor substrate 9201 can be prevented from being damaged by ion irradiation and from losing its flatness.

FIG. 16B shows a step in which a surface of the base substrate 9200 provided with the barrier layer 9205 and the bonding layer 9204 and the surface of the semiconductor substrate 9201, on which the silicon oxide film 9221 is formed are disposed in contact to be bonded. A bond is formed when the bonding layer 9204 over the base substrate 9200 is disposed in close contact with the silicon oxide film 9221 formed on the semiconductor substrate 9201.

After that, as shown in FIG. 16C, the semiconductor substrate 9201 is separated. Heat treatment for separating the semiconductor substrate 9201 is performed similarly to the case shown in FIG. 15. In this manner, the SOI substrate shown in FIG. 13B can be obtained.

In this manner, in accordance with this mode, even if a substrate with an upper temperature limit of 700° C. or lower, such as a glass substrate or the like, is used as the base substrate 9200, the SOI layer 9202 having strong adhesiveness of a bonded portion can be obtained. As the base substrate 9200, various glass substrates which are used in the electronics industry and are referred to as non-alkali glass substrates, such as aluminosilicate glass substrates, aluminoborosilicate glass substrates, and barium borosilicate glass substrates can be used. That is, a single-crystal semiconductor layer can be formed over a substrate which is longer than one meter on a side. When such a large-area substrate is used, not only a display device such as a liquid crystal display but also a semiconductor integrated circuit can be manufactured.

Note that a manufacturing method and an arrangement method of the semiconductor layer are not limited to this. An amorphous silicon film can be formed over an insulating substrate by a CVD method, or the like, and amorphous silicon film is crystallized by irradiated with laser (linear laser, continuous solid oscillation laser, or the like) or by applying heat or the like, so that polycrystalline silicon or microcrystalline silicon can be manufactured.

Although this embodiment mode is described with reference to various drawings, the contents (or may be part of the contents) described in each drawing can be freely applied to, combined with, or replaced with the contents (or may be part of the contents) described in another drawing. Further, much more drawings can be formed by combining each part in the above-described drawings with another part.

Similarly, the contents (or may be part of the contents) described in each drawing of this embodiment mode can be freely applied to, combined with, or replaced with the contents (or may be part of the contents) described in a drawing in another embodiment mode. Further, much more drawings can be formed by combining each part in the drawings in this embodiment mode with part of another embodiment mode. Note that this embodiment mode has described just examples of embodying, slightly transforming, modifying, improving, describing in detail, or applying the contents (or part of the contents) described in other embodiment modes, an example of related part thereof, or the like. Therefore, the contents described in other embodiment modes can be freely applied to, combined with, or replaced with this embodiment mode.

Embodiment Mode 3

In this embodiment mode, a peripheral portion of a liquid crystal panel is described.

Figure 17:
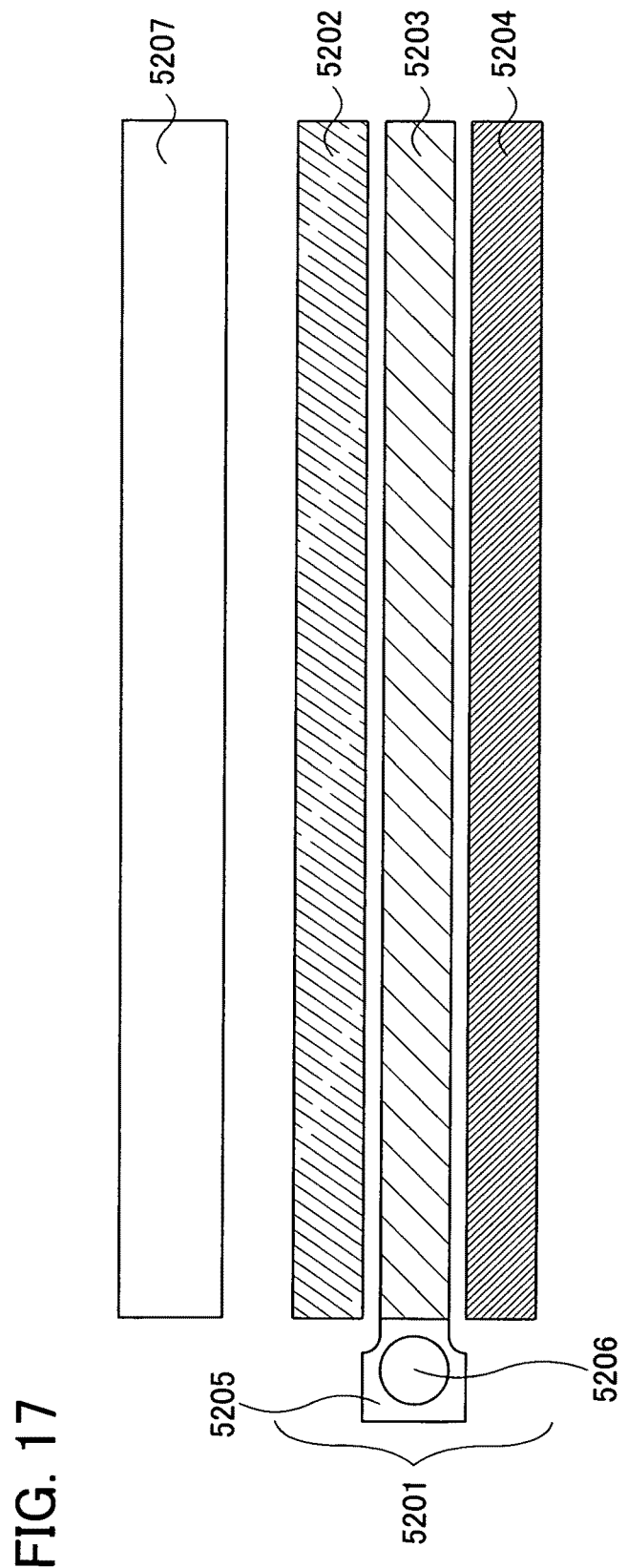
FIG. 17 illustrates a cross-sectional view of a liquid crystal display device of present invention.

FIG. 17 shows an example of a liquid crystal display device including a so-called edge-light type backlight unit 5201 and a liquid crystal panel 5207. An edge-light type corresponds to a type in which a light source is provided at an end of a backlight unit and fluorescence of the light source is emitted from the entire light-emitting surface. The edge-light type backlight unit is thin and can save power.

The backlight unit 5201 includes a diffusion plate 5202, a light guide plate 5203, a reflection plate 5204, a lamp reflector 5205, and a light source 5206.

The light source 5206 has a function of emitting light as necessary. For example, as the light source 5206, a cold cathode fluorescent lamp, a hot cathode fluorescent lamp, a light-emitting diode, an inorganic EL element, an organic EL element, or the like is used.

FIGS. 18A to 18D are views each showing a detailed structure of the edge-light type backlight unit. Note that description of a diffusion plate, a light guide plate, a reflection plate, and the like is omitted.

Figure 18A:
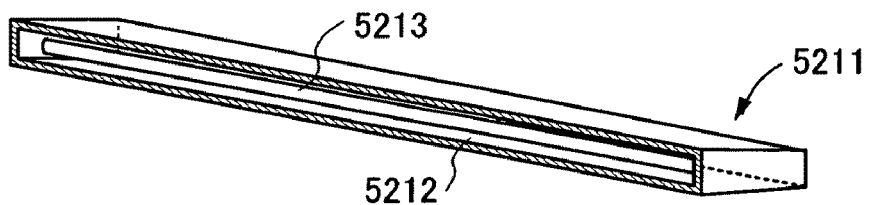
FIGS. 18A to 18D illustrate cross-sectional views of a liquid crystal display device of present invention.

A backlight unit 5211 shown in FIG. 18A has a structure in which a cold cathode fluorescent lamp 5213 is used as a light source. In addition, a lamp reflector 5212 is provided to efficiently reflect light from the cold cathode fluorescent lamp 5213. Such a structure is often used for a large display device because luminance of light obtained from the cold cathode fluorescent lamp is high.

Figure 18B:
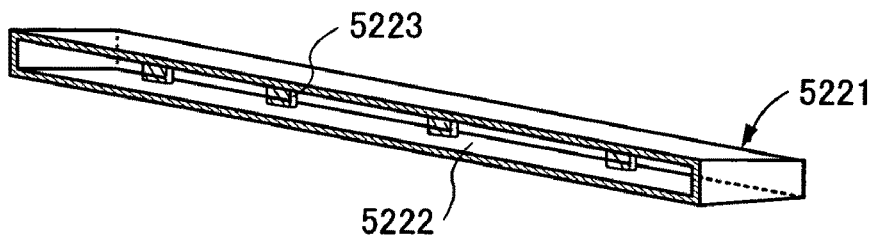

A backlight unit 5221 shown in FIG. 18B has a structure in which light-emitting diodes (LEDs) 5223 are used as light sources. For example, the light-emitting diodes (LEDs) 5223 which emit white light are provided at a predetermined interval. In addition, a lamp reflector 5222 is provided to efficiently reflect light from the light-emitting diodes (LEDs) 5223.

Figure 18C:
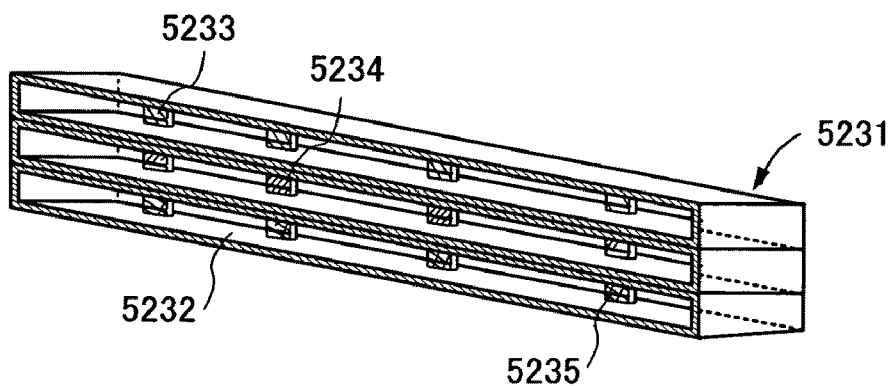

A backlight unit 5231 shown in FIG. 18C has a structure in which light-emitting diodes (LEDs) 5233, light-emitting diodes (LEDs) 5234, and light-emitting diodes (LEDs) 5235 of R, G, and B are used as light sources. The light-emitting diodes (LEDs) 5233, the light-emitting diodes (LEDs) 5234, and the light-emitting diodes (LEDs) 5235 of R, G, and B are each provided at a predetermined interval. By using the light-emitting diodes (LEDs) 5233, the light-emitting diodes (LEDs) 5234, and the light-emitting diodes (LEDs) 5235 of R, G, and B, color reproductivity can be improved. In addition, a lamp reflector 5232 is provided to efficiently reflect light from the light-emitting diodes.

Figure 18D:
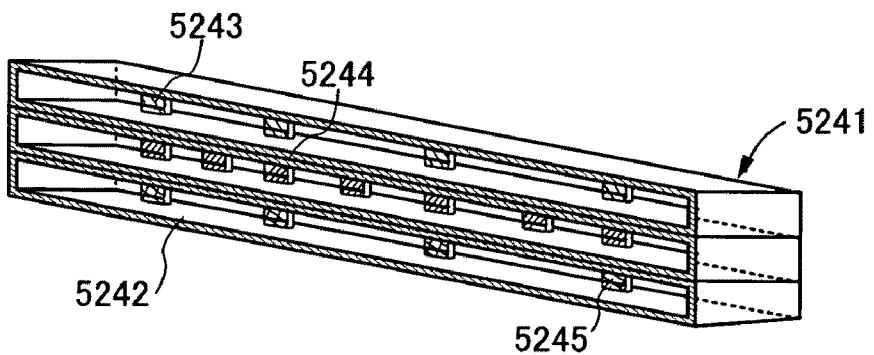

A backlight unit 5241 shown in FIG. 18D has a structure in which light-emitting diodes (LEDs) 5243, light-emitting diodes (LEDs) 5244, and light-emitting diodes (LEDs) 5245 of R, G, and B are used as light sources. For example, among the light-emitting diodes (LEDs) 5243, the light-emitting diodes (LEDs) 5244, and the light-emitting diodes (LEDs) 5245 of R, G, and B, a plurality of the light-emitting diodes of a color with low emission intensity (e.g., green) are provided. By using the light-emitting diodes (LEDs) 5243, the light-emitting diodes (LEDs) 5244, and the light-emitting diodes (LEDs) 5245 of R, G, and B, color reproductivity can be improved. In addition, a lamp reflector 5242 is provided to efficiently reflect light from the light-emitting diodes.

Figure 21:
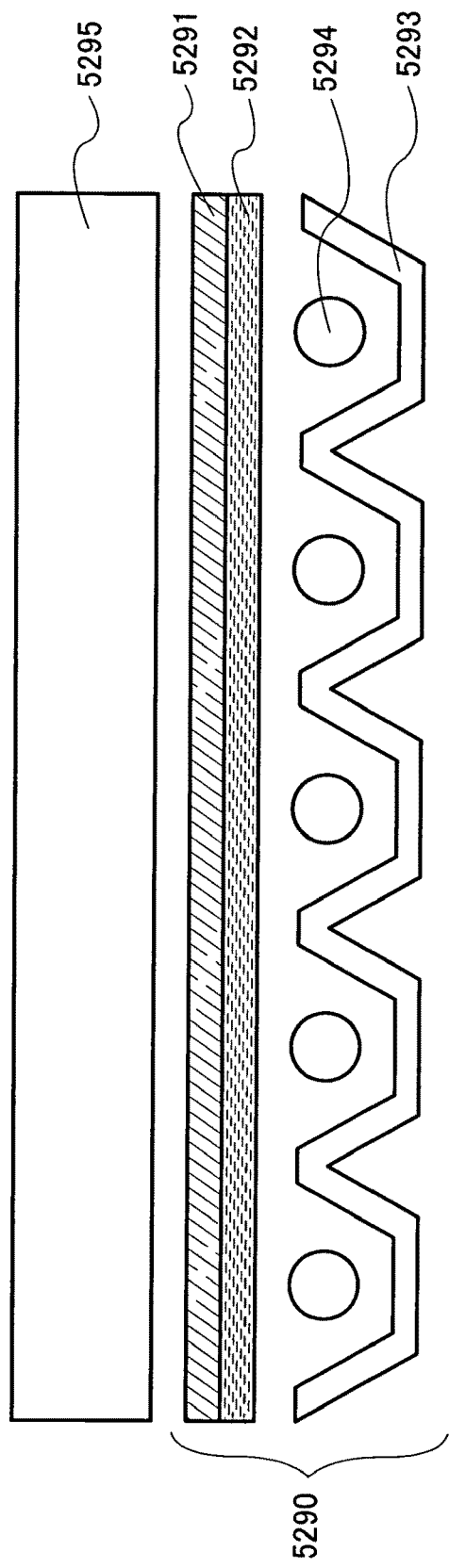
FIG. 21 illustrates a cross-sectional view of a liquid crystal display device of present invention.

FIG. 21 shows an example of a liquid crystal display device including a so-called direct-type backlight unit and a liquid crystal panel. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 5290 includes a diffusion plate 5291, a light-shielding plate 5292, a lamp reflector 5293, a light source 5294, and a liquid crystal panel 5295.

The light source 5294 has a function of emitting light as necessary. For example, as the light source 5294, a cold cathode fluorescent lamp, a hot cathode fluorescent lamp, a light-emitting diode, an inorganic EL element, an organic EL element, or the like is used.

Figure 19:
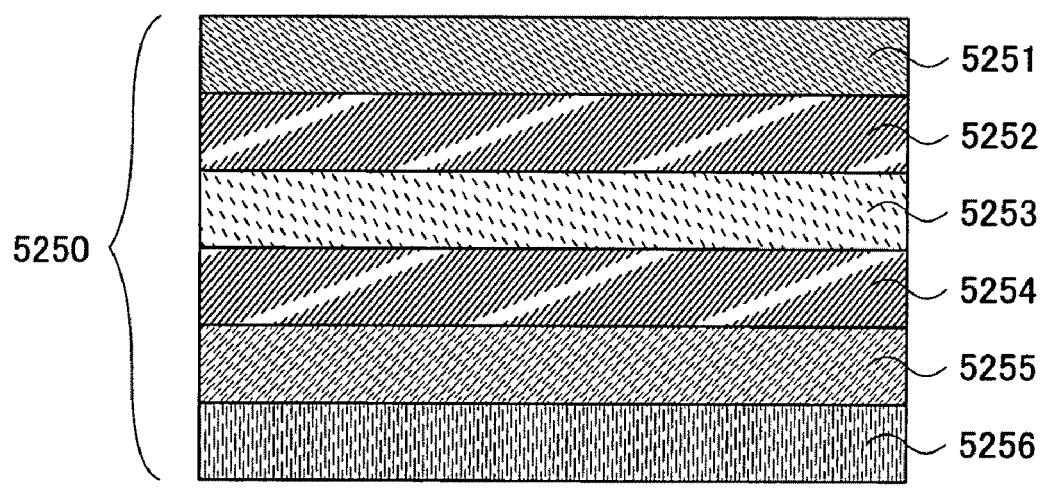
FIG. 19 illustrates a cross-sectional view of a liquid crystal display device of present invention.

FIG. 19 shows an example of a structure of a polarizing plate (also referred to as a polarizing film).

A polarizing film 5250 includes a protective film 5251, a substrate film 5252, a PVA polarizing film 5253, a substrate film 5254, an adhesive layer 5255, and a mold release film 5256.

When the PVA polarizing film 5253 is sandwiched by films to be base materials (the substrate film 5252 and the substrate film 5254) from both sides, reliability can be improved. Note that the PVA polarizing film 5253 may be sandwiched by triacetylcellulose (TAC) films with high light-transmitting properties and high durability. Note that each of the substrate films and the TAC films function as protective films of polarizer included in the PVA polarizing film 5253.

One of the substrate films (the substrate film 5254) is provided with the adhesive layer 5255 which is to be attached to a glass substrate of the liquid crystal panel. Note that the adhesive layer 5255 is formed by applying an adhesive to one of the substrate films (the substrate film 5254). The mold release film 5256 (a separate film) is provided to the adhesive layer 5255.

The protective film 5251 is provided to the other of the substrates films (the substrate film 5252).

A hard coating scattering layer (an anti-glare layer) may be provided on a surface of the polarizing film 5250. Since the surface of the hard coating scattering layer has minute unevenness formed by AG treatment and has an anti-glare function which scatters external light, reflection of external light in the liquid crystal panel can be prevented. Surface reflection can also be prevented.

Note that a treatment in which plurality of optical thin film layers having different refractive indexes are layered (also referred to as anti-reflection treatment or AR treatment) may be performed on the surface of the polarizing film 5250. The plurality of layered optical thin film layers having different refractive indexes can reduce reflectivity on the surface by an interference effect of light.

Figure 20A:
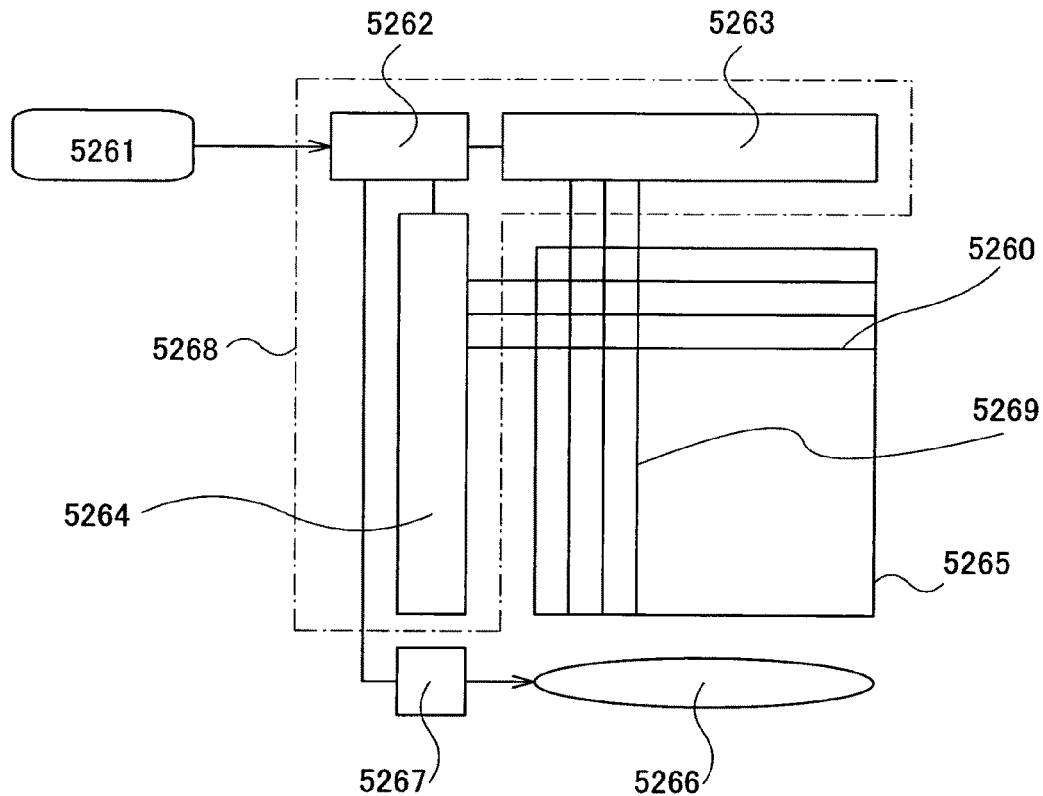
FIGS. 20A to 20C illustrate a structure of a liquid crystal display device of present invention.
Figure 20B:
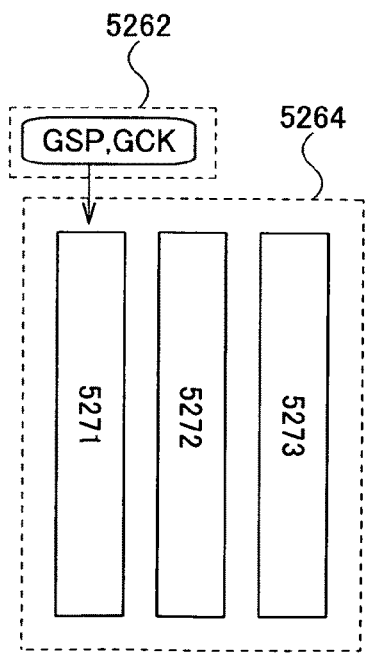
Figure 20C:
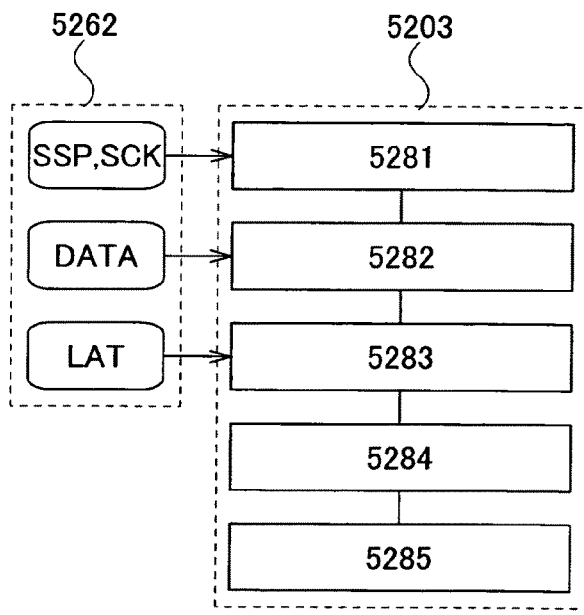

FIGS. 20A to 20C each show an example of a system block of the liquid crystal display device.

In a pixel portion 5265, signal lines 5269 which are extended from a signal line driver circuit 5263 are provided. In addition, in the pixel portion 5265, scan lines 5260 which are extended from a scan line driver circuit 5264 are also provided. In addition, a plurality of pixels are arranged in matrix in cross regions of the signal lines 5269 and the scan lines 5260. Note that each of the plurality of pixels includes a switching element. Therefore, voltage for controlling inclination of liquid crystal molecules can be separately input to each of the plurality of pixels. A structure in which a switching element is provided in each cross region in this manner is referred to as an active matrix type. Note that the present invention is not limited to such an active matrix type and a structure of a passive matrix type may be used. Since the passive matrix type does not have a switching element in each pixel, a process is simple.

A driver circuit portion 5268 includes a control circuit 5262, the signal line driver circuit 5263, and the scan line driver circuit 5264. An image signal 5261 is input to the control circuit 5262. The signal line driver circuit 5263 and the scan line driver circuit 5264 are controlled by the control circuit 5262 in accordance with this image signal 5261. Therefore, the control circuit 5262 inputs a control signal to each of the signal line driver circuit 5263 and the scan line driver circuit 5264. Then, in accordance with this control signal, the signal line driver circuit 5263 inputs a video signal to each of the signal lines 5269 and the scan line driver circuit 5264 inputs a scan signal to each of the scan lines 5260. Then, the switching element included in the pixel is selected in accordance with the scan signal and the video signal is input to a pixel electrode of the pixel.

Note that the control circuit 5262 also controls a power source 5267 in accordance with the image signal 5261. The power source 5267 includes a unit for supplying power to a lighting unit 5266. As the lighting unit 5266, an edge-light type backlight unit or a direct-type backlight unit can be used. Note that a front light may be used as the lighting unit 5266. A front light corresponds to a plate-like lighting unit including a luminous body and a light conducting body, which is attached to the front surface side of a pixel portion and illuminates the whole area. By using such a lighting unit, the pixel portion can be uniformly illuminated at low power consumption.

As shown in FIG. 20B, the scan line driver circuit 5264 includes a shift register 5271, a level shifter 5272, and a circuit functioning as a buffer 5273. A signal such as a gate start pulse (GSP) or a gate clock signal (GCK) is input to the shift register 5271.

As shown in FIG. 20C, the signal line driver circuit 5263 includes a shift register 5281, a first latch 5282, a second latch 5283, a level shifter 5284, and a circuit functioning as a buffer 5285. The circuit functioning as the buffer 5285 corresponds to a circuit which has a function of amplifying a weak signal and includes an operational amplifier or the like. A signal such as a source start pulse (SSP) or the like is input to the level shifter 5284 and data (DATA) such as a video signal is input to the first latch 5282. A latch (LAT) signal can be temporally held in the second latch 5283 and are simultaneously input to the pixel portion 5265. This is referred to as line sequential driving. Therefore, when a pixel is used in which not line sequential driving but dot sequential driving is performed, the second latch can be omitted.

Note that in this embodiment mode, various liquid crystal panels can be used for the liquid crystal panel. For example, a structure in which a liquid crystal layer is sealed between two substrates can be used as the liquid crystal panel. A transistor, a capacitor, a pixel electrode, an alignment film, or the like is formed over one of the substrates. A polarizing plate, a retardation plate, or a prism sheet may be provided on the surface opposite to a top surface of the one of the substrates. A color filter, a black matrix, a counter electrode, an alignment film, or the like is provided on the other of the substrates. A polarizing plate or a retardation plate may be provided on the surface opposite to a top surface of the other of the substrates. The color filter and the black matrix may be formed over the top surface of the one of the substrates. Note that three-dimensional display can be performed by providing a slit (a grid) on the top surface side of the one of the substrates or the surface opposite to the top surface side of the one of the substrates.

Each of the polarizing plate, the retardation plate, and the prism sheet can be provided between the two substrates. Alternatively, each of the polarizing plate, the retardation plate, and the prism sheet can be integrated with one of the two substrates.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

This embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 4

In this embodiment mode, a pixel structure and an operation of a pixel which can be applied to a liquid crystal display device are described.

In this embodiment mode, as an operation mode of a liquid crystal element, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Figure 22A:
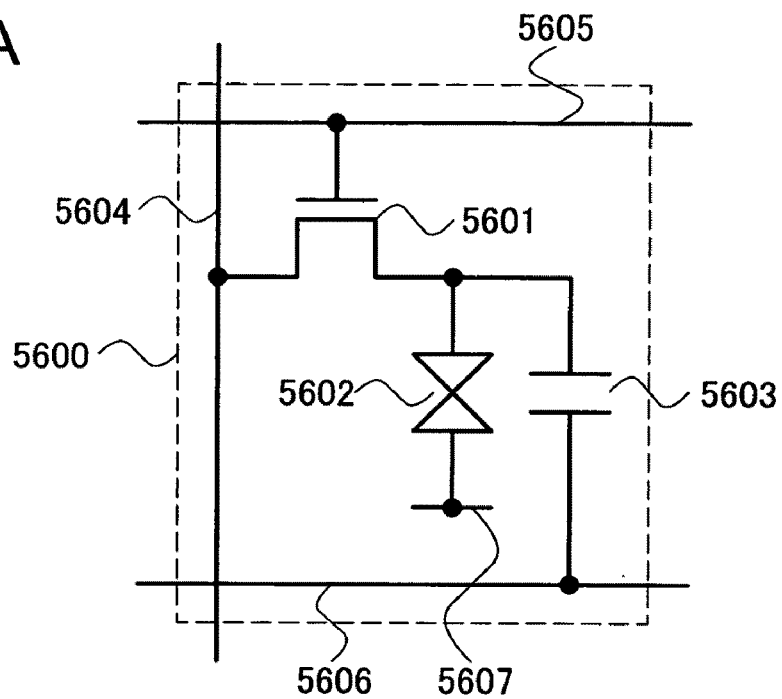
FIGS. 22A and 22B illustrate circuit diagrams of a pixel of the present invention.

FIG. 22A shows an example of a pixel structure which can be applied to the liquid crystal display device.

A pixel 5600 includes a transistor 5601, a liquid crystal element 5602, and a capacitor 5603. A gate of the transistor 5601 is connected to a wiring 5605. A first terminal of the transistor 5601 is connected to a wiring 5604. A second electrode of the transistor 5601 is connected to a first electrode of the liquid crystal element 5602 and a first electrode of the capacitor 5603. A second electrode of the liquid crystal element 5602 corresponds to a counter electrode 5607. A second electrode of the capacitor 5603 is connected to a wiring 5606.

The wiring 5604 functions as a signal line. The wiring 5605 functions as a scan line. The wiring 5606 functions as a capacitor line. The transistor 5601 functions as a switch. The capacitor 5603 functions as a storage capacitor.

It is acceptable as long as the transistor 5601 functions as a switch, and the transistor 5601 may be either a P-channel transistor or an N-channel transistor.

Figure 22B:
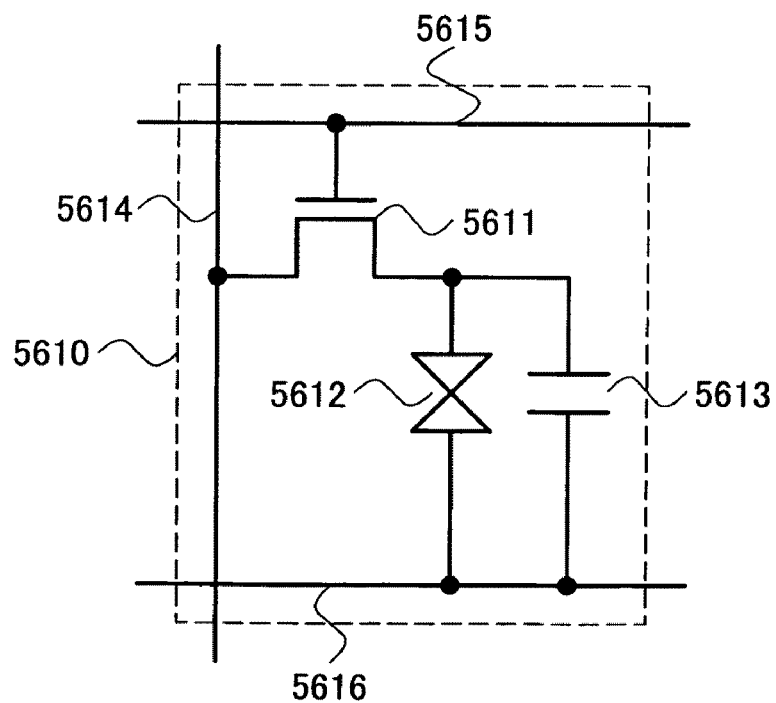

FIG. 22B shows an example of a pixel structure which can be applied to the liquid crystal display device. In particular, FIG. 22B shows an example of a pixel structure which can be applied to a liquid crystal display device suitable for a horizontal electric field mode (including an IPS mode and an FFS mode).

A pixel 5610 includes a transistor 5611, a liquid crystal element 5612, and a capacitor 5613. A gate of the transistor 5611 is connected to a wiring 5615. A first terminal of the transistor 5611 is connected to a wiring 5614. A second terminal of the transistor 5611 is connected to a first electrode of the liquid crystal element 5612 and a first electrode of the capacitor 5613. A second electrode of the liquid crystal element 5612 is connected to a wiring 5616. A second electrode of the capacitor 5613 is connected to the wiring 5616.

The wiring 5614 functions as a signal line. The wiring 5615 functions as a scan line. The wiring 5616 functions as a capacitor line. The transistor 5611 functions as a switch. The capacitor 5613 functions as a storage capacitor.

It is acceptable as long as the transistor 5611 functions as a switch, and the transistor 5611 may be a P-channel transistor or an N-channel transistor.

Figure 23:
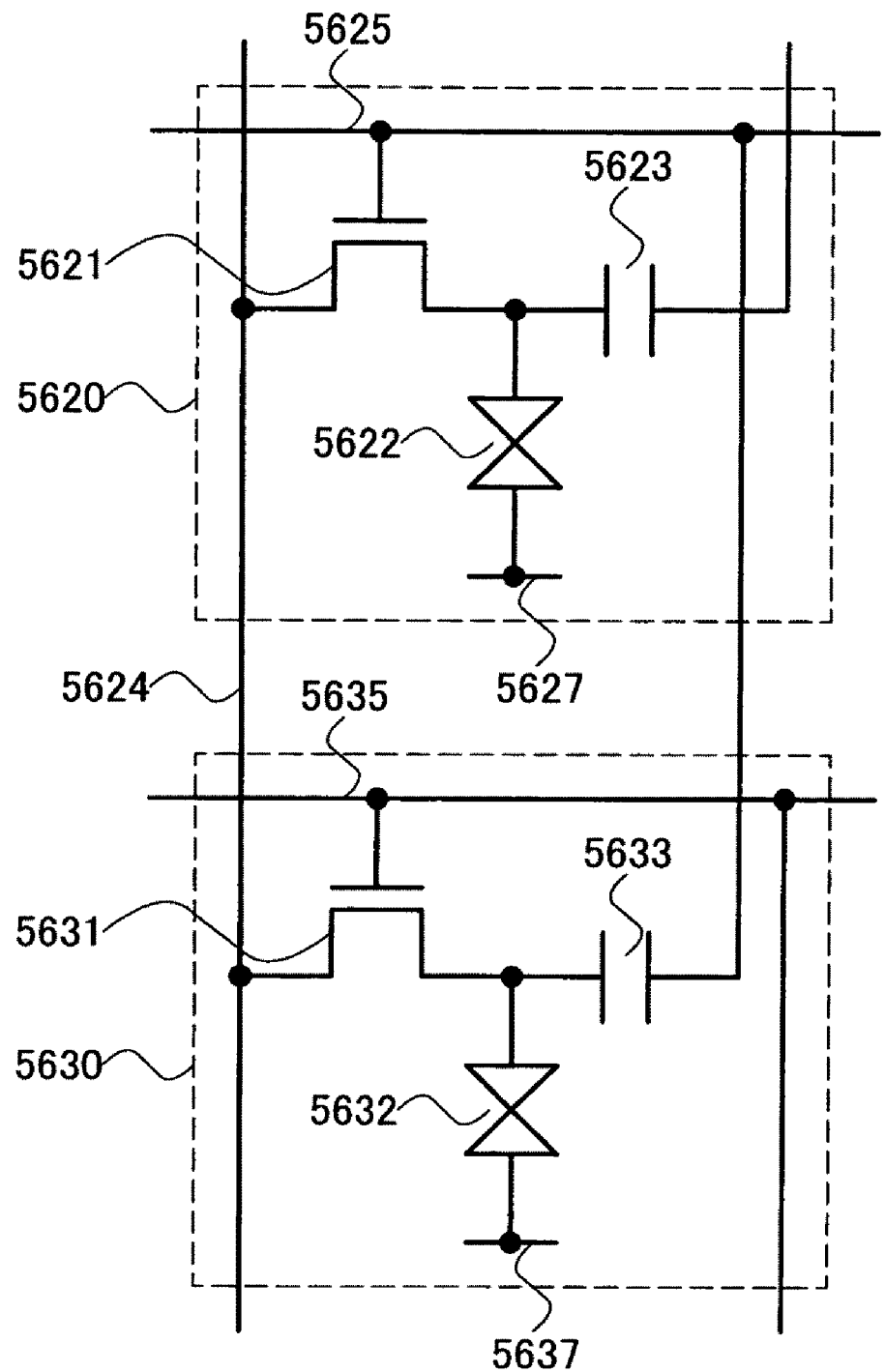
FIG. 23 illustrates a circuit diagram of pixels of the present invention.

FIG. 23 shows an example of a pixel structure which can be applied to the liquid crystal display device. In particular, FIG. 23 shows an example of a pixel structure in which an aperture ratio of a pixel can be increased by reducing the number of wirings.

FIG. 23 shows two pixels which are provided in the same column direction (a pixel 5620 and a pixel 5630). For example, when the pixel 5620 is provided in an N-th row, the pixel 5630 is provided in an (N+1)th row.

A pixel 5620 includes a transistor 5621, a liquid crystal element 5622, and a capacitor 5623. A gate of the transistor 5621 is connected to a wiring 5625. A first terminal of the transistor 5621 is connected to a wiring 5624. A second terminal of the transistor 5621 is connected to a first electrode of the liquid crystal element 5622 and a first electrode of the capacitor 5623. A second electrode of the liquid crystal element 5622 corresponds to a counter electrode 5627. A second electrode of the capacitor 5623 is connected to a wiring which is the same as a wiring connected to a gate of a transistor of the previous row.

A pixel 5630 includes a transistor 5631, a liquid crystal element 5632, and a capacitor 5633. A gate of the transistor 5631 is connected to a wiring 5635. A first terminal of the transistor 5631 is connected to the wiring 5624. A second terminal of the transistor 5631 is connected to a first electrode of the liquid crystal element 5632 and a first electrode of the capacitor 5633. A second electrode of the liquid crystal element 5632 corresponds to a counter electrode 5637. A second electrode of the capacitor 5633 is connected to the wiring which is the same as the wiring connected to the gate of the transistor of the previous row (the wiring 5625).

The wiring 5624 functions as a signal line. The wiring 5625 functions as a scan line of the N-th row. The wiring 5625 also functions as a scan line of the (N+1)th row. The transistor 5621 functions as a switch. The capacitor 5623 functions as a storage capacitor.

The wiring 5635 functions as a scan line of the (N+1)th row. The wiring 5635 also functions as a scan line of the (N+2)th row. The transistor 5631 functions as a switch. The capacitor 5633 functions as a storage capacitor.

It is acceptable as long as each of the transistor 5621 and the transistor 5631 functions as a switch, and each of the transistor 5621 and the transistor 5631 may be either a P-channel transistor or an N-channel transistor.

Figure 24:
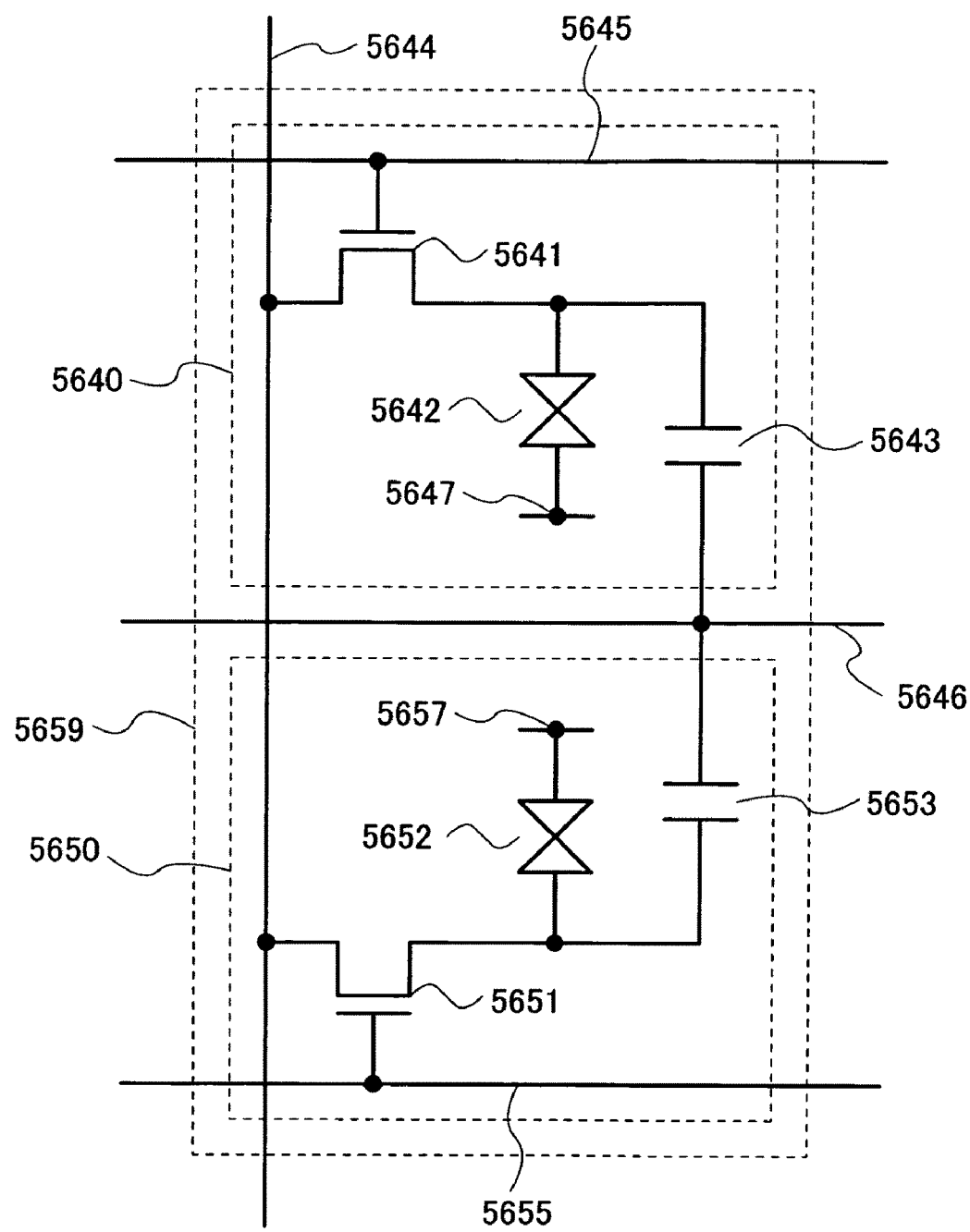
FIG. 24 illustrates a circuit diagram of pixels of the present invention.

FIG. 24 shows an example of a pixel structure which can be applied to the liquid crystal display device. In particular, FIG. 24 shows an example of a pixel structure in which a viewing angle can be improved by using a subpixel.

A pixel 5659 includes a subpixel 5640 and a subpixel 5650. Although the case in which the pixel 5659 includes two subpixels is described, the pixel 5659 may include three or more subpixels.

The subpixel 5640 includes a transistor 5641, a liquid crystal element 5642, and a capacitor 5643. A gate of the transistor 5641 is connected to a wiring 5645. A first terminal of the transistor 5641 is connected to a wiring 5644. A second terminal of the transistor 5641 is connected to a first electrode of the liquid crystal element 5642 and a first electrode of the capacitor 5643. A second electrode of the liquid crystal element 5642 corresponds to a counter electrode 5647. A second electrode of the capacitor 5643 is connected to a wiring 5646.

The subpixel 5650 includes a transistor 5651, a liquid crystal element 5652, and a capacitor 5653. A gate of the transistor 5651 is connected to a wiring 5655. A first terminal of the transistor 5651 is connected to the wiring 5644. A second terminal of the transistor 5651 is connected to a first electrode of the liquid crystal element 5652 and a first electrode of the capacitor 5653. A second electrode of the liquid crystal element 5652 corresponds to a counter electrode 5657. A second electrode of the capacitor 5653 is connected to a wiring 5646.

The wiring 5644 functions as a signal line. The wiring 5645 functions as a scan line. The wiring 5655 functions as a signal line. The wiring 5646 functions as a capacitor line. Each of the transistor 5641 and the transistor 5651 functions as a switch. Each of the capacitor 5643 and the capacitor 5653 functions as a storage capacitor.

It is acceptable as long as each of the transistor 5641 and the transistor 5651 functions as a switch, and each of the transistor 5641 and the transistor 5651 may be either a P-channel transistor or an N-channel transistor.

A video signal input to the subpixel 5640 may be a value which is different from that of a video signal input to the subpixel 5650. In this case, the viewing angle can be widened because alignment of liquid crystal molecules of the liquid crystal element 5642 and alignment of liquid crystal molecules of the liquid crystal element 5652 can be varied from each other.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

This embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 5

In this embodiment mode, a pixel structure of a display device is described. In particular, a pixel structure of a display device using an organic EL element is described.

Figure 25A:
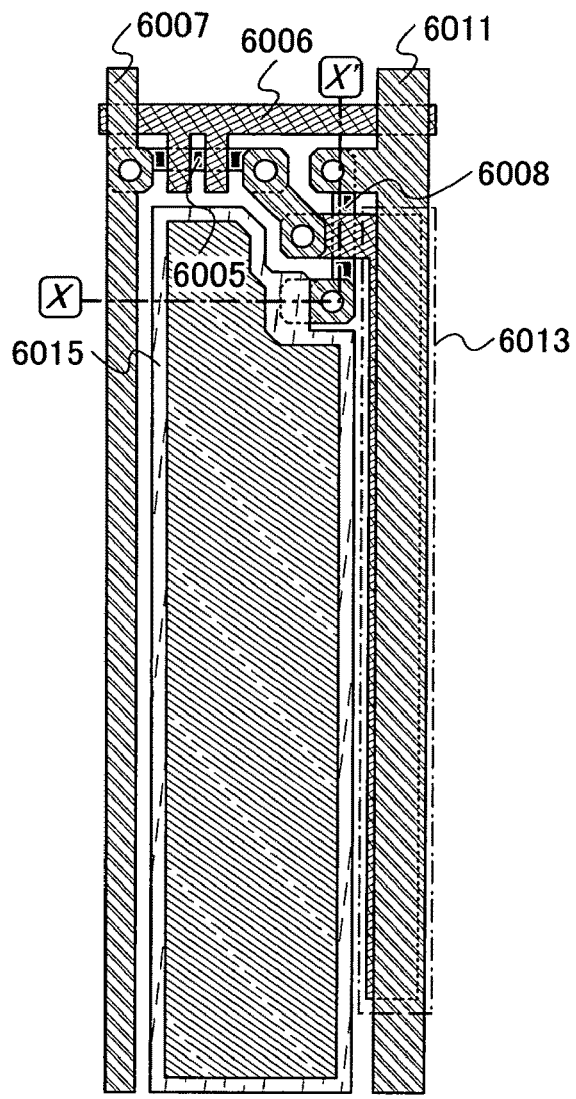
FIGS. 25A and 25B illustrate a top view and a cross-sectional view of a pixel of the present invention.
Figure 25B:
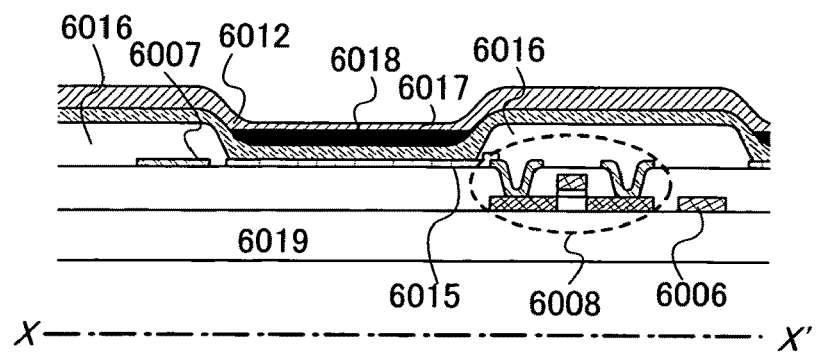

FIG. 25A shows an example of a top view (a layout diagram) of a pixel including two transistors. FIG. 25B shows an example of a cross-sectional view along X-X' in FIG. 25A.

FIG. 25A shows a first transistor 6005, a first wiring 6006, a second wiring 6007, a second transistor 6008, a third wiring 6011, a counter electrode 6012, a capacitor 6013, a pixel electrode 6015, a partition wall 6016, an organic conductive film 6017, an organic thin film 6018, and a substrate 6019. Note that it is preferable that the first transistor 6005 be used as a switching transistor, the first wiring 6006 as a gate signal line, the second wiring 6007 as a source signal line, the second transistor 6008 as a driving transistor, and the third wiring 6011 as a current supply line.

A gate electrode of the first transistor 6005 is electrically connected to the first wiring 6006. One of a source electrode and a drain electrode of the first transistor 6005 is electrically connected to the second wiring 6007. The other of the source electrode and the drain electrode of the first transistor 6005 is electrically connected to a gate electrode of the second transistor 6008 and one electrode of the capacitor 6013. Note that the gate electrode of the first transistor 6005 includes a plurality of gate electrodes. Accordingly, leakage current in the off state of the first transistor 6005 can be reduced.

One of a source electrode and a drain electrode of the second transistor 6008 is electrically connected to the third wiring 6011, and the other of the source electrode and the drain electrode of the second transistor 6008 is electrically connected to the pixel electrode 6015. Accordingly, current flowing to the pixel electrode 6015 can be controlled by the second transistor 6008.

The organic conductive film 6017 is provided over the pixel electrode 6015, and the organic thin film 6018 (an organic compound layer) is provided thereover. The counter electrode 6012 is provided over the organic thin film 6018 (the organic compound layer). Note that the counter electrode 6012 may be formed over the entire surface to be connected to all the pixels in common, or may be patterned using a shadow mask or the like.

Light emitted from the organic thin film 6018 (the organic compound layer) is transmitted through either the pixel electrode 6015 or the counter electrode 6012.

In FIG. 25B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 6015 be formed of a light-transmitting conductive film. On the other hand, in the case of top emission, it is preferable that the counter electrode 6012 be formed of a light-transmitting conductive film.

In a light-emitting device for color display, EL elements having respective light emission colors of RGB may be separately formed, or an EL element with a single color may be applied over an entire surface and light emission of RGB can be obtained by using a color filter.

Note that the structures shown in FIGS. 25A and 25B are examples, and various structures can be employed for a pixel layout, a cross-sectional structure, a stacking order of electrodes of an EL element, and the like, other than the structures shown in FIGS. 25A and 25B. Further, as a light-emitting layer, various elements such as a crystalline element such as an LED, and an element formed of an inorganic thin film can be used as well as the element formed of the organic thin film shown in the drawing.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

This embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 6

In this embodiment mode, examples of electronic devices are described.

Figure 26:
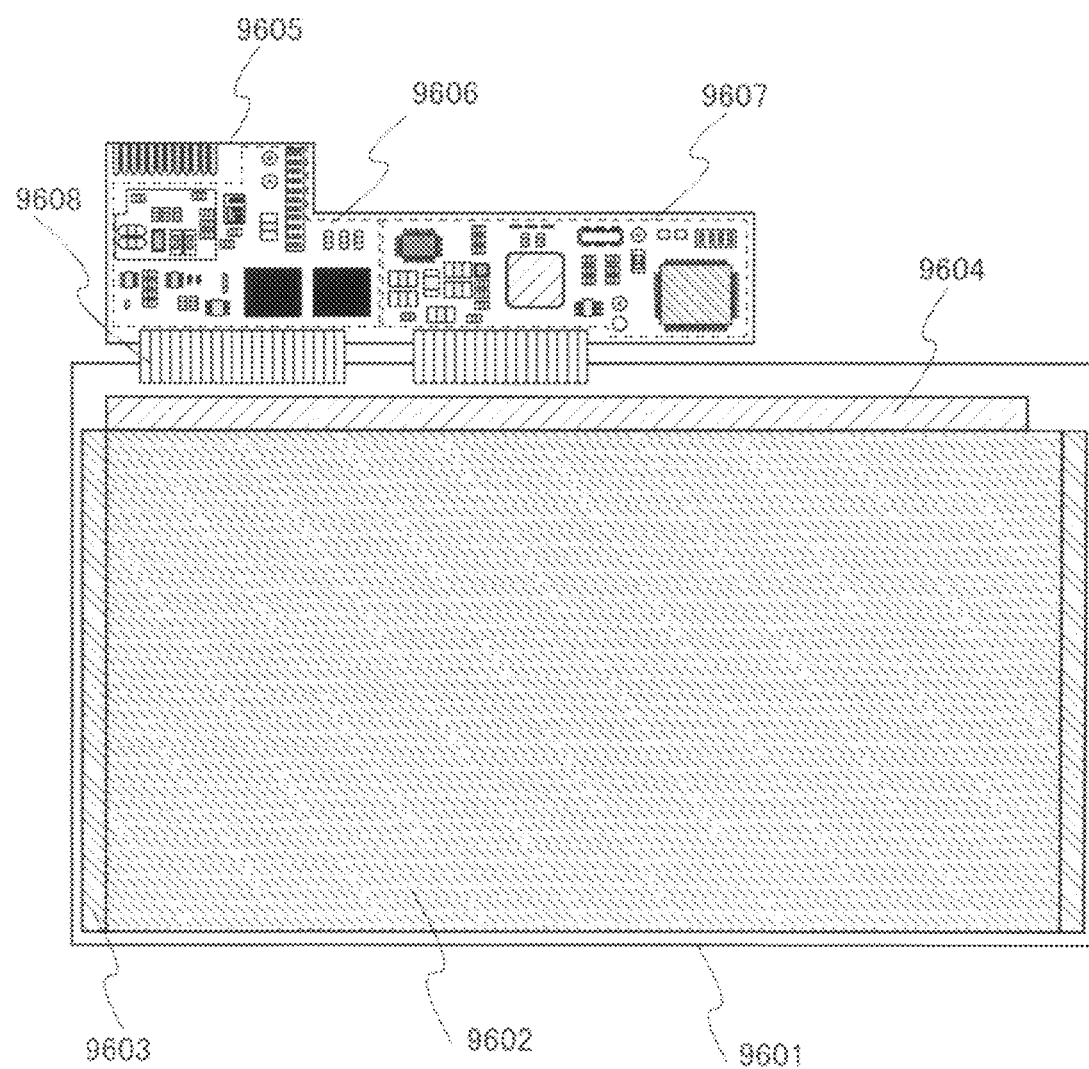
FIG. 26 illustrates an electronic device of the present invention.

FIG. 26 shows a display panel module in which a display panel 9601 and a circuit board 9605 are combined. The display panel 9601 includes a pixel portion 9602, a scan line driver circuit 9603, and a signal line driver circuit 9604. The circuit board 9605 is provided with a control circuit 9606, a signal dividing circuit 9607, and the like, for example. The display panel 9601 and the circuit board 9605 are connected by a connection wiring 9608. As the connection wiring, an FPC or the like can be used.

Figure 27:
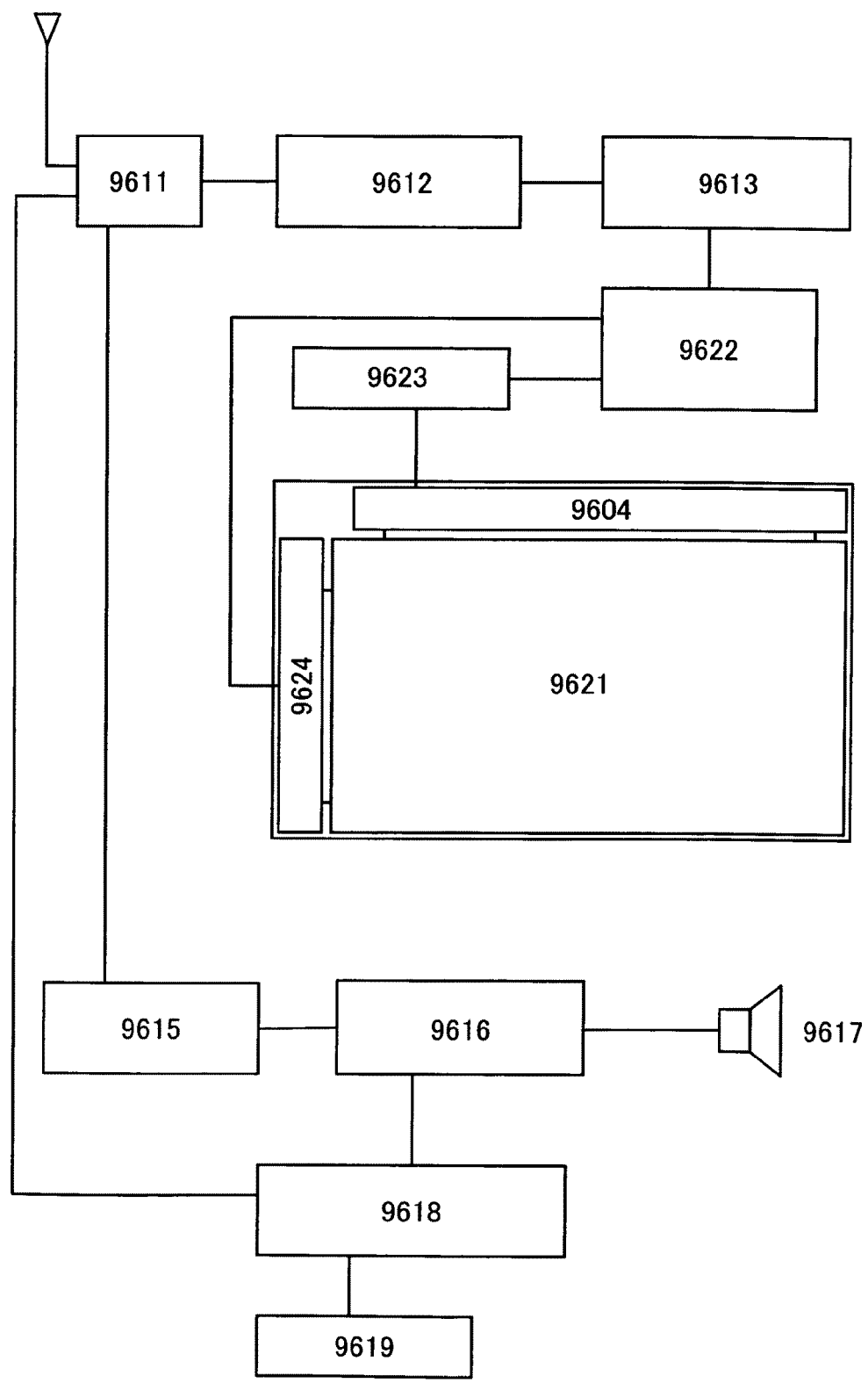
FIG. 27 illustrates an electronic device of the present invention.

FIG. 27 is a block diagram showing a main structure of a television receiver. A tuner 9611 receives a video signal and an audio signal. The video signal is processed by a video signal amplifier circuit 9612, a video signal processing circuit 9613 for converting a signal output from the video signal amplifier circuit 9612 into a color signal corresponding to each color of red, green, and blue, and a control circuit 9622 for converting the video signal into a signal which meets input specifications of a driver circuit. The control circuit 9622 outputs signals to a scan line driver circuit 9624 and a signal line driver circuit 9614. The scan line driver circuit 9624 and the signal line driver circuit 9614 drive a display panel 9621. In the case of digital driving, a structure may be used in which a signal dividing circuit 9623 is provided on the signal line side and an input digital signal is divided into m (m is a positive integer) pieces to be supplied.

Among the signals received by the tuner 9611, the audio signal is transmitted to an audio signal amplifier circuit 9615, and output thereof is supplied to a speaker 9617 through an audio signal processing circuit 9616. A control circuit 9618 receives control information on a receiving station (reception frequency) and sound volume from an input portion 9619, and transmits a signal to the tuner 9611 or the audio signal processing circuit 9616.

Figure 28A:
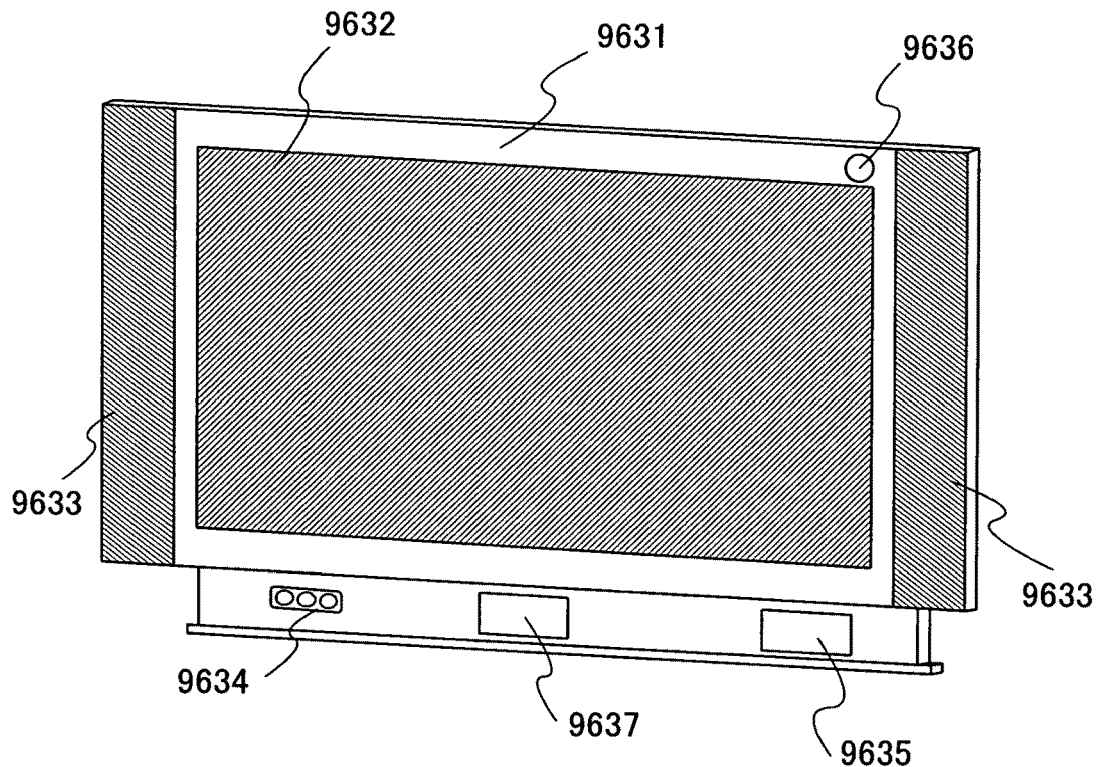
FIGS. 28A and 28B illustrate electronic devices of the present invention.

FIG. 28A shows a television receiver incorporated with a display panel module which is different from that of FIG. 27. In FIG. 28A, a display screen 9632 stored in a housing 9631 is formed using the display panel module. Note that speakers 9633, input means (an operation key 9634, a connection terminal 9635, a sensor 9636 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9637), and the like may be provided as appropriate.

Figure 28B:
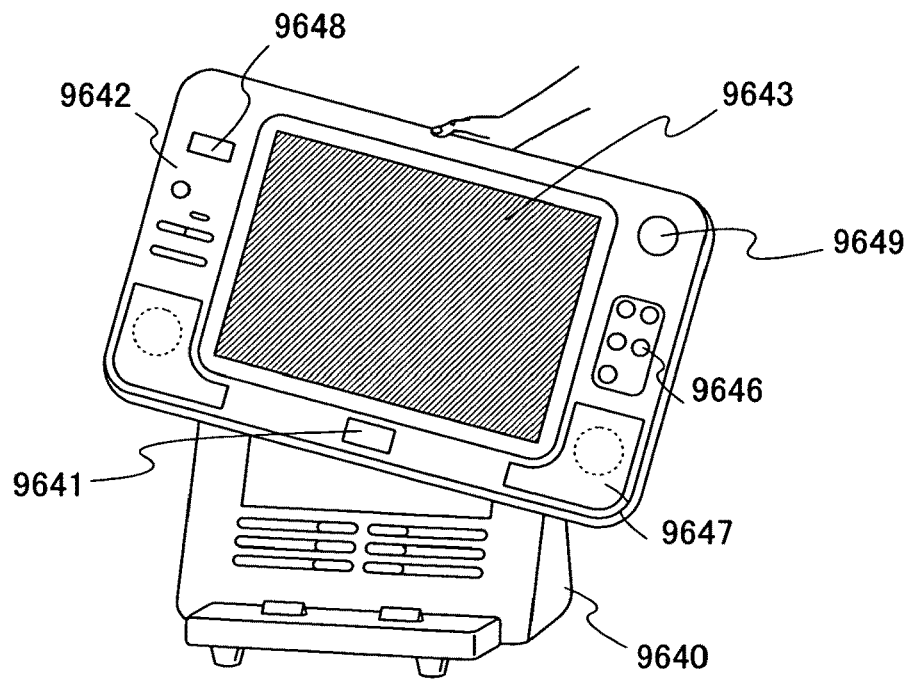

FIG. 28B shows a television receiver, only a display of which can be carried wirelessly. The television receiver is provided with a display portion 9643, a speaker portion 9647, input means (an operation key 9646, a connection terminal 9648, a sensor 9649 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9641), and the like as appropriate. A battery and a signal receiver are incorporated in a housing 9642. The battery drives the display portion 9643, the speaker portion 9647, the sensor 9649, and the microphone 9641. The battery can be repeatedly charged by a charger 9640. The charger 9640 can transmit and receive a video signal and transmit the video signal to the signal receiver of the display. The device in FIG. 28B is controlled by the operation key 9646. Alternatively, the device in FIG. 28B can transmit a signal to the charger 9640 by operating the operation key 9646. That is, the device may be a video-audio two-way communication device. Further alternatively, by operating the operation key 9646, the device in FIG. 28B may transmit a signal to the charger 9640, and another electronic device is made to receive a signal which can be transmitted from the charger 9640; thus, the device in FIG. 28B can control communication of another electronic device. That is, the device may be a general-purpose remote control device. Note that the contents (or part thereof) described in each drawing of this embodiment mode can be applied to the display portion 9643.

Next, a structural example of a mobile phone is described with reference to FIG. 29.

A display panel 9662 is detachably incorporated in a housing 9650. The shape and size of the housing 9650 can be changed as appropriate in accordance with the size of the display panel 9662. The housing 9650 which fixes the display panel 9662 is fitted in a printed wiring board 9651 to be assembled as a module.

The display panel 9662 is connected to the printed wiring board 9651 through an FPC 9663. The printed wiring board 9651 is provided with a speaker 9652, a microphone 9653, a transmitting/receiving circuit 9654, a signal processing circuit 9655 including a CPU, a controller, and the like, and a sensor 9661 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray). Such a module, an operation key 9656, a battery 9657, and an antenna 9660 are combined and stored in a housing 9659. A pixel portion of the display panel 9662 is provided to be viewed from an opening window formed in the housing 9659.

In the display panel 9662, the pixel portion and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 9662 by COG (Chip On Glass). Alternatively, the IC chip may be connected to a glass substrate by using TAB (Tape Automated Bonding) or a printed wiring board. By employing such a structure, the power consumption of a display device can be reduced, and a portable phone device can be used for a longer period per charge. Cost reduction of the mobile phone can be achieved.

Figure 29:
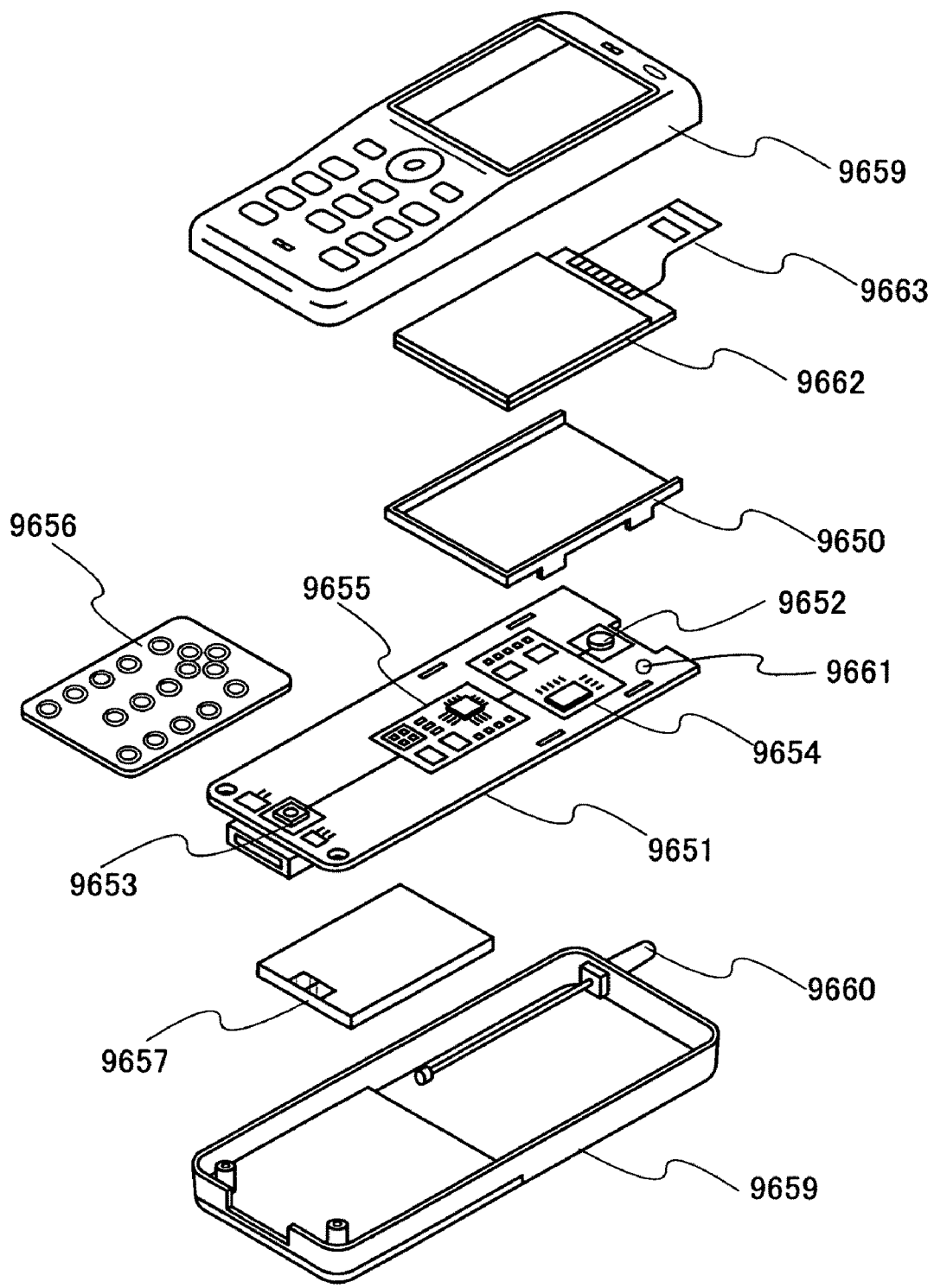
FIG. 29 illustrates an electronic device of the present invention.

The mobile phone shown in FIG. 29 has various functions such as a function of displaying a variety of information (e.g., a still image, a moving image, and a text image); a function of displaying a calendar, a date, time, or the like on a display portion; a function of operating or editing the information displayed on the display portion; a function of controlling processing by a variety of software (programs); a wireless communication function; a function of communicating with another mobile phone, a fixed phone, or an audio communication device by using the wireless communication function; a function of connecting with a variety of computer networks by using the wireless communication function; a function of transmitting or receiving a variety of data by using the wireless communication function; a function of operating a vibrator in accordance with incoming call, reception of data, or an alarm; and a function of generating a sound in accordance with incoming call, reception of data, or an alarm. Note that functions of the mobile phone shown in FIG. 29 are not limited to them, and the mobile phone can have various functions.

Figure 30A:
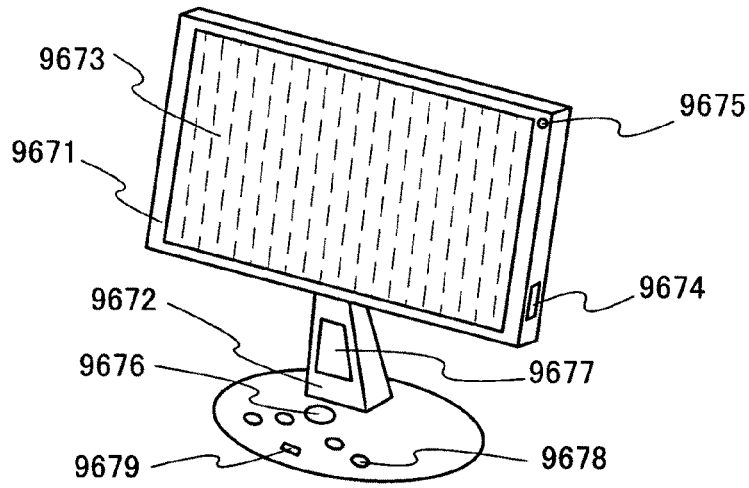
FIGS. 30A to 30C illustrate electronic devices of the present invention.

FIG. 30A shows a display, which includes a housing 9671, a support base 9672, a display portion 9673, a speaker 9677, an LED lamp 9679, input means (a connection terminal 9674, a sensor 9675 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), a microphone 9676, and an operation key 9678), and the like. The display shown in FIG. 30A has a function of displaying a variety of information (e.g., a still image, a moving image, and a text image) on the display portion. The display shown in FIG. 30A are not limited to these functions, and the display can have various functions.

Figure 30B:
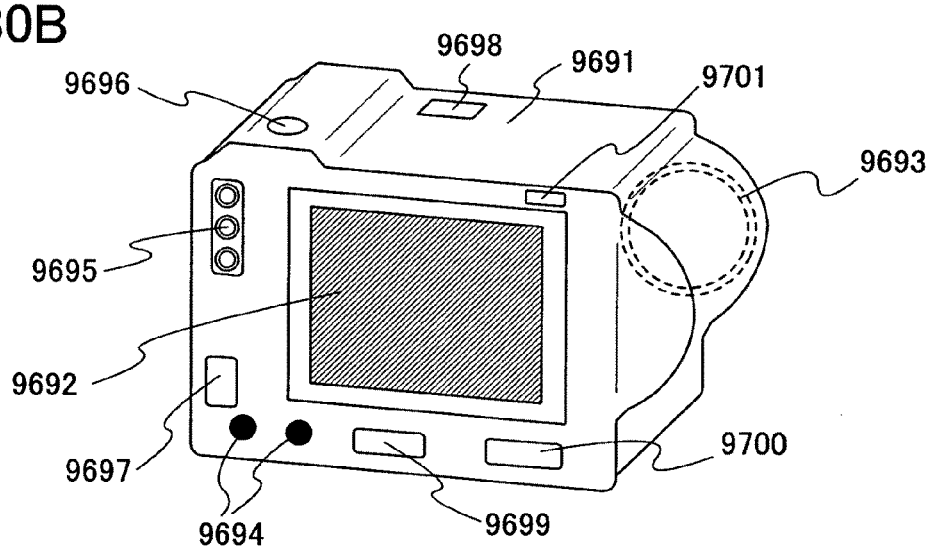

FIG. 30B shows a camera, which includes a main body 9691, a display portion 9692, a shutter button 9696, a speaker 9700, an LED lamp 9701, input means (an image receiving portion 9693, operation keys 9694, an external connection port 9695, a connection terminal 9697, a sensor 9698 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9699), and the like. The camera shown in FIG. 30B has a function of photographing a still image and a moving image; a function of automatically correcting the photographed image (the still image or the moving image); a function of storing the photographed image in a recording medium (provided outside or incorporated in the camera); and a function of displaying the photographed image on the display portion. Note that the functions of the camera shown in FIG. 30B are not limited to these functions, and the camera can have various functions.

Figure 30C:
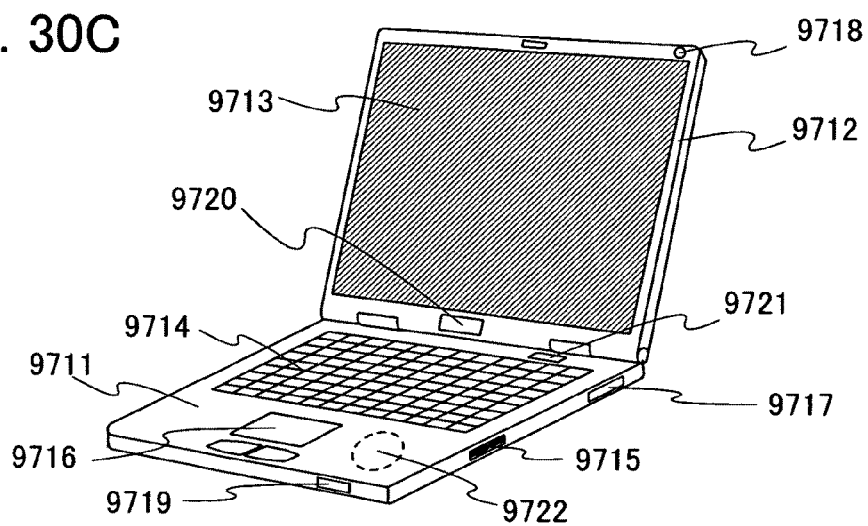

FIG. 30C illustrates a computer, which includes a main body 9711, a housing 9712, a display portion 9713, a speaker 9720, an LED lamp 9721, a reader/writer 9722, input means (a keyboard 9714, an external connection port 9715, a pointing device 9716, a connection terminal 9717, a sensor 9718 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9719), and the like. The computer shown in FIG. 30C has a function of displaying a variety of information (e.g., a still image, a moving image, and a text image) on the display portion; a function of controlling processing by a variety of software (programs); a communication function such as wireless communication or wire communication; a function of connecting to various computer networks by using the communication function; and a function of transmitting or receiving a variety of data by using the communication function. Note that the functions of the computer shown in FIG. 30C are not limited to these functions, and the computer can have various functions.

Figure 37A:
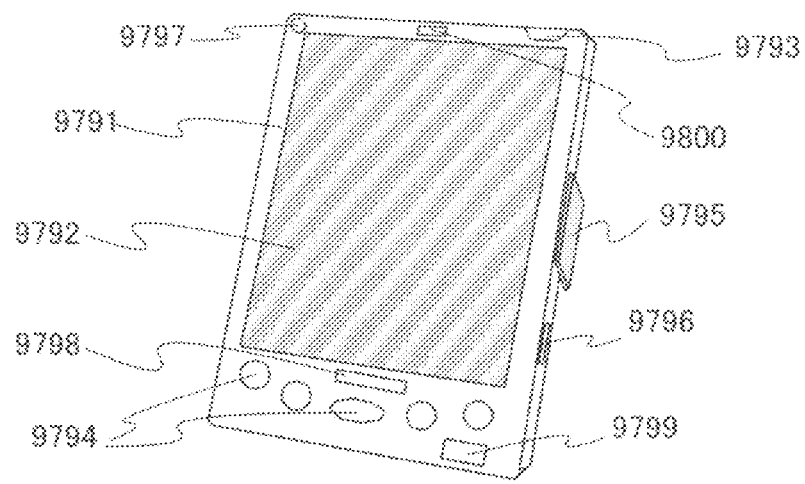
FIGS. 37A to 37C illustrate electronic devices of the present invention.

FIG. 37A illustrates a mobile computer, which includes a main body 9791, a display portion 9792, a switch 9793, a speaker 9799, an LED lamp 9800, input means (operation keys 9794, an infrared port 9795, a connection terminal 9796, a sensor 9797 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9798), and the like. The mobile computer shown in FIG. 37A has a function of displaying a variety of information (e.g., a still image, a moving image, and a text image) on the display portion; a touch panel function on the display portion; a function of displaying a calendar, a date, time, and the like on the display portion; a function of controlling processing by a variety of software (programs); a wireless communication function; a function of connecting to various computer networks by using the wireless communication function; and a function of transmitting or receiving a variety of data by using the wireless communication function. Note that the functions of the mobile computer shown in FIG. 37A are not limited to these functions, and the mobile computer can have various functions.

Figure 37B:
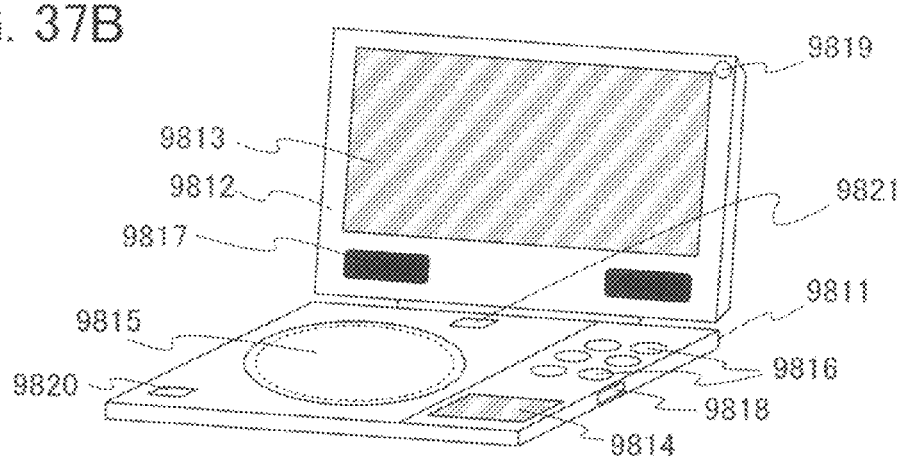

FIG. 37B illustrates a portable image reproducing device having a recording medium (e.g., a DVD player), which includes a main body 9811, a housing 9812, a display portion A 9813, a display portion B 9814, a speaker portion 9817, an LED lamp 9821, input means (a recording medium (e.g., DVD) reading portion 9815, operation keys 9816, a connection terminal 9818, a sensor 9819 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9820), and the like. The display portion A 9813 mainly displays image information and the display portion B 9814 mainly displays text information.

Figure 37C:
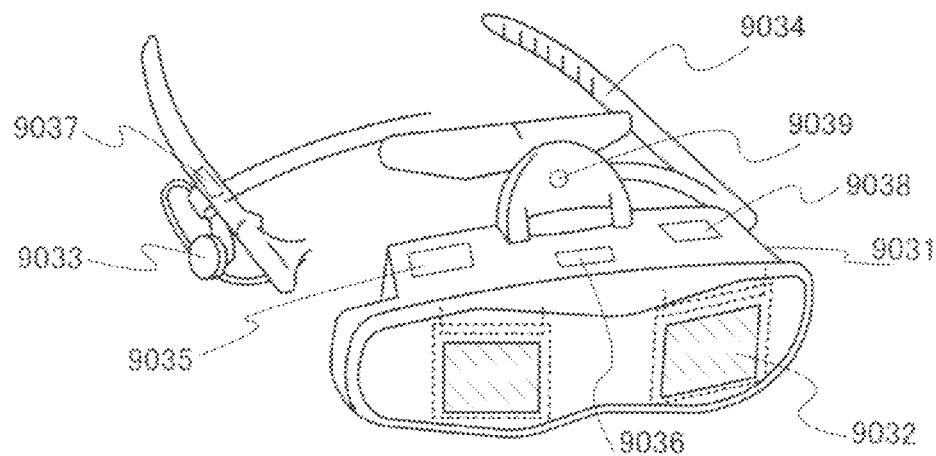

FIG. 37C illustrates a goggle-type display, which includes a main body 9031, a display portion 9032, an earphone 9033, a support portion 9034, an LED lamp 9039, a speaker 9038, input means (a connection terminal 9035, a sensor 9036 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9037), and the like. The goggle-type display shown in FIG. 37C has a function of displaying an image (e.g., a still image, a moving image, or a text image) which is externally obtained on the display portion. Note that the functions of the goggle-type display shown in FIG. 37C are not limited to these functions, and the goggle-type display can have various functions.

Figure 38A:
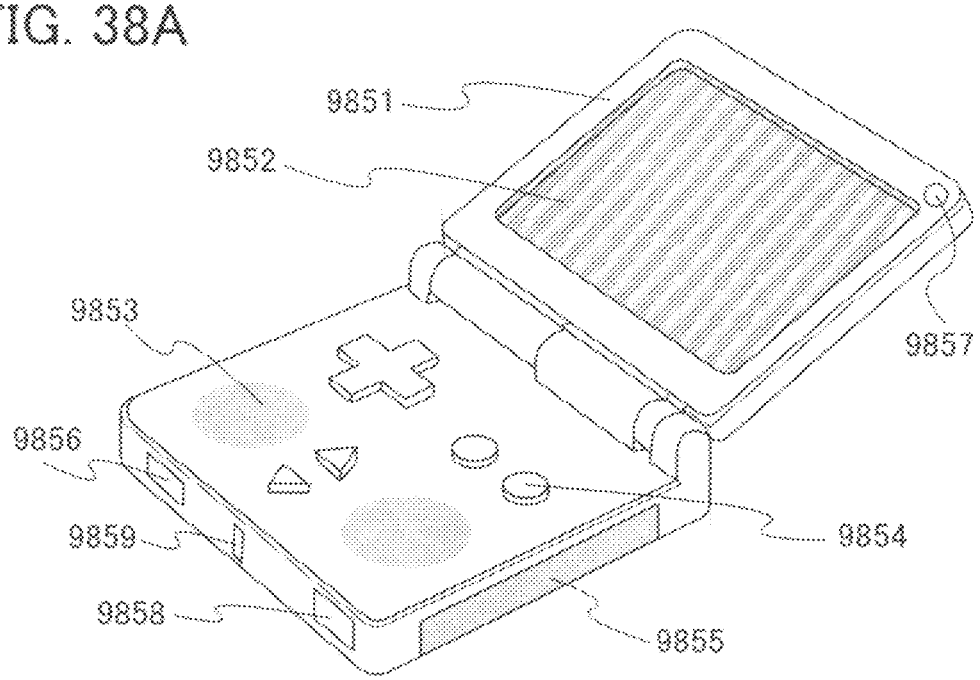
FIGS. 38A and 38B illustrate electronic devices of the present invention.

FIG. 38A illustrates a portable game machine, which includes a housing 9851, a display portion 9852, a speaker portion 9853, a recording medium insert portion 9855, an LED lamp 9859, input means (an operation key 9854, a connection terminal 9856, a sensor 9857 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9858), and the like. The portable game machine shown in FIG. 38A has functions for reading out programs and data stored in storage media and displaying the information on a display. The portable game machine shown in FIG. 38A has a function of sharing information with another portable game machine by wireless communication. Note that the functions of the portable game machine shown in FIG. 38A are not limited to these functions, and the portable game machine can have various functions.

Figure 38B:
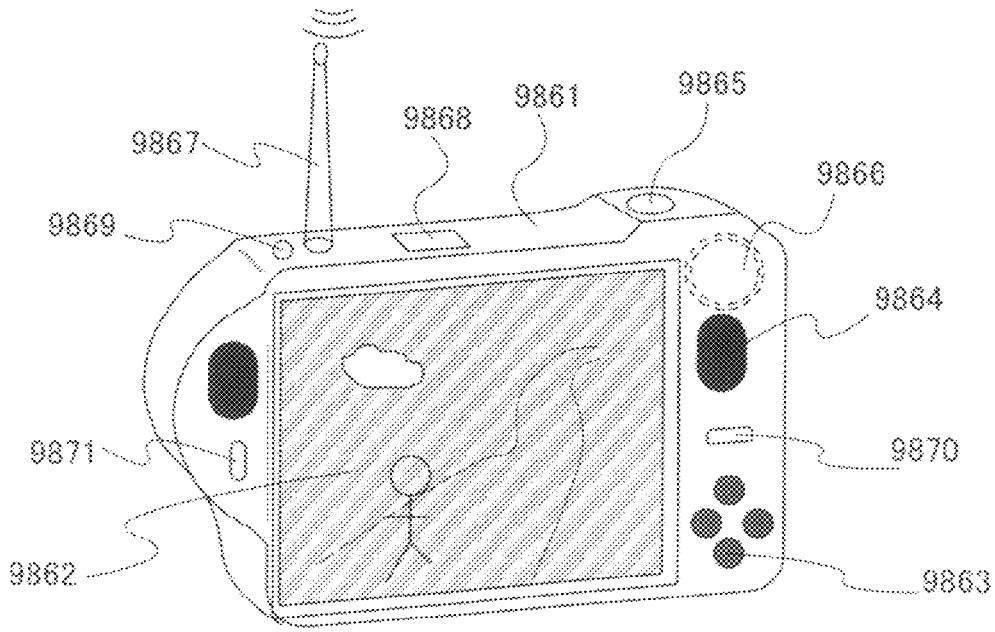

FIG. 38A shows a digital camera having a television reception function, which includes a housing 9861, a display portion 9862, a speaker 9864, a shutter button 9865, an LED lamp 9871, input means (an operation key 9863, an image receiving portion 9866, an antenna 9867, a connection terminal 9868, a sensor 9869 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9870), and the like. The digital camera having the television reception function, which is shown in FIG. 38B, has a function of photographing a still image and a moving image; a function of automatically correcting the photographed image; a function of obtaining a variety of information from the antenna; a function of storing the photographed image or the information obtained from the antenna; and a function of displaying the photographed image or the information obtained from the antenna on the display portion. Note that the functions of the digital camera having the television reception function, which is shown in FIG. 38B, are not limited to these functions, and the digital camera having the television reception function can have various functions.

Figure 39:
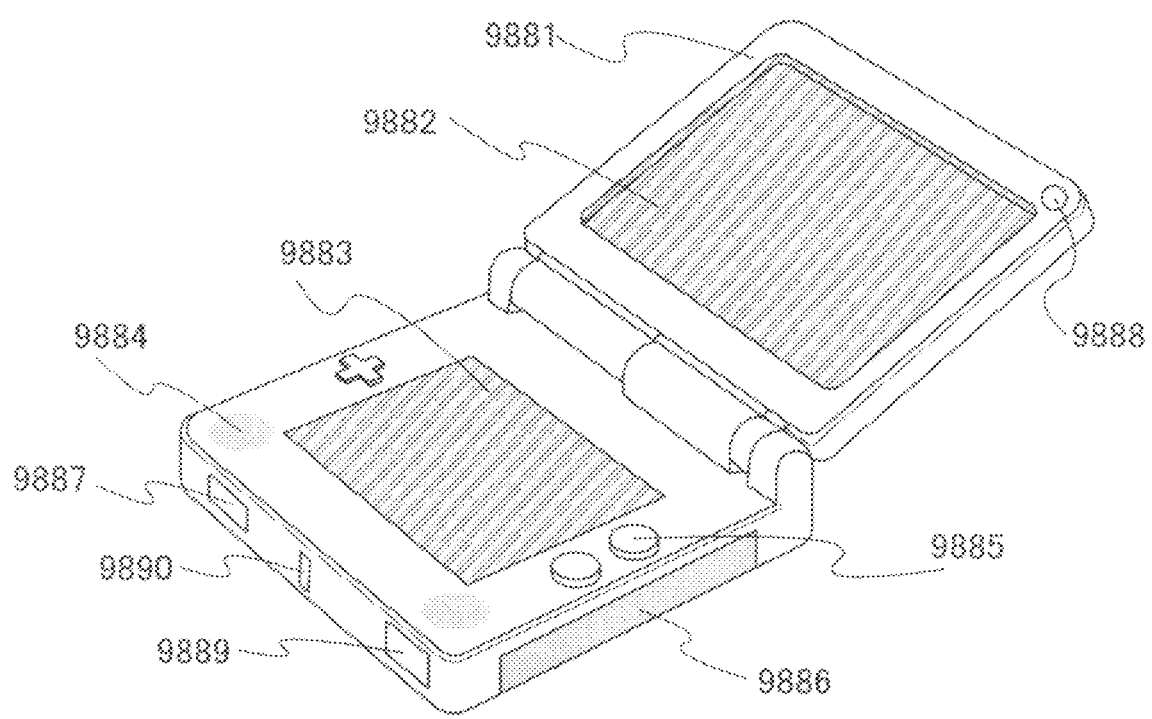
FIG. 39 illustrates an electronic device of the present invention.

FIG. 39 illustrates a portable game machine, which includes a housing 9881, a first display portion 9882, a second display portion 9883, a speaker portion 9884, a recording medium insert portion 9886, an LED lamp 9890, input means (an operation key 9885, a connection terminal 9887, a sensor 9888 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9889), and the like. The portable game machine shown in FIG. 39 has a function of reading a program or data stored in the recording medium to display it on the display portion, and a function of sharing information with another portable game machine by wireless communication. Note that the functions of the portable game machine shown in FIG. 39 are not limited to these functions, and the portable game machine can have various functions.

As shown in FIGS. 30A to 30C, 37A to 37C, 38A to 38C, and 39, the electronic device includes a display portion for displaying some kind of information. The electronic device is low power consumption, and can drive with a battery for a long time. Alternatively, a manufacturing method is simple, and manufacturing cost can be reduced.

Next, application examples of a semiconductor device are described.

Figure 31:
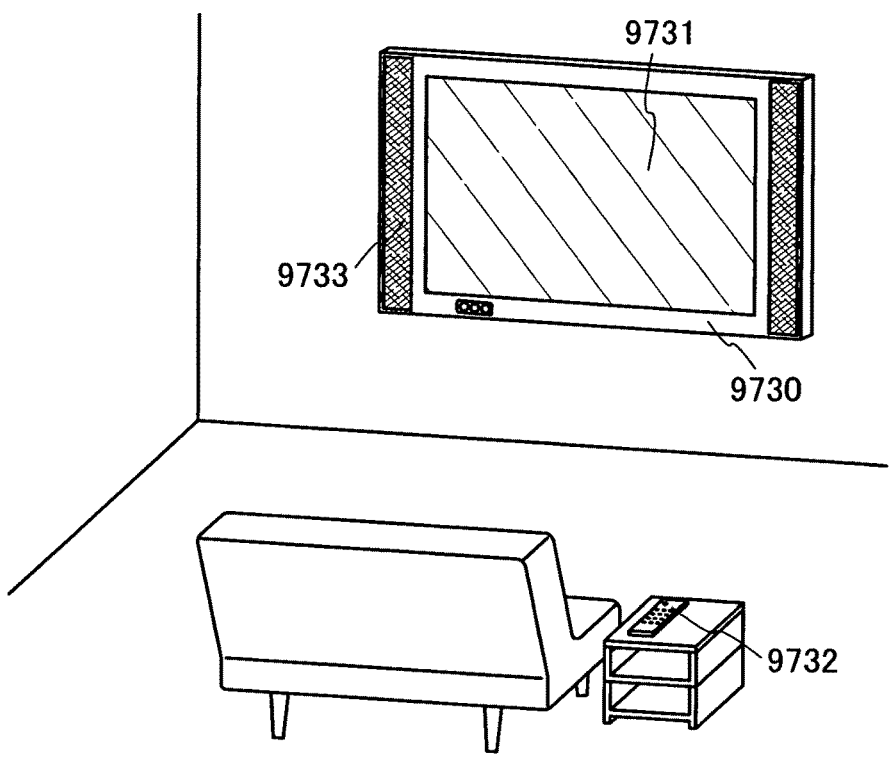
FIG. 31 illustrates an electronic device of the present invention.

FIG. 31 shows an example in which the semiconductor device is incorporated in a structure. FIG. 31 shows a housing 9730, a display panel 9731, a remote controller 9732 which is an operation portion, a speaker portion 9733, and the like. The semiconductor device is incorporated in the structure as a wall-hanging type, so that the semiconductor device can be provided without requiring a wide space.

Figure 32:
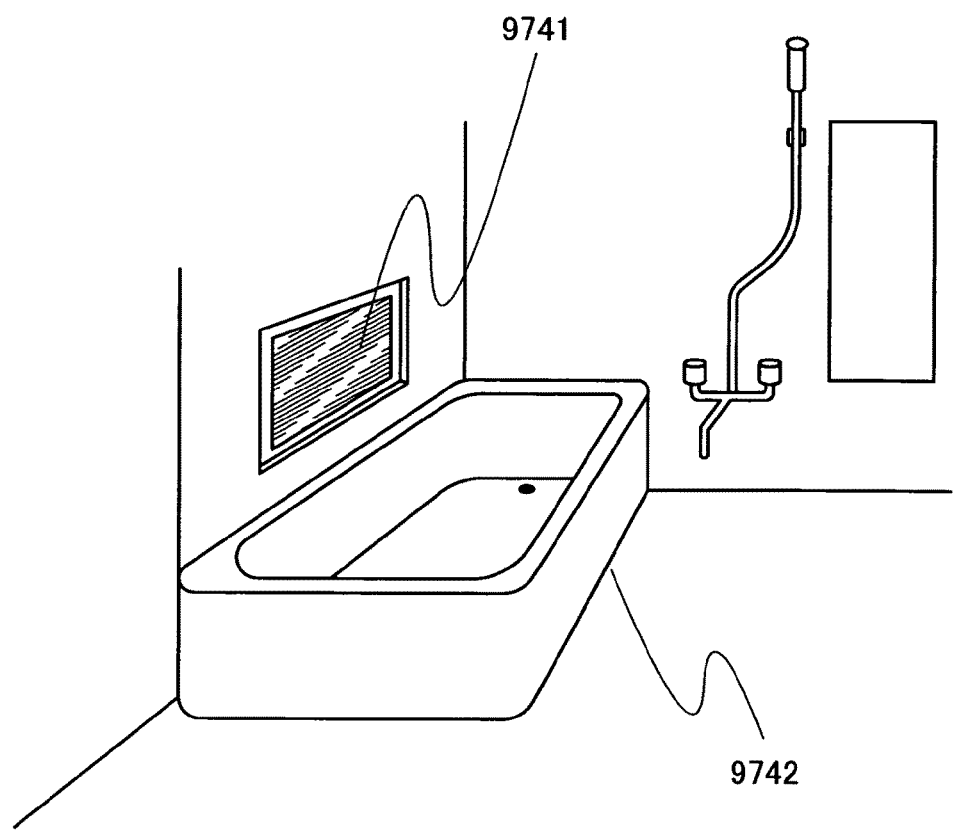
FIG. 32 illustrates an electronic device of the present invention.

FIG. 32 shows another example in which the semiconductor device is incorporated in a structure. A display panel 9741 is incorporated in a prefabricated bath unit 9742, so that a bather can view the display panel 9741. The display panel 9741 has a function of displaying information by an operation of the bather. The display panel 9741 can be utilized for advertisement or an amusement means.

Note that the semiconductor device can be provided in various places as well as on a sidewall of the prefabricated bath unit 9742 shown in FIG. 32. For example, the semiconductor device may be incorporated in part of a mirror or the bathtub itself. At this time, the shape of the display panel 9741 may be a shape in accordance with the mirror or the bathtub.

Figure 33:
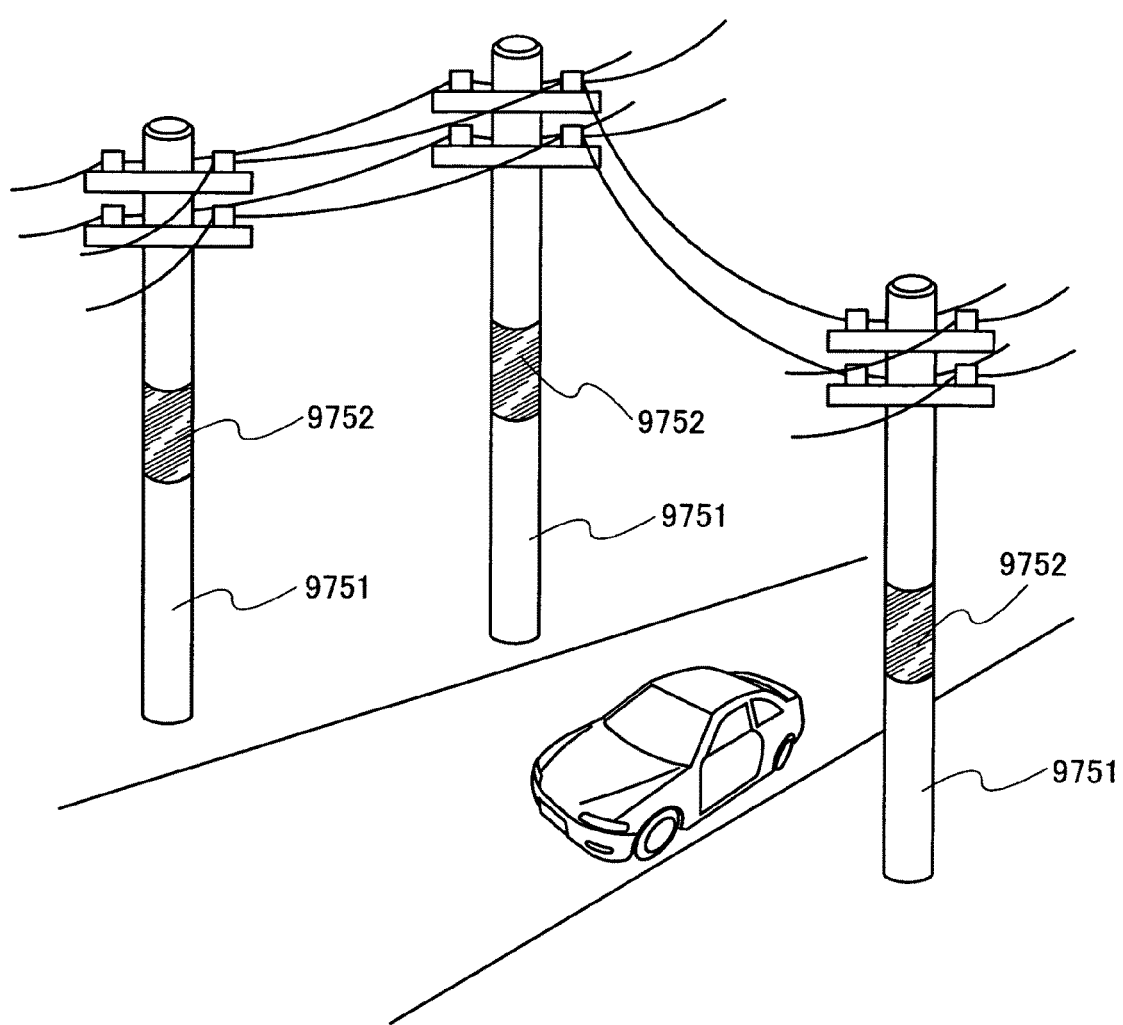
FIG. 33 illustrates an electronic device of the present invention.

FIG. 33 shows another example in which the semiconductor device is incorporated in a structure. Display panels 9752 are curved in accordance with curved surfaces of columnar objects 9751. Note that here, the columnar objects 9751 are described as telephone poles.

The display panels 9752 shown in FIG. 33 are provided in positions higher than a human eye level. When the display panels 9752 are provided for structures standing outside to each other in large numbers, such as telephone poles, advertising can be performed to an unspecified number of viewers. Here, since the display panels 9752 can easily display the same images by control from outside and can easily switch images instantly, extremely effective information display and advertising effects can be expected. When self-luminous display elements are provided in the display panels 9752, the display panels 9752 are effectively used as highly visible display media even at night. When the display panels 9752 are provided for the telephone poles, power supply means of the display panels 9752 can be easily secured. In an emergency such as a disaster, the display panels 9752 can be means for quickly transmitting precise information to victims.

Note that as each of the display panels 9752, a display panel in which a display element is driven by providing a switching element such as an organic transistor over a film-like substrate so that an image is displayed can be used.

Note that although this embodiment describes the wall, the prefabricated bath unit, and the columnar object as examples of the structure, this embodiment mode is not limited to this, and the semiconductor device can be provided for various structures.

Next, an example is described in which the semiconductor device is incorporated in a moving object.

Figure 34:
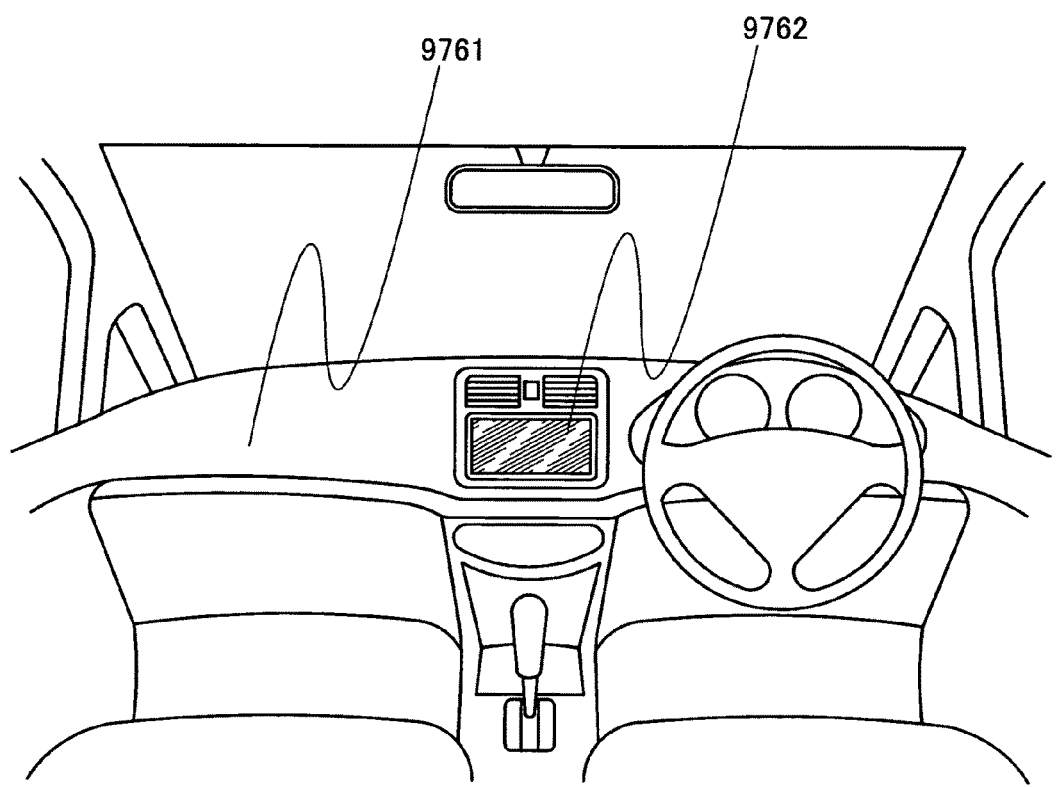
FIG. 34 illustrates an electronic device of the present invention.

FIG. 34 shows an example in which the semiconductor device is incorporated in a car. A display panel 9762 is incorporated in a car body 9761 of the car and can display information on an operation of the car or information input from inside or outside of the car on an on-demand basis. Note that the display panel 9762 may have a navigation function.

Note that the semiconductor device can be provided in various positions as well as the car body 9761 shown in FIG. 34. For example, the semiconductor device may be incorporated in a glass window, a door, a shift lever, a seat, a room mirror, or the like. At this time, the shape of the display panel 9762 may be a shape in accordance with a shape of an object in which the display panel 9762 is provided.

Figure 35A:
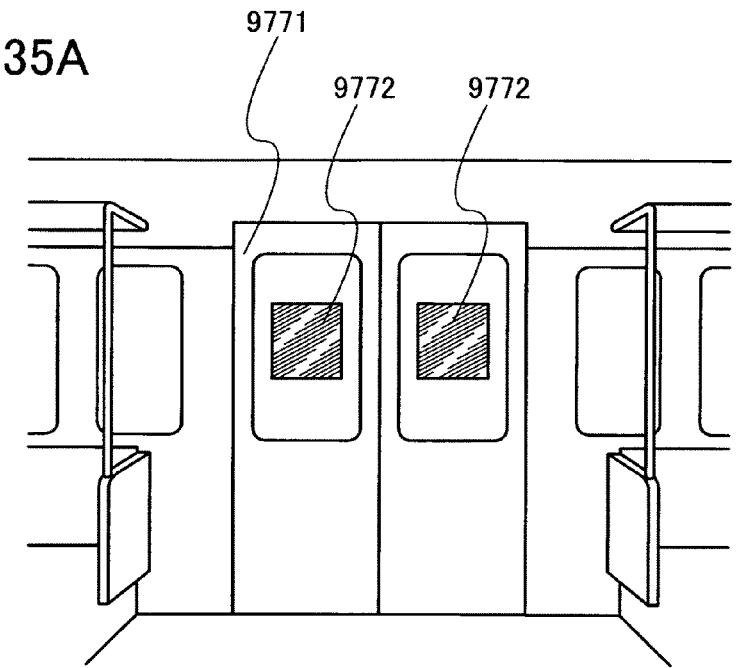
FIGS. 35A and 35B illustrate electronic devices of the present invention.
Figure 35B:
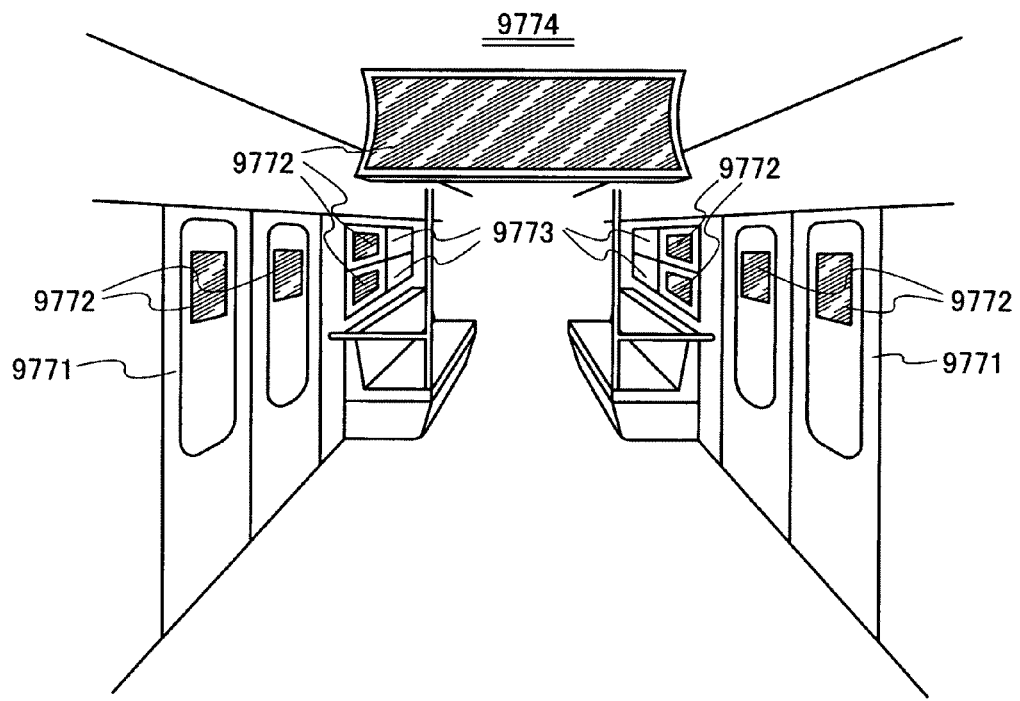

FIGS. 35A and 35B each show an example in which the semiconductor device is incorporated in a train car.

FIG. 35A shows an example in which display panels 9772 are provided for glasses of a door 9771 of the train car. The display panels 9772 have an advantage over conventional paper-based advertisement that labor cost which is necessary for switching advertisement is not needed. Since the display panels 9772 can instantly switch images displayed on display portions by external signals, images on the display panels can be switched as the type of train passenger changes in accordance with different time periods, for example, so that a more effective advertising effect can be expected.

FIG. 35B shows an example in which display panels 9772 are provided for glass windows 9773 and a ceiling 9774 as well as the glasses of the doors 9771 of the train car. Since the semiconductor device can be easily provided in a position in which the semiconductor device is conventionally difficult to be provided in this manner, an effective advertisement effect can be obtained. Since the semiconductor device can instantly switch images displayed on the display portion by external signals, cost and time generated in advertisement switching can be reduced, so that more flexible advertisement operation and information transmission can be performed.

Note that the semiconductor device can be provided in various positions as well as the doors 9771, the glass windows 9773, and the ceiling 9774 which are shown in FIGS. 35A and 35B. For example, the semiconductor device may be incorporated in a hand strap, a seat, a handrail, a floor, or the like. At this time, the shape of the display panel 9772 may be a shape in accordance with a shape of an object in which the display panel 9772 is provided.

Figure 36A:
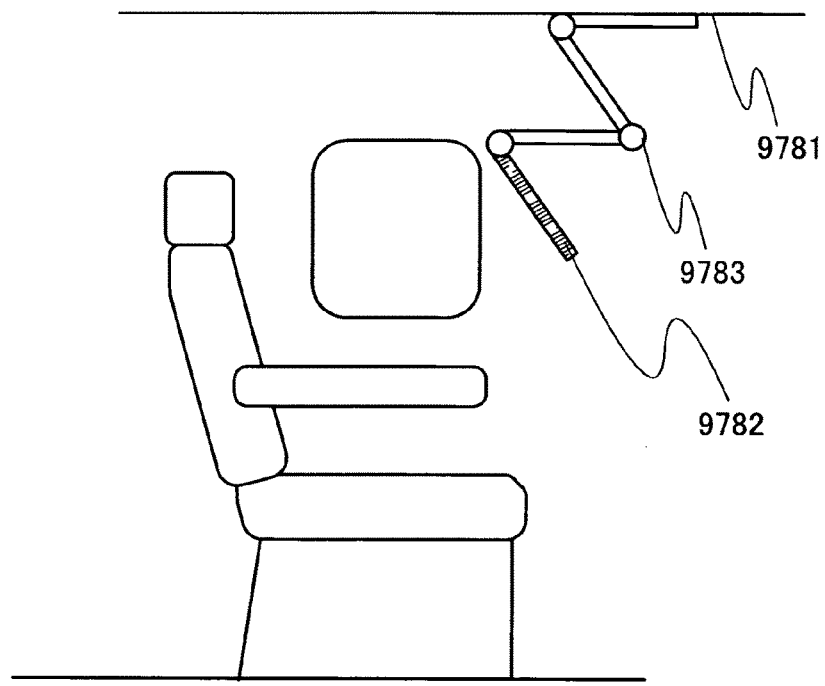
FIGS. 36A and 36B illustrate an electronic device of the present invention.
Figure 36B:
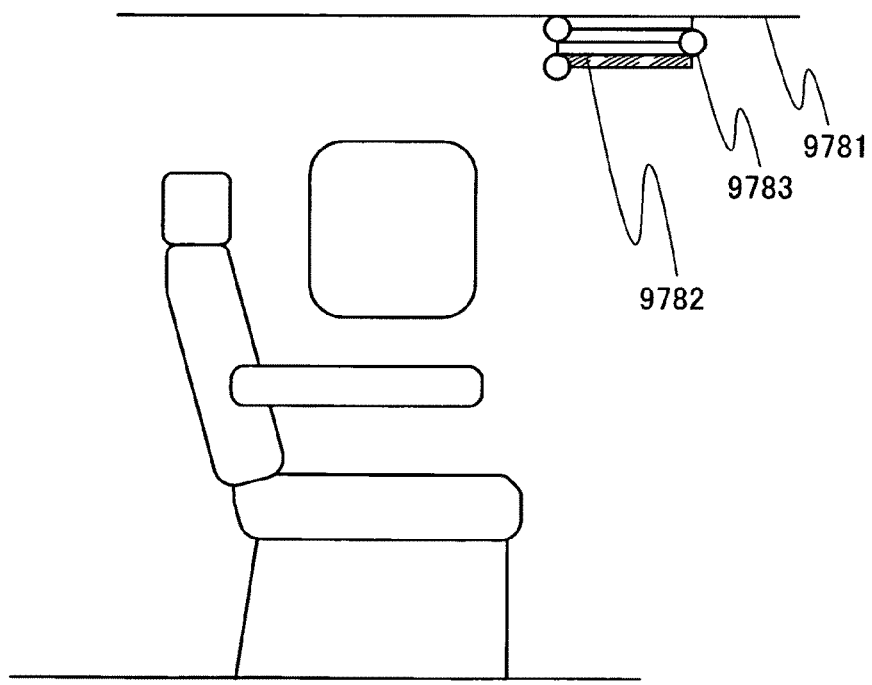

FIGS. 36A and 36B each show an example in which the semiconductor device is incorporated in a passenger airplane.

FIG. 36A shows a shape in use when a display panel 9782 is provided for a ceiling 9781 above a seat of the passenger airplane. The display panel 9782 is incorporated in the ceiling 9781 through a hinge portion 9783, and a passenger can view the display panel 9782 by a telescopic motion of the hinge portion 9783. The display panel 9782 has a function of displaying information by an operation of the passenger. The display panel 9782 can be utilized for advertisement or an amusement means. When the display panel 9782 is stored on the ceiling 9781 by folding the hinge portion 9783 as shown in FIG. 36B, safety during takeoff and landing can be secured. Note that the display panel 9782 can also be utilized as a medium and a guide light by lighting display elements of the display panel 9782 in an emergency.

Note that the semiconductor device can be incorporated in various positions as well as the ceiling 9781 shown in FIGS. 36A and 36B. For example, the semiconductor device may be incorporated in a seat, a table, an armrest, a window, or the like. A large display panel which can be viewed simultaneously by a plurality of persons may be provided on a wall of an airframe. At this time, the shape of the display panel 9782 may be a shape in accordance with a shape of an object in which the display panel 9782 is provided.

Note that although this embodiment mode describes the train car body, the car body, and the airplane body as examples of moving objects, the present invention is not limited to them, and the semiconductor device can be provided in various objects such as a motorbike, a four-wheeled vehicle (including a car, a bus, and the like), a train (including a monorail, a railroad, and the like), and a vessel. Since display on display panels in a moving object can be switched instantly by external signals, the semiconductor device can be used for an advertisement display board for an unspecified number of customers, an information display board in an emergency, or the like by providing the semiconductor device in the moving object.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

This application is based on Japanese Patent Application serial No. 2007-173311 filed with Japan Patent Office on Jun. 29, 2007, the entire contents of which are hereby incorporated by reference.

What is claimed is:

1. A semiconductor device comprising:
a first semiconductor layer over a substrate;
a first insulating layer over the first semiconductor layer;
a first conductive layer and a second conductive layer over the first insulating layer;
a second insulating layer over the first conductive layer and the second conductive layer;
a second semiconductor layer over the second insulating layer; and
a third conductive layer over the second semiconductor layer,
wherein the first semiconductor layer comprises a single-crystal silicon,
wherein the first conductive layer is overlapped with the first semiconductor layer, and the second conductive layer is overlapped with the second semiconductor layer;
wherein the first semiconductor layer serves as an active layer of a first transistor;
wherein the second semiconductor layer serves as an active layer of a second transistor;
wherein a property of the first semiconductor layer is different from a property of the second semiconductor layer, and
wherein the second semiconductor layer comprises a non-single-crystal semiconductor having crystallinity.

2. The semiconductor device according to claim 1, wherein the first insulating layer serves as a gate insulating layer of the first transistor, and
wherein the first conductive layer serves as a gate electrode of the first transistor.

3. The semiconductor device according to claim 1, wherein the second insulating layer serves as a gate insulating layer of the second transistor, and
wherein the second conductive layer serves as a gate electrode of the second transistor.

4. The semiconductor device according to claim 1, wherein the third conductive layer is electrically connected to the second semiconductor layer.

5. The semiconductor device according to claim 1, wherein the second semiconductor layer includes a microcrystalline semiconductor.

6. A display device, comprising the semiconductor device according to claim 1 and a display element.

7. A liquid crystal display device comprising the semiconductor device according to claim 1 and a display element.

8. An electronic device, comprising the display device according to claim 6 and an operation switch.

9. An electronic device, comprising the liquid crystal display device according to claim 7 and an operation switch.

10. A semiconductor device comprising:
a first semiconductor layer over an insulating substrate;
a first insulating layer over the first semiconductor layer;
a first conductive layer and a second conductive layer over the first insulating layer;
a second insulating layer over the first conductive layer and the second conductive layer;
a second semiconductor layer over the second insulating layer; and
a third conductive layer over the second semiconductor layer,
wherein the first semiconductor layer comprises a single-crystal silicon,
wherein the first conductive layer is overlapped with the first semiconductor layer, and the second conductive layer is overlapped with the second semiconductor layer;
wherein the first semiconductor layer serves as an active layer of a first transistor;
wherein the second semiconductor layer serves as an active layer of a second transistor;
wherein a property of the first semiconductor layer is different from a property of the second semiconductor layer and
wherein the second semiconductor layer comprises a non-single-crystal semiconductor having crystallinity.

11. The semiconductor device according to claim 10, wherein the first insulating layer serves as a gate insulating layer of the first transistor, and
wherein the first conductive layer serves as a gate electrode of the first transistor.

12. The semiconductor device according to claim 10, wherein the second insulating layer serves as a gate insulating layer of the second transistor, and
wherein the second conductive layer serves as a gate electrode of the second transistor.

13. The semiconductor device according to claim 10, wherein the third conductive layer is electrically connected to the second semiconductor layer.

14. The semiconductor device according to claim 10, wherein the second semiconductor layer includes a microcrystalline semiconductor.

15. A display device, comprising the semiconductor device according to claim 10 and a display element.

16. A liquid crystal display device comprising the semiconductor device according to claim 10 and a display element.

17. An electronic device, comprising the display device according to claim 15 and an operation switch.

18. An electronic device, comprising the liquid crystal display device according to claim 16 and an operation switch.

19. A semiconductor device comprising:
a first semiconductor layer over an insulating substrate, the first semiconductor layer having crystallinity;
a first insulating layer over the first semiconductor layer;
a first conductive layer and a second conductive layer over the first insulating layer;
a second insulating layer over the first conductive layer and the second conductive layer;
a second semiconductor layer over the second insulating layer;
a third conductive layer over the second semiconductor layer;
a fourth conductive layer over the second insulating layer;
a third insulating layer over the third conductive layer and the fourth conductive layer; and
a fifth conductive layer over the third insulating layer,
wherein the first semiconductor layer comprises a single-crystal silicon,
wherein the first conductive layer is overlapped with the first semiconductor layer, and the second conductive layer is overlapped with the second semiconductor layer;
wherein the first semiconductor layer serves as an active layer of a first transistor;
wherein the second semiconductor layer serves as an active layer of a second transistor;
wherein a property of the first semiconductor layer is different from a property of the second semiconductor layer and
wherein the second semiconductor layer comprises a non-single-crystal semiconductor having crystallinity.

20. The semiconductor device according to claim 19, wherein the first insulating layer serves as a gate insulating layer of the first transistor, and wherein the first conductive layer serves as a gate electrode of the first transistor.

21. The semiconductor device according to claim 19, wherein the second insulating layer serves as a gate insulating layer of the second transistor, and wherein the second conductive layer serves as a gate electrode of the second transistor.

22. The semiconductor device according to claim 19, wherein the fifth conductive layer is electrically connected to the fourth conductive layer through a contact hole provided in the third insulating layer.

23. The semiconductor device according to claim 19, wherein the fifth conductive layer is electrically connected to the first semiconductor layer through a contact hole provided in the first insulating layer, the second insulating layer and the third insulating layer.

24. The semiconductor device according to claim 19, wherein the third conductive layer is electrically connected to the second semiconductor layer.

25. The semiconductor device according to claim 19, wherein the second semiconductor layer includes a microcrystalline semiconductor.

26. A display device, comprising the semiconductor device according to claim 19 and a display element.

27. A liquid crystal display device comprising the semiconductor device according to claim 19 and a display element.

28. An electronic device, comprising the display device according to claim 26 and an operation switch.

29. An electronic device, comprising the liquid crystal display device according to claim 27 and an operation switch.

* * * * *